US012622117B2

(12) United States Patent
Akimoto

(10) Patent No.: US 12,622,117 B2
(45) Date of Patent: May 5, 2026

(54) IMAGE DISPLAY DEVICE MANUFACTURING METHOD AND IMAGE DISPLAY DEVICE

(71) Applicant: NICHIA CORPORATION, Anan (JP)

(72) Inventor: Hajime Akimoto, Anan (JP)

(73) Assignee: NICHIA CORPORATION, Anan (JP)

(*) Notice: Subject to any disclaimer, the term of this patent is extended or adjusted under 35 U.S.C. 154(b) by 575 days.

(21) Appl. No.: 18/173,937

(22) Filed: Feb. 24, 2023

(65) Prior Publication Data

US 2023/0207768 A1 Jun. 29, 2023

Related U.S. Application Data

(63) Continuation of application No. PCT/JP2021/032527, filed on Sep. 3, 2021.

(30) Foreign Application Priority Data

Sep. 17, 2020 (JP) ................................ 2020-156716

(51) Int. Cl.
*H10H 20/857* (2025.01)
*H01L 25/075* (2006.01)
(Continued)

(52) U.S. Cl.
CPC ....... *H10H 20/857* (2025.01); *H01L 25/0753* (2013.01); *H10H 20/0137* (2025.01); (Continued)

(58) Field of Classification Search
CPC ......... H10H 20/01335; H10H 20/0137; H10H 20/018; H10H 20/032; H10H 20/0361; (Continued)

(56) References Cited

U.S. PATENT DOCUMENTS

2014/0291666 A1 10/2014 Tsang
2016/0240561 A1 8/2016 Saito et al.
(Continued)

FOREIGN PATENT DOCUMENTS

CN 110459557 A 11/2019
CN 111223885 A 6/2020
(Continued)

OTHER PUBLICATIONS

International Search Report with English Translation and Written Opinion issued in the corresponding International Patent Application No. PCT/JP2021/032527, dated Nov. 9, 2021.

*Primary Examiner* — Scott B Geyer
(74) *Attorney, Agent, or Firm* — Foley & Lardner LLP

(57) ABSTRACT

An image display device manufacturing method according to an embodiment includes preparing a semiconductor layer, joining the semiconductor layer to a first substrate with a first metal layer interposed therebetween, bonding the semiconductor layer to a light-transmitting substrate, removing the first substrate, etching the semiconductor layer to form a light-emitting element including a light-emitting surface and an upper surface, etching the first metal layer to form a light-blocking electrode covering the upper surface, forming a first insulating film covering the light-emitting element and the light-blocking electrode, forming a circuit element on the first insulating film, forming a second insulating film covering the first insulating film and the circuit element, forming a first via passing through the first insulating film and the second insulating film, and forming a first wiring layer on the second insulating film.

12 Claims, 36 Drawing Sheets

(51) Int. Cl.

| | |
|---|---|
| ***H10H 20/01*** | (2025.01) |
| ***H10H 20/825*** | (2025.01) |
| ***H10H 20/831*** | (2025.01) |
| ***H10H 20/851*** | (2025.01) |

(52) U.S. Cl.
CPC ...... *H10H 20/825* (2025.01); *H10H 20/8312* (2025.01); *H10H 20/851* (2025.01); *H10H 20/032* (2025.01); *H10H 20/0361* (2025.01); *H10H 20/0364* (2025.01)

(58) Field of Classification Search
CPC .. H10H 20/0364; H10H 20/819; H10H 20/82; H10H 20/825; H10H 20/8312; H10H 20/832; H10H 20/835; H10H 20/017; H10H 20/0362; H10H 20/852–854; H10H 20/857; H01L 25/0753; H01L 25/075; H01L 25/167; H01L 25/50
See application file for complete search history.

(56) References Cited

U.S. PATENT DOCUMENTS

| | | | | |
|---|---|---|---|---|
| 2016/0284941 | A1* | 9/2016 | Seo | H10H 20/835 |
| 2017/0294424 | A1 | 10/2017 | Jeong | |
| 2017/0358624 | A1* | 12/2017 | Takeya | H10H 20/833 |
| 2018/0294311 | A1 | 10/2018 | Hsiang et al. | |
| 2018/0351035 | A1 | 12/2018 | Chung et al. | |
| 2019/0019922 | A1* | 1/2019 | Hwang | H10H 20/857 |
| 2019/0067538 | A1* | 2/2019 | Lee | H10H 20/83 |
| 2019/0140016 | A1 | 5/2019 | Hwang et al. | |
| 2019/0165035 | A1 | 5/2019 | Fu | |
| 2019/0355766 | A1 | 11/2019 | Zhang et al. | |
| 2020/0066687 | A1* | 2/2020 | Kim | H10K 59/8792 |
| 2020/0119085 | A1 | 4/2020 | Chen | |
| 2020/0168663 | A1 | 5/2020 | Choi et al. | |
| 2020/0203570 | A1* | 6/2020 | Chen | H10H 20/835 |
| 2020/0235161 | A1* | 7/2020 | Kwak | H10H 20/852 |
| 2020/0303471 | A1 | 9/2020 | Akimoto | |
| 2021/0217805 | A1 | 7/2021 | Kusunoki et al. | |
| 2022/0059518 | A1 | 2/2022 | Akimoto | |
| 2022/0069187 | A1 | 3/2022 | Akimoto | |
| 2022/0069188 | A1 | 3/2022 | Akimoto | |

FOREIGN PATENT DOCUMENTS

| | | | |
|---|---|---|---|
| JP | 2002-141492 | A | 5/2002 |
| JP | 2009-295908 | A | 12/2009 |
| JP | 2012-043946 | A | 3/2012 |
| JP | 2014-078575 | A | 5/2014 |
| JP | 2016-154213 | A | 8/2016 |
| JP | 2018-205741 | A | 12/2018 |
| JP | 2020-507107 | A | 3/2020 |
| JP | 2020-086461 | A | 6/2020 |
| TW | 201429004 | A | 7/2014 |
| TW | 201438218 | A | 10/2014 |
| WO | WO-2019/049360 | A1 | 3/2019 |
| WO | WO-2019/220246 | A1 | 11/2019 |
| WO | WO-2020/196271 | A1 | 10/2020 |
| WO | WO-2020/226044 | A1 | 11/2020 |
| WO | WO-2020/230667 | A1 | 11/2020 |
| WO | WO-2020/230668 | A1 | 11/2020 |

* cited by examiner

IMAGE DISPLAY DEVICE MANUFACTURING METHOD AND IMAGE DISPLAY DEVICE

CROSS-REFERENCE TO RELATED APPLICATIONS

The present application is a bypass continuation of PCT Application No. PCT/JP2021/032527, filed Sep. 3, 2021, which claims priority to Japanese Application No. 2020-156716, filed Sep. 17, 2020. The contents of these applications are hereby incorporated by reference in their entireties.

BACKGROUND

The present disclosure relates to an image display device manufacturing method and an image display device.

Realization of a thin image display device having high brightness, a wide viewing angle, high contrast, and low power consumption has been desired. To accommodate such market demands, advancements have been made in the development of a display device that utilizes a self-light-emitting element.

The emergence of a display device that uses, as a self-light-emitting element, a micro light-emitting diode (LED), which is a fine light-emitting element, is expected. As a manufacturing method of a display device that uses a micro LED, a method of sequentially transferring individually formed micro LEDs to a drive circuit has been introduced. Nevertheless, as the number of micro LED elements increases as image quality advances, such as for full high definition, 4K, and 8K, in the individual formation and the sequential transfer of a large number of micro LEDs to a substrate on which a drive circuit and the like are formed, a significant amount of time is required for the transfer process. Furthermore, connection failure or the like between a micro LED and the drive circuit or the like may occur, resulting in a decrease in yield.

There is known a technique of growing a semiconductor layer including a light-emitting layer on a Si substrate, forming an electrode on the semiconductor layer, and then bonding the semiconductor layer to a circuit substrate on which a drive circuit is formed (refer to Patent Document 1: JP 2002-141492 A, for example).

SUMMARY

Certain embodiments of the present disclosure are directed to an image display device manufacturing method and an image display device that reduce a transfer process of a light-emitting element and improve yield.

An image display device manufacturing method according to an embodiment of the present disclosure includes preparing a semiconductor layer including a light-emitting layer, joining the semiconductor layer to a first substrate with a first metal layer interposed therebetween, bonding the semiconductor layer to a first surface of a light-transmitting substrate, removing the first substrate, etching the semiconductor layer to form, on the first surface, a light-emitting element including a light-emitting surface and an upper surface provided on a side opposite to the light-emitting surface, etching the first metal layer to form a light-blocking electrode covering the upper surface and electrically connected to the upper surface, forming a first insulating film covering the first surface, the light-emitting element, and the light-blocking electrode, forming a circuit element on the first insulating film, forming a second insulating film covering the first insulating film and the circuit element, forming a first via passing through the first insulating film and the second insulating film, and forming a first wiring layer on the second insulating film. The first via is provided between the first wiring layer and the light-blocking electrode, and allows electrical connection between the first wiring layer and the light-blocking electrode.

An image display device manufacturing method according to an embodiment of the present disclosure includes preparing a semiconductor layer including a light-emitting layer, bonding the semiconductor layer to a first surface of a light-transmitting substrate, removing the first substrate and subsequently forming a second metal layer on the semiconductor layer, etching the semiconductor layer to form, on the first surface, a light-emitting element including a light-emitting surface and an upper surface provided on a side opposite to the light-emitting surface, etching the second metal layer to form a light-blocking electrode covering the upper surface and electrically connected to the upper surface, forming a first insulating film covering the first surface, the light-emitting element, and the light-blocking electrode, forming a circuit element on the first insulating film, forming a second insulating film covering the circuit element and the first insulating film, forming a first via passing through the first insulating film and the second insulating film, and forming a first wiring layer on the second insulating film. The first via is provided between the first wiring layer and the light-blocking electrode, and allows electrical connection between the first wiring layer and the light-blocking electrode.

An image display device according to another embodiment of the present disclosure includes a light-transmitting member including a first surface, a light-emitting element, on the first surface, including a light-emitting surface and an upper surface on a side opposite to the light-emitting surface, a light-blocking electrode covering the upper surface and electrically connected to the upper surface, a first insulating film covering the first surface, the light-emitting element, and the light-blocking electrode, a circuit element provided on the first insulating film, a second insulating film covering the first insulating film and the circuit element, a first via passing through the first insulating film and the second insulating film, and a first wiring layer provided on the second insulating film. The first via is provided between the first wiring layer and the light-blocking electrode, and allows electrically connection between the first wiring layer and the light-blocking electrode.

An image display device according to another embodiment of the present disclosure includes a light-transmitting member including a first surface, a first semiconductor layer, on the first surface, including a light-emitting surface that can form a plurality of light-emitting regions, a plurality of light-emitting layers spaced apart on the first semiconductor layer, a plurality of second semiconductor layers respectively provided on the plurality of light-emitting layers and having a conductivity type different from a conductivity type of the first semiconductor layer, a plurality of light-blocking electrodes respectively provided on the plurality of second semiconductor layers and electrically connected to the plurality of second semiconductor layers, a first insulating film covering the first surface, the first semiconductor layer, the plurality of light-emitting layers, the plurality of second semiconductor layers, and the plurality of light-blocking electrodes, a plurality of transistors spaced apart from one another on the first insulating film, a second insulating film covering the first insulating film and the plurality of transistors, a plurality of first vias passing through the first insulating film and the second insulating film, and a first wiring layer provided on the second insulating film. The plurality of second semiconductor layers and the plurality of light-emitting layers are separated by the first insulating film. The plurality of first vias are respectively provided between the first wiring layer and the plurality of light-blocking electrodes, and allow electrical connection between the first wiring layer and the plurality of respective light-blocking electrodes.

An image display device according to another embodiment of the present disclosure includes a light-transmitting member including a first surface, a plurality of light-emitting elements, on the first surface, including a light-emitting surface and an upper surface on a side opposite to the light-emitting surface, a plurality of light-blocking electrodes covering the upper surface and electrically connected to the upper surface, a first insulating film covering the first surface, the plurality of light-emitting elements, and the plurality of light-blocking electrodes, a circuit element provided on the first insulating film, a second insulating film covering the first insulating film and the circuit element, a plurality of first vias passing through the first insulating film and the second insulating film, and a first wiring layer provided on the second insulating film. The plurality of first vias are provided between the first wiring layer and the plurality of light-blocking electrodes, and allow electrical connection between the first wiring layer and the plurality of respective light-blocking electrodes.

According to certain embodiments of the present disclosure, an image display device manufacturing method that reduces a transfer process of a light-emitting element and improves yield is realized.

According to other embodiments of the present disclosure, an image display device that reduces a transfer process of a light-emitting element and improves yield is realized.

DETAILED DESCRIPTION

Figure 1:
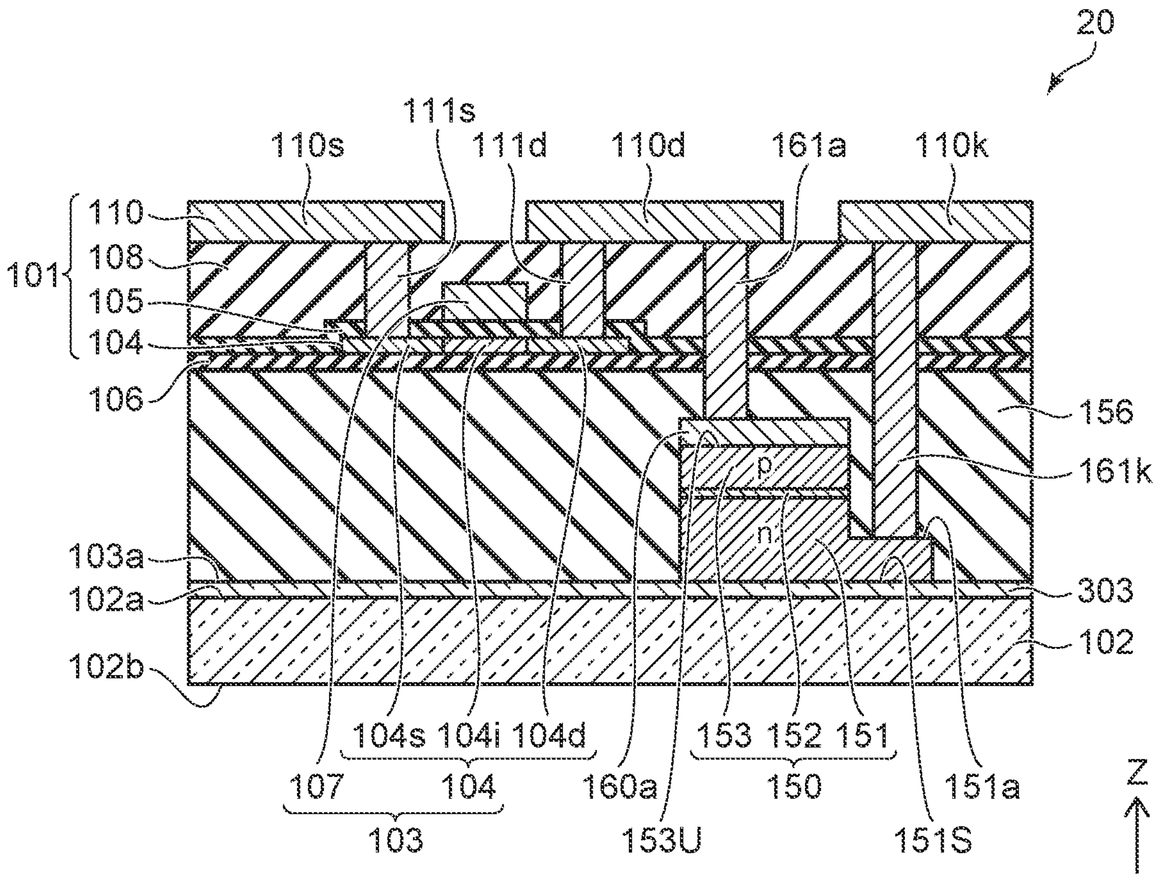
FIG. 1 is a schematic cross-sectional view exemplifying a portion of an image display device according to a first embodiment.

Embodiments of the present disclosure will be described below with reference to the drawings. Note that the drawings are schematic or conceptual, and the relationships between thicknesses and widths of portions, the proportions of sizes between portions, and the like are not necessarily the same as the actual values thereof. Further, the dimensions and the proportions may be illustrated differently between the drawings, even in a case in which the same portion is illustrated.

Note that, in the specification and the drawings, elements similar to those described in relation to a previous drawing are denoted using like reference characters, and a detailed description is omitted as appropriate.

First Embodiment

FIG. 1 is a schematic cross-sectional view exemplifying a portion of an image display device according to the present embodiment.

FIG. 1 schematically illustrates a configuration of a sub-pixel 20 of the image display device according to the present embodiment. Of the present embodiment and other embodiments described below, a second embodiment, a fifth embodiment, and a sixth embodiment illustrate examples of cases in which a color filter is not mounted. Thus, in a case in which these image display devices are monochrome or the like, for example, a sub-pixel is a single pixel. In the present specification, regardless of whether one pixel is formed by one sub-pixel or one pixel is formed by a plurality of sub-pixels, a light-emitting device including one light-emitting element is referred to as a sub-pixel.

Figure 9:
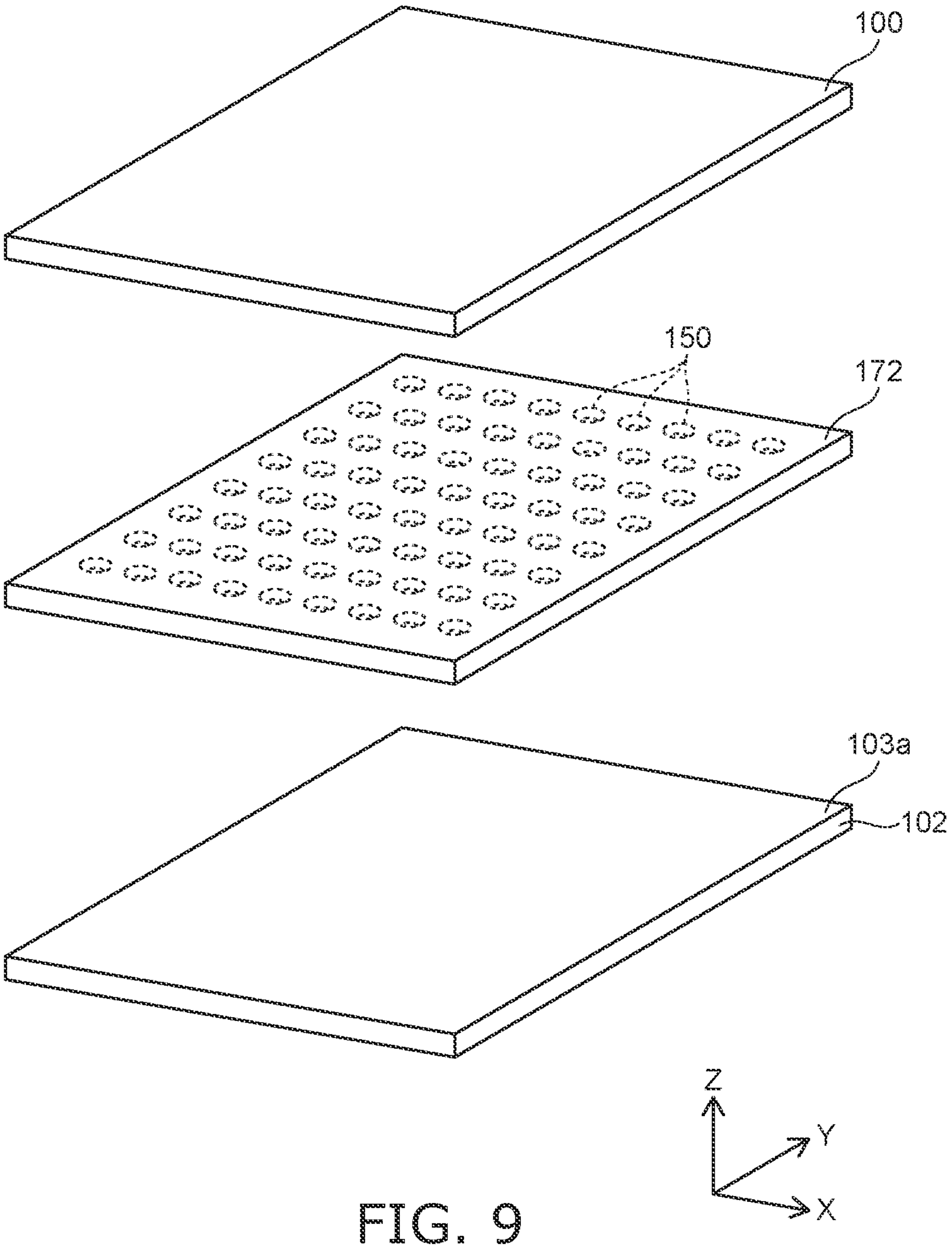
FIG. 9 is a schematic perspective view exemplifying the image display device according to the first embodiment.

In the following description, a three-dimensional coordinate system of XYZ may sometimes be used. A light-emitting element 150 is arrayed in a two-dimensional planar shape, as illustrated in FIG. 9 described below. The light-emitting element 150 is provided for every sub-pixel 20. The two-dimensional plane in which the sub-pixels 20 are arrayed is defined as an XY plane. The sub-pixels 20 are arrayed in an X-axis direction and a Y-axis direction. FIG. 1 illustrates an aligned section view taken along the lines AA' in FIG. 3 described below, and is a cross-sectional view in which cross sections in a plurality of planes perpendicular to the XY plane are connected together on one plane. In other drawings as well, in a cross-sectional view of a plurality of planes perpendicular to the XY plane, the Z axis perpendicular to the XY plane is illustrated without illustrating the X axis and the Y axis, as in FIG. 1. That is, in these drawings, the plane perpendicular to the Z axis is the XY plane.

In the present disclosure, a positive direction of the Z axis may be referred to as "above" or "upward" and a negative direction of the Z axis may be referred to as "below" or "downward," but the direction along the Z axis is not necessarily limited to the direction in which gravity is applied. A length in the direction along the Z axis may be referred to as a height.

The sub-pixel 20 includes a light-emitting surface 151S substantially parallel to the XY plane. The light-emitting surface 151S is a surface that emits light mainly in the negative direction of the Z axis perpendicular to the XY plane. In the present embodiment and all embodiments described below, the light-emitting surface emits light in the negative direction of the Z axis.

As illustrated in FIG. 1, the sub-pixel 20 of the image display device includes a substrate 102, the light-emitting element 150, a light-blocking electrode 160*a*, a first interlayer insulating film 156, a transistor (circuit element) 103, a second interlayer insulating film 108, a via 161*a*, and a first wiring layer 110.

In the present embodiment, the substrate 102 includes two surfaces, and a bonding layer 303 is provided on one surface 102*a*. The bonding layer 303 includes a first surface 103*a*. The first surface 103*a* is a flat surface substantially parallel to the XY plane. In a case in which a color filter is provided in the image display device of the present embodiment, the color filter is formed on the other surface 102*b* of the substrate 102. The other surface 102*b* is a surface on a side opposite to the one surface 102*a*. In the other embodiments described below as well, in a case in which a color filter is not provided, the color filter may be provided on, of the two surfaces of the substrate, the surface on the side opposite to the surface on which the light-emitting element is formed, as described above.

The substrate 102 is a light-transmitting member and is, for example, a glass substrate. The bonding layer 303 is formed of a material having light transmittance, and is a layer formed of an oxide or a nitride of an inorganic material such as $SiO_2$, for example. The bonding layer 303 provides a flat surface for arraying a plurality of light-emitting elements 150 on the first surface 103*a*. The bonding layer 303 facilitates bonding in a wafer bonding process of the manufacturing method of the image display device according to the present embodiment.

The light-emitting element 150 is provided on the first surface 103*a*. The light-emitting element 150 is driven by the transistor 103 provided with the first interlayer insulating film 156 interposed therebetween. The transistor 103 is a thin film transistor (TFT) and is formed on the first interlayer insulating film 156. The process of forming circuit elements including the TFT on a large glass substrate is established for the manufacture of a liquid crystal panel, an organic electroluminescent (EL) panel, and the like, resulting in the advantage that an existing plant can be utilized.

Below, the configuration of the sub-pixels 20 will be described in detail.

The light-emitting element 150 includes the light-emitting surface 151S provided on the first surface 103*a*. The light-emitting element 150 includes an upper surface 153U provided on a side opposite to the light-emitting surface 151S. In this example, outer peripheral shapes of the light-emitting surface 151S and the upper surface 153U in XY plan view are square or rectangular, and the light-emitting element 150 is an element having a prism shape including the light-emitting surface 151S on the first surface 103*a*. A cross section of the prism shape may be a polygon with five or more sides. The light-emitting element 150 is not limited to an element having a prism shape, and may be an element having a column shape.

The light-emitting element 150 includes an n-type semiconductor layer 151, a light-emitting layer 152, and a p-type semiconductor layer 153. The n-type semiconductor layer 151, the light-emitting layer 152, and the p-type semiconductor layer 153 are layered in this order from the light-emitting surface 151S toward the upper surface 153U. The light-emitting surface 151S, which is a surface of the n-type semiconductor layer 151, is provided in contact with the first surface 103*a*. Accordingly, the light-emitting element 150 emits light in the negative direction of the Z axis, through the bonding layer 303 and the substrate 102.

The n-type semiconductor layer 151 includes a connecting portion 151*a*. The connecting portion 151*a* protrudes over the first surface 103*a* in one direction from the n-type semiconductor layer 151. A height of the connecting portion 151*a* from the first surface 103*a* is the same as a height of the n-type semiconductor layer 151 from the first surface 103*a*, or is lower than the height of the n-type semiconductor layer 151 from the first surface 103*a*. The n-type semiconductor layer 151 includes the connecting portion 151*a*. The connecting portion 151*a* is a portion of the n-type semiconductor layer 151. The connecting portion 151*a* is connected to one end of a via 161*k*, and thus the n-type semiconductor layer 151 is electrically connected to the via 161*k* through the connecting portion 151*a*.

In a case in which the light-emitting element 150 has a shape of a prism, the shape of the light-emitting element 150 in XY plan view is, for example, substantially square or rectangular. In a case in which the shape of the light-emitting element 150 in XY plan view is a polygon, including a square, corner portions of the light-emitting element 150 may be rounded. In a case in which the shape of the light-emitting element 150 in XY plan view is a column, the shape of the light-emitting element 150 in XY plan view is not limited to being circular, and may be, for example, elliptical. With appropriate selection of the shape, the arrangement, and the like of the light-emitting element in plan view, a degree of freedom of the wiring line layout and the like is improved.

As the light-emitting element 150, a gallium nitride compound semiconductor including a light-emitting layer such as $In_XAl_YGa_{1-X-Y}N$ (where $0 \le X$, $0 \le Y$, $X+Y<1$), for example, is preferably used. Hereinafter, the gallium nitride compound semiconductor described above may be simply referred to as gallium nitride (GaN). The light-emitting element 150 in one embodiment of the present disclosure is a so-called light-emitting diode. A wavelength of light emitted by the light-emitting element 150 need only be a wavelength in a range of the visible light region from the near-ultraviolet region, and is, for example, in a range about 467 nm±30 nm. The light emitted by the light-emitting elements 150 has a wavelength of about 410 nm 30 nm corresponding to blue violet emission. The wavelength of the light emitted by the light-emitting element 150 is not limited to the values described above and may be an appropriate value.

The light-blocking electrode 160*a* is provided across the upper surface 153U. The light-blocking electrode 160*a* is provided between the upper surface 153U and one end of the via 161*a*. The light-blocking electrode 160*a* is formed of a conductive material having light-blocking properties, and is formed with a sufficient thickness so as to exhibit light-blocking properties. The light-blocking electrode 160*a* realizes an ohmic connection with the p-type semiconductor layer 153 and blocks upwardly emitted light and scattered light. With the light-blocking electrode 160*a* provided, light can be suppressed from reaching the transistor 103 provided above the light-emitting element 150.

The first interlayer insulating film (first insulating film) 156 covers the first surface 103*a*, the light-emitting element 150, and the light-blocking electrode 160*a*. The first interlayer insulating film 156 electrically separates the light-emitting elements 150 adjacently disposed. The first interlayer insulating film 156 also electrically separates the light-blocking electrodes 160*a* provided to the light-emitting elements 150 electrically separated. The first interlayer insulating film 156 electrically separates the light-emitting element 150 and the light-blocking electrode 160*a* from a circuit element such as the transistor 103. The first interlayer insulating film 156 provides a flat surface for forming a circuit 101 including a circuit element such as the transistor 103. The first interlayer insulating film 156 covers the light-emitting element 150, thereby protecting the light-emitting element 150 from thermal stress and the like in a case in which the transistor 103 or the like is formed.

The first interlayer insulating film 156 is formed of an organic insulating material or the like. The organic insulating material used for the first interlayer insulating film 156 is preferably a white resin. With the first interlayer insulating film 156 being a white resin, laterally emitted light of the light-emitting element 150, and return light caused by the interface between the bonding layer 303 and the substrate 102 and the like can be reflected. Therefore, a light emission efficiency of the light-emitting element 150 is substantially improved.

The white resin is formed by dispersing scattering microparticles having a Mie scattering effect in a transparent resin such as a silicon-based resin such as spin-on glass (SOG) or a novolac phenolic resin. The scattering microparticles are colorless or white, and have a diameter of about one-tenth to several times the wavelength of the light emitted by the light-emitting element 150. The scattering microparticles preferably used have a diameter of about one-half of the wavelength of the light. Examples of such scattering microparticles include $TiO_2$, $Al_2O_3$, and ZnO.

Alternatively, the white resin can also be formed by utilizing a plurality of fine pores or the like dispersed within a transparent resin. In a case in which the first interlayer insulating film 156 is whitened, a $SiO_2$ film or the like layered on SOG or the like and formed by atomic layer deposition (ALD) or chemical vapor deposition (CVD), for example, may be used.

The first interlayer insulating film 156 may be a black resin. With the first interlayer insulating film 156 being a black resin, the scattering of light within the sub-pixel 20 is suppressed, and stray light is more effectively suppressed. An image display device in which stray light is suppressed can display a sharper image.

A TFT lower layer film 106 is formed across the first interlayer insulating film 156. The TFT lower layer film 106 ensures flatness when the transistor 103 is formed, and protects a TFT channel 104 of the transistor 103 from contamination and the like during heat treatment. The TFT lower layer film 106 is an insulating film such as $SiO_2$, for example.

The transistor 103 is formed on the TFT lower layer film 106. In addition to the transistors 103, circuit elements such as another transistor and a capacitor are formed on the TFT lower layer film 106, and constitute the circuit 101 by a wiring line and the like. For example, in FIG. 2 described below, the transistor 103 corresponds to a drive transistor 26. In addition, in FIG. 2, a selection transistor 24, a capacitor 28, and the like are circuit elements. The circuit 101 is a circuit that includes the TFT channel 104, an insulating layer 105, the second interlayer insulating film 108, vias 111*s*, 111*d*, and the first wiring layer 110.

The transistor 103 is a p-channel TFT in this example. The transistor 103 includes the TFT channel 104 and a gate 107. The TFT channel 104 is preferably formed by a low temperature polysilicon (LTPS) process. In the LTPS process, the TFT channel 104 is formed by polycrystallizing and activating a region of amorphous Si formed on the TFT lower layer film 106. For example, laser annealing by a laser is used for the polycrystallization and activation of the region of amorphous Si. A TFT formed by the LTPS process has sufficiently high mobility.

The TFT channel 104 includes regions 104*s*, 104*i*, 104*d*. The regions 104*s*, 104*i*, 104*d* are all provided on the TFT lower layer film 106. The region 104*i* is provided between the region 104*s* and the region 104*d*. The regions 104*s*, 104*d* are doped with a p-type impurity such as boron ions ($B^+$) or boron fluoride ions ($BF^{2+}$) and are in ohmic connection with the vias 111*s*, 111*d*.

The gate 107 is provided on the TFT channel 104 with the insulating layer 105 interposed therebetween. The insulating layer 105 insulates the TFT channel 104 and the gate 107 and provides insulation from other adjacent circuit elements. When a potential lower than that of the region 104*s* is applied to the gate 107, a channel is formed in the region 104*i*, making it possible to control a current flowing between the regions 104*s*, 104*d*.

The insulating layer 105 is, for example, $SiO_2$. The insulating layer 105 may be a multi-layer insulating layer including $SiO_2$, $Si_3N_4$, or the like in accordance with the covered region.

The gate 107 may be formed of, for example, polycrystalline Si, or may be formed of a metal with a high melting point, such as W or Mo. When formed of a polycrystalline Si film, the gate 107 is formed by, for example, CVD.

The second interlayer insulating film 108 is provided on the gate 107 and the insulating layer 105. The second interlayer insulating film 108 is formed of the same material as that of the first interlayer insulating film 156, for example. That is, the second interlayer insulating film 108 is formed of an organic film such as a white resin or $SiO_2$ or the like. The second interlayer insulating film 108 functions as a flattening film for forming the first wiring layer 110.

The vias 111*s*, 111*d* pass through the second interlayer insulating film 108 and the insulating layer 105. The first wiring layer 110 is formed on the second interlayer insulating film 108. The first wiring layer 110 includes a plurality of wiring lines that can differ in electrical potential. In this example, the first wiring layer 110 includes wiring lines 110*s*, 110*d*, 110*k*. These wiring lines 110*s*, 110*d*, 110*k* are separated.

A portion of the wiring line 110*s* is provided above the region 104*s*. Another portion of the wiring line 110*s* is connected to a power source line 3 illustrated in FIG. 2 described below, for example. A portion of the wiring line (first wiring line) 110*d* is provided above the region 104*d*. Another portion of the wiring line 110*d* is provided above the upper surface 153U. A portion of the wiring line (second wiring line) 110*k* is provided above the connecting portion 151*a*. Another portion of the wiring line 110*k* is connected to a ground line 4 illustrated in the circuit in FIG. 2 described below, for example.

In the cross-sectional view of FIG. 1 and thereafter, unless otherwise indicated, the reference sign representing a wiring layer is displayed next to the wiring line constituting the wiring layer.

The via 111*s* is provided between the wiring line 110*s* and the region 104*s* and allows electrical connection between the wiring line 110*s* and the region 104*s*. The via 111*d* is provided between the wiring line 110*d* and the region 104*d* and allows electrical connection between the wiring line 110*d* and the region 104*d*.

The wiring line 110*s* is connected to the region 104*s* through the via 111*s*. The region 104*s* is a source region of the transistor 103. Accordingly, the source region of the transistor 103 is electrically connected to the power source line 3 through the via 111*s* and the wiring line 110*s*.

The wiring line 110*d* is connected to the region 104*d* through the via 111*d*. The region 104*d* is a drain region of the transistor 103.

The via (first via) 161*a* passes through the second interlayer insulating film 108, the insulating layer 105, the TFT lower layer film 106, and the first interlayer insulating film 156. The via 161*a* is provided between the wiring line (first wiring line) 110*d* and the light-blocking electrode 160*a*, and allows electrical connection between the wiring line 110*d* and the light-blocking electrode 160*a*. Accordingly, the p-type semiconductor layer 153 is electrically connected to the drain region of the transistor 103 through the light-blocking electrode 160*a*, the via 161*a*, the wiring line 110*d*, and the via 111*d*.

The via (second via) 161*k* passes through the second interlayer insulating film 108, the insulating layer 105, the TFT lower layer film 106, and the first interlayer insulating film 156. The via 161*k* is provided between the wiring line (second wiring line) 110*k* and the connecting portion 151*a*, and allows electrical connection between the wiring line 110*k* and the connecting portion 151*a*. Accordingly, the n-type semiconductor layer 151 is electrically connected to the ground line 4 in the circuit in FIG. 2, for example, through the connecting portion 151*a*, the via 161*k*, and the wiring line 110*k*.

The first wiring layer 110 and the vias 111*s*, 111*d*, 161*k* are formed of Al, an Al alloy, or a layered film of Al and Ti or the like, for example. In a layered film of Al and Ti, for example, Al is layered on a thin film of Ti, and Ti is further layered on Al.

A protective layer covering these for protection from the external environment may be provided across the second interlayer insulating film 108 and the first wiring layer 110.

Figure 2:
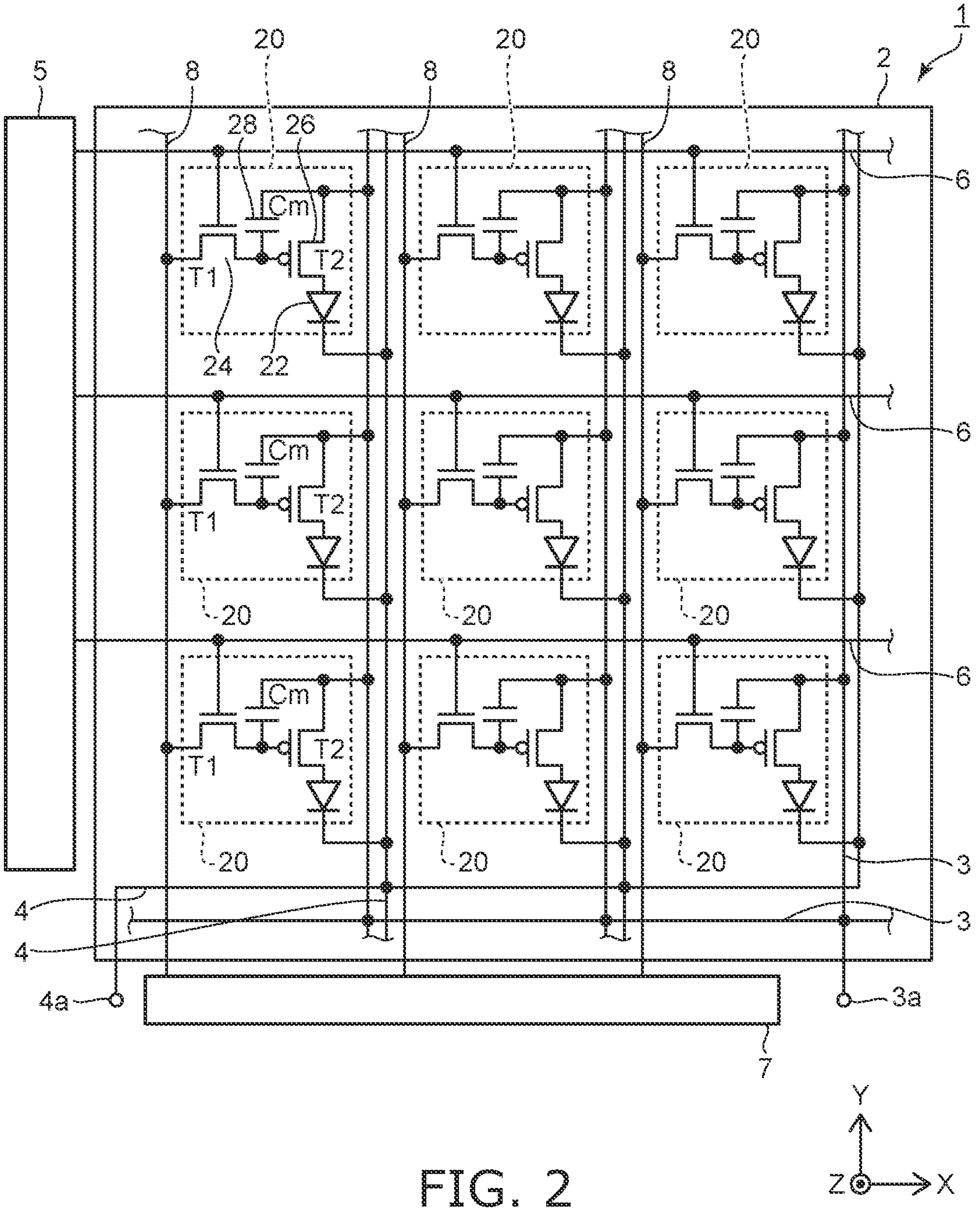
FIG. 2 is a schematic block diagram exemplifying the image display device according to the first embodiment.

FIG. 2 is a schematic block diagram exemplifying an image display device according to the present embodiment.

As illustrated in FIG. 2, an image display device 1 according to the present embodiment includes a display region 2. The sub-pixels 20 are arrayed in the display region 2. The sub-pixels 20 are arrayed, for example, in a lattice pattern. For example, n sub-pixels 20 are arrayed along the X axis, and m sub-pixels 20 are arrayed along the Y axis.

The image display device 1 further includes the power source line 3 and the ground line 4. The power source line 3 and the ground line 4 are wired in a lattice pattern along the array of the sub-pixels 20. The power source line 3 and the ground line 4 are electrically connected to each sub-pixel 20, and power is supplied to each sub-pixel 20 from a direct current power source connected between a power source terminal 3*a* and a ground (GND) terminal 4*a*. The power source terminal 3*a* and the GND terminal 4*a* are respectively provided at end portions of the power source line 3 and the ground line 4, and are connected to a direct current power source circuit provided outside the display region 2. A positive voltage is supplied to the power source terminal 3*a* based on the GND terminal 4*a*.

The image display device 1 further includes a scanning line 6 and a signal line 8. The scanning line 6 is wired in a direction parallel to the X axis. That is, the scanning line 6 is wired along the array of the sub-pixels 20 in a row direction. The signal line 8 is wired in a direction parallel to the Y axis. That is, the signal line 8 is wired along the array of the sub-pixels 20 in a column direction.

The image display device 1 further includes a row selection circuit 5 and a signal voltage output circuit 7. The row selection circuit 5 and the signal voltage output circuit 7 are provided along an outer edge of the display region 2. The row selection circuit 5 is provided in the Y-axis direction of the outer edge of the display region 2. The row selection circuit 5 is electrically connected to the sub-pixel 20 of each column via the scanning line 6, and supplies a selection signal to each sub-pixel 20.

The signal voltage output circuit 7 is provided in the X-axis direction of the outer edge of the display region 2. The signal voltage output circuit 7 is electrically connected to the sub-pixel 20 of each row via the signal line 8, and supplies a signal voltage to each sub-pixel 20.

Figure 3:
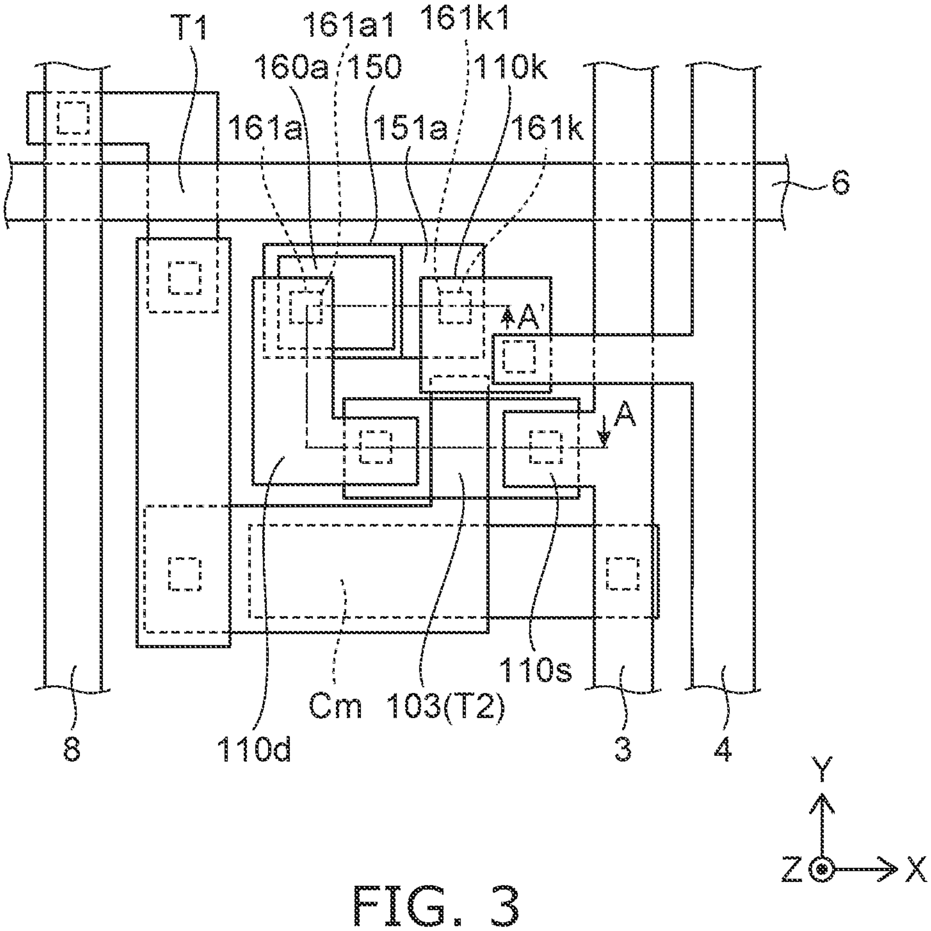
FIG. 3 is a schematic plan view exemplifying a portion of the image display device according to the first embodiment.

The sub-pixel 20 includes a light-emitting element 22, the selection transistor 24, the drive transistor 26, and the capacitor 28. In FIGS. 2 and 3 described below, the selection transistor 24 may be denoted as T1, the drive transistor 26 may be denoted as T2, and the capacitor 28 may be denoted as Cm.

The light-emitting element 22 is connected in series with the drive transistor 26. In the present embodiment, the drive transistor 26 is a p-channel TFT, and an anode electrode of the light-emitting element 22 is connected to a drain electrode of the drive transistor 26. The main electrodes of the drive transistor 26 and the selection transistor 24 are a drain electrode and a source electrode. The anode electrode of the light-emitting element 22 is connected to the p-type semiconductor layer. A cathode electrode of the light-emitting element 22 is connected to the n-type semiconductor layer. The series circuit of the light-emitting element 22 and the drive transistor 26 is connected between the power source line 3 and the ground line 4. The drive transistor 26 corresponds to the transistor 103 in FIG. 1, and the light-emitting element 22 corresponds to the light-emitting element 150 in FIG. 1. The current flowing to the light-emitting element 22 is determined by the voltage applied across the gate-source of the drive transistor 26, and the light-emitting element 22 emits light at a brightness corresponding to the current flowing to the light-emitting element 22.

The selection transistor 24 is connected between a gate electrode of the drive transistor 26 and the signal line 8 via the main electrode. A gate electrode of the selection transistor 24 is connected to the scanning line 6. The capacitor 28 is connected between the gate electrode of the drive transistor 26 and the power source line 3.

The row selection circuit 5 selects one row from the array of m rows of the sub-pixels 20 to supply a selection signal to the scanning line 6. The signal voltage output circuit 7 supplies a signal voltage having the required analog voltage value to each sub-pixel 20 in the selected row. The signal voltage is applied across the gate-source of the drive transistor 26 of the sub-pixels 20 of the selected row. The signal voltage is held by the capacitor 28. The drive transistor 26 introduces a current corresponding to the signal voltage to the light-emitting element 22. The light-emitting element 22 emits light at a brightness in accordance with the flowing current.

The row selection circuit 5 supplies the selection signal by sequentially switching the selected row. That is, the row selection circuit 5 scans the rows in which the sub-pixels 20 are arrayed. A current corresponding to the signal voltage flows in the light-emitting element 22 of the sub-pixels 20 sequentially scanned, and light is emitted. The brightness of the sub-pixel 20 is determined by the current flowing in the light-emitting element 22. The sub-pixel 20 emits light on a gray scale based on the determined brightness, and the image is displayed in the display region 2.

FIG. 3 is a schematic plan view exemplifying a portion of the image display device according to the present embodiment.

In FIG. 3, the AA' lines represent cut lines in a cross-sectional view of FIG. 1 and the like. In the present embodiment, the light-emitting element 150 and the drive transistor 103 are layered in the Z axis direction with the first interlayer insulating film 156 interposed therebetween. The light-emitting element 150 corresponds to the light-emitting element 22 in FIG. 2. The drive transistor 103 corresponds to the drive transistor 26 in FIG. 2, and is also denoted as T2.

As illustrated in FIG. 3, a cathode electrode of the light-emitting element 150 is provided by the connecting portion 151*a*. The connecting portion 151*a* is provided in a lower layer underlying the transistor 103 and the first wiring layer 110. The connecting portion 151*a* is electrically connected to the wiring line 110*k* through the via 161*k*. More specifically, one end of the via 161*k* is connected to the connecting portion 151*a*. The other end of the via 161*k* is connected to the wiring line 110*k* through a contact hole 161*k*1.

An anode electrode of the light-emitting element 150 is provided by the p-type semiconductor layer 153 illustrated in FIG. 1. The light-blocking electrode 160*a* is provided on the upper surface 153U of the p-type semiconductor layer 153. The light-blocking electrode 160*a* is connected to the wiring line 110*d* through the via 161*a*. More specifically, one end of the via 161*a* is connected to the light-blocking electrode 160*a*. The other end of the via 161*a* is connected to the wiring line 110*d* through a contact hole 161*a*1.

The other end of the wiring line 110*d* is connected to a drain electrode of the transistor 103 through the via 111*d* illustrated in FIG. 1. The drain electrode of the transistor 103 is the region 104*d* illustrated in FIG. 1. A source electrode of the transistor 103 is connected to the wiring line 110*s* through the via 111*s* illustrated in FIG. 1. The source electrode of the transistor 103 is the region 104*s* illustrated in FIG. 1. In this example, the first wiring layer 110 includes the power source line 3, and the wiring line 110*s* is connected to the power source line 3.

In this example, the ground line 4 is further provided in an upper layer overlying the first wiring layer 110. Although not illustrated in FIG. 1, an interlayer insulating film is further provided on the first wiring layer 110. The ground line 4 is provided on the interlayer insulating film in the uppermost layer and insulated from the power source line 3.

In this way, the light-emitting element 150 can be electrically connected to the first wiring layer 110 provided in an upper layer overlying the light-emitting element 150 by using the vias 161*k*, 161*a*.

A manufacturing method of the image display device 1 according to the present embodiment will now be described.

FIGS. 4A to 5B are schematic cross-sectional views exemplifying portions of the manufacturing method of the image display device according to the present embodiment.

Figure 4A:
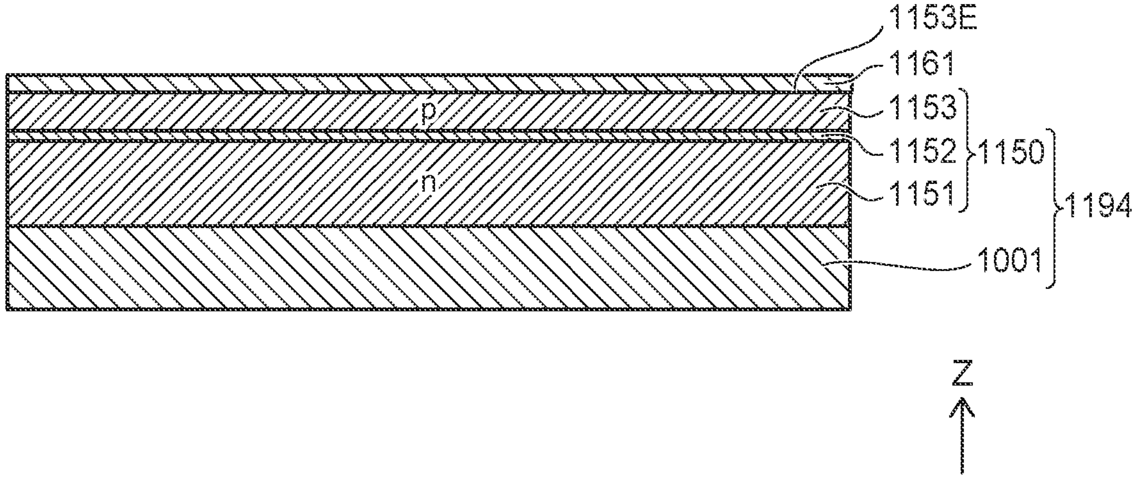
FIG. 4A is a schematic cross-sectional view exemplifying a portion of a manufacturing method of the image display device according to the first embodiment.

As illustrated in FIG. 4A, in the manufacturing method of the image display device 1 of the present embodiment, a semiconductor growth substrate 1194 is prepared. The semiconductor growth substrate 1194 includes a crystal growth substrate 1001 and a semiconductor layer 1150. The crystal growth substrate 1001 is a Si substrate or a sapphire substrate, for example. Preferably, a Si substrate is used as the crystal growth substrate 1001. Further, in a case in which a low temperature crystal growth process such as a low temperature sputtering method is used as described below, a glass substrate or the like that is less expensive can be used.

The semiconductor layer 1150 is formed on the crystal growth substrate 1001. The semiconductor layer 1150 includes an n-type semiconductor layer 1151, a light-emitting layer 1152, and a p-type semiconductor layer 1153. The n-type semiconductor layer 1151, the light-emitting layer 1152, and the p-type semiconductor layer 1153 are layered in this order from the crystal growth substrate 1001 side.

For formation of the semiconductor layer 1150, a chemical vapor deposition (CVD) method, for example, is used, and metal-organic chemical vapor deposition (MOCVD) method is suitably used. Alternatively, epitaxial crystal growth of the semiconductor layer 1150 is possible even at a process temperature of 700° C. or less by using a low temperature sputtering method. By using such a low temperature sputtering method, a glass substrate or a device having low heat resistance can be used, making it possible to reduce manufacturing costs.

The semiconductor layer 1150 includes, for example GaN, and more specifically includes $In_XAl_YGa_{1-X-Y}N$ ($0 \leq X$, $0 \leq Y$, and $X+Y<1$) or the like.

In the early stage of crystal growth, crystal defects may occur due to inconsistency of crystal lattice constants, and a crystal with a crystal defect exhibits an n-shape. Therefore, as in this example, in a case in which the semiconductor layer 1150 is formed from the n-type semiconductor layer 1151 on the crystal growth substrate 1001, a margin in terms of the production process can be increased, resulting in the advantage that yield is readily improved.

A metal layer (first metal layer) 1161 is formed on the p-type semiconductor layer 1153. The metal layer 1161 is formed on an exposed surface 1153E of the p-type semiconductor layer 1153.

In a case in which the semiconductor layer 1150 is formed on the crystal growth substrate 1001, the semiconductor layer 1150 may be formed with a buffer layer interposed therebetween. A nitride such as AlN, for example, is used for the buffer layer. By growing the crystal of the semiconductor layer 1150 on the crystal growth substrate 1001 with a buffer layer interposed therebetween, mismatch at the interface can be mitigated between the GaN crystal and the crystal growth substrate 1001. It is expected, therefore, that the quality of the semiconductor crystal of the semiconductor layer 1150 is improved. On the other hand, in the present embodiment, the n-type semiconductor layer 1151 is bonded to the first surface 103*a*, and thus the process of removing the buffer layer before the bonding is added. The same applies to the other embodiments described below.

Figure 4B:
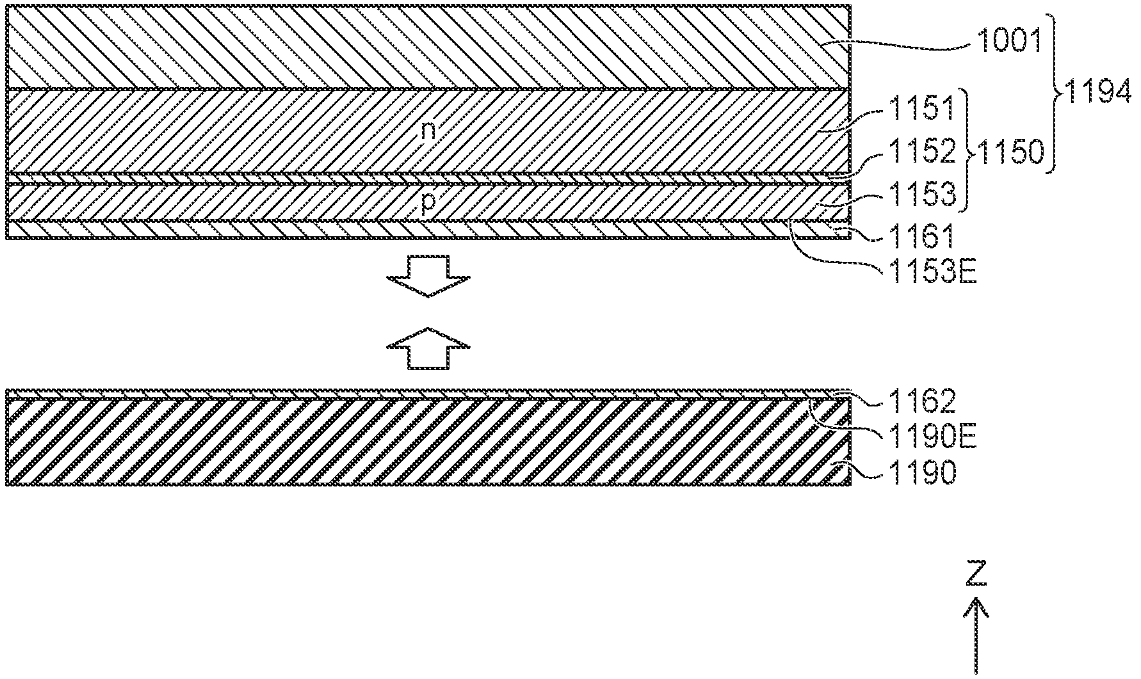
FIG. 4B is a schematic cross-sectional view exemplifying a portion of the manufacturing method of the image display device according to the first embodiment.

As illustrated in FIG. 4B, a support substrate (first substrate) 1190 is prepared. A metal layer (first metal layer) 1162 is formed on one surface 1190E of the support substrate 1190. The support substrate 1190 is formed of, for example, quartz glass or Si.

The semiconductor growth substrate 1194 is disposed with the metal layer 1161 formed on the semiconductor growth substrate 1194 facing the metal layer 1162 formed on the support substrate 1190. The semiconductor layer 1150 is joined to the support substrate 1190 with the metal layers 1161, 1162 interposed therebetween. The metal layers 1161, 1162, as long as conductive materials having light-blocking properties, may be the same material or may be different materials. The metal layer, when molded into the light-blocking electrode 160*a* illustrated in FIG. 1, may be formed on either one of the semiconductor growth substrate 1194 or the support substrate 1190, as long as at a sufficient thickness having light-blocking properties.

Figure 5A:
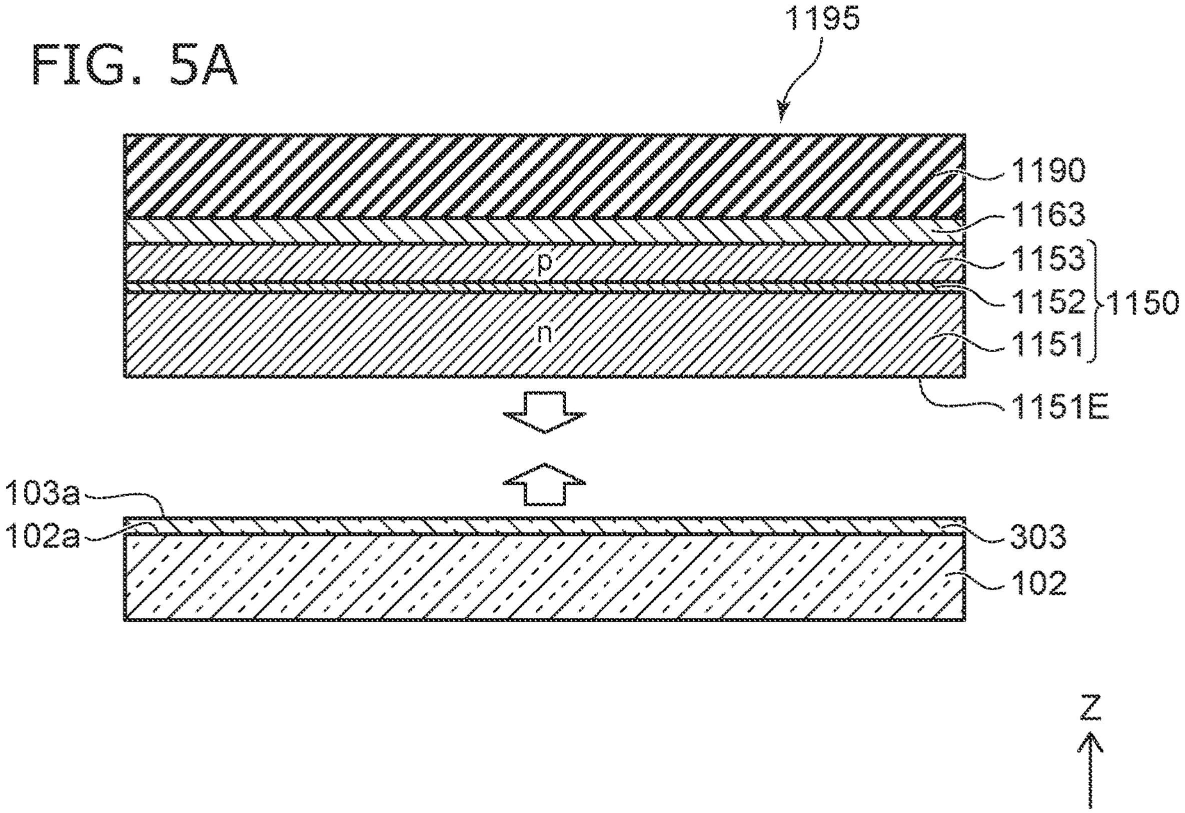
FIG. 5A is a schematic cross-sectional view exemplifying a portion of the manufacturing method of the image display device according to the first embodiment.

After the support substrate 1190 is joined to the semiconductor layer 1150 with a metal layer (first metal layer) 1163 interposed therebetween, the crystal growth substrate 1001 is removed and a substrate 1195 is formed as illustrated in FIG. 5A. The metal layer 1163 is a junction formation of the two metal layers 1161, 1162. To remove the crystal growth substrate 1001 illustrated in FIG. 4B, wet etching or laser lift-off, for example, is used.

Figure 5B:
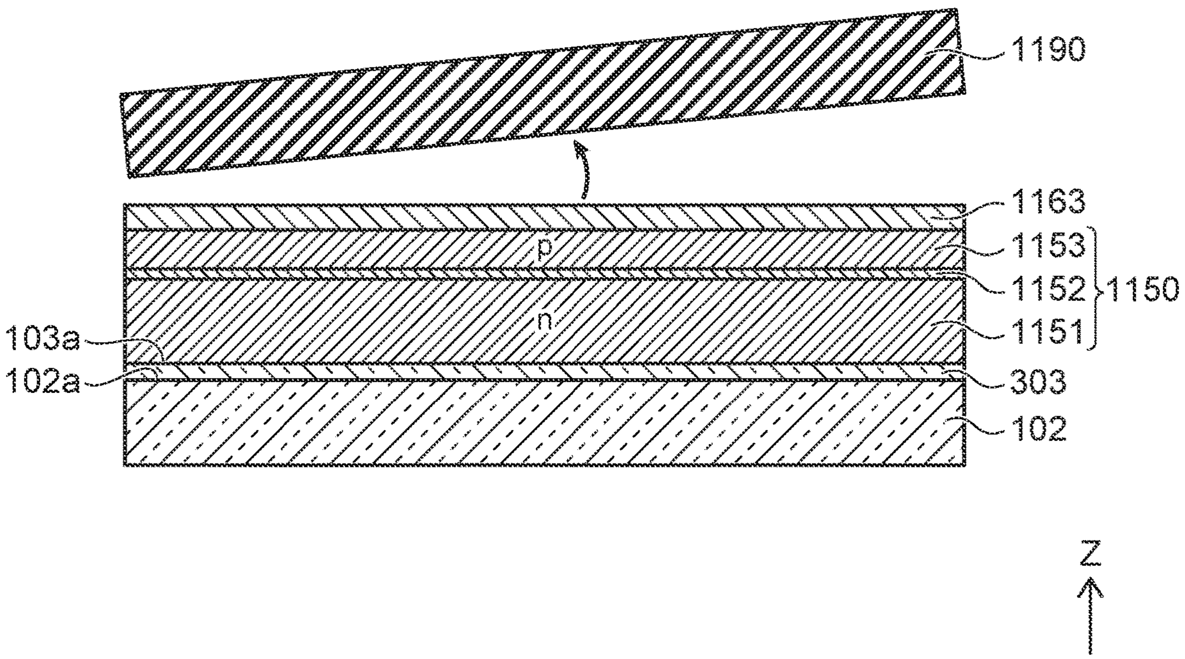
FIG. 5B is a schematic cross-sectional view exemplifying a portion of the manufacturing method of the image display device according to the first embodiment.

The semiconductor layer 1150 of the substrate 1195 is bonded to the first surface 103*a* of the substrate 102 that is a light-transmitting substrate. The surface bonded to the first surface 103*a* is an exposed surface 1151E of the n-type semiconductor layer 1151. Subsequently, as illustrated in FIG. 5B, the support substrate 1190 is removed. For removal of the support substrate 1190 as well, wet etching or laser lift-off is used.

In the process of substrate bonding, for example, the substrates are heated and then bonded together by thermal compression bonding. In addition to the above, the bonding surface of each substrate may be flattened using chemical mechanical polishing (CMP) or the like, and the bonding surfaces may be cleaned by a plasma treatment in a vacuum and brought into close contact.

In a case in which the semiconductor layer 1150 is bonded to the substrate 102, sometimes one semiconductor layer 1150 is be bonded to one substrate 102 and sometimes a plurality of the semiconductor layers 1150 are bonded to one substrate 102. When one semiconductor layer 1150 is bonded to one substrate 102, a size of the substrate 102 can be, for example, a rectangular shape or a square shape in a range from several 10*s* of mm square to 150 mm square. In this case, the semiconductor layer 1150 formed on the substrate 1195 can be sized in accordance with the size of the substrate 102.

When a plurality of the semiconductor layers 1150 are bonded to one substrate 102, a substantially rectangular glass substrate of about 1500 mm×1800 mm can be used, for example. The semiconductor layer 1150 formed on the substrate 1195 has a rectangular shape or a square shape in a range from about several 10*s* of mm square to 150 mm square, and can be, upon conversion into wafer dimensions, a size in a range from about 4 inches to 6 inches, for example. The size of the substrate 102 is selected as appropriate in accordance with a size of the image display device and the like.

Figure 6:
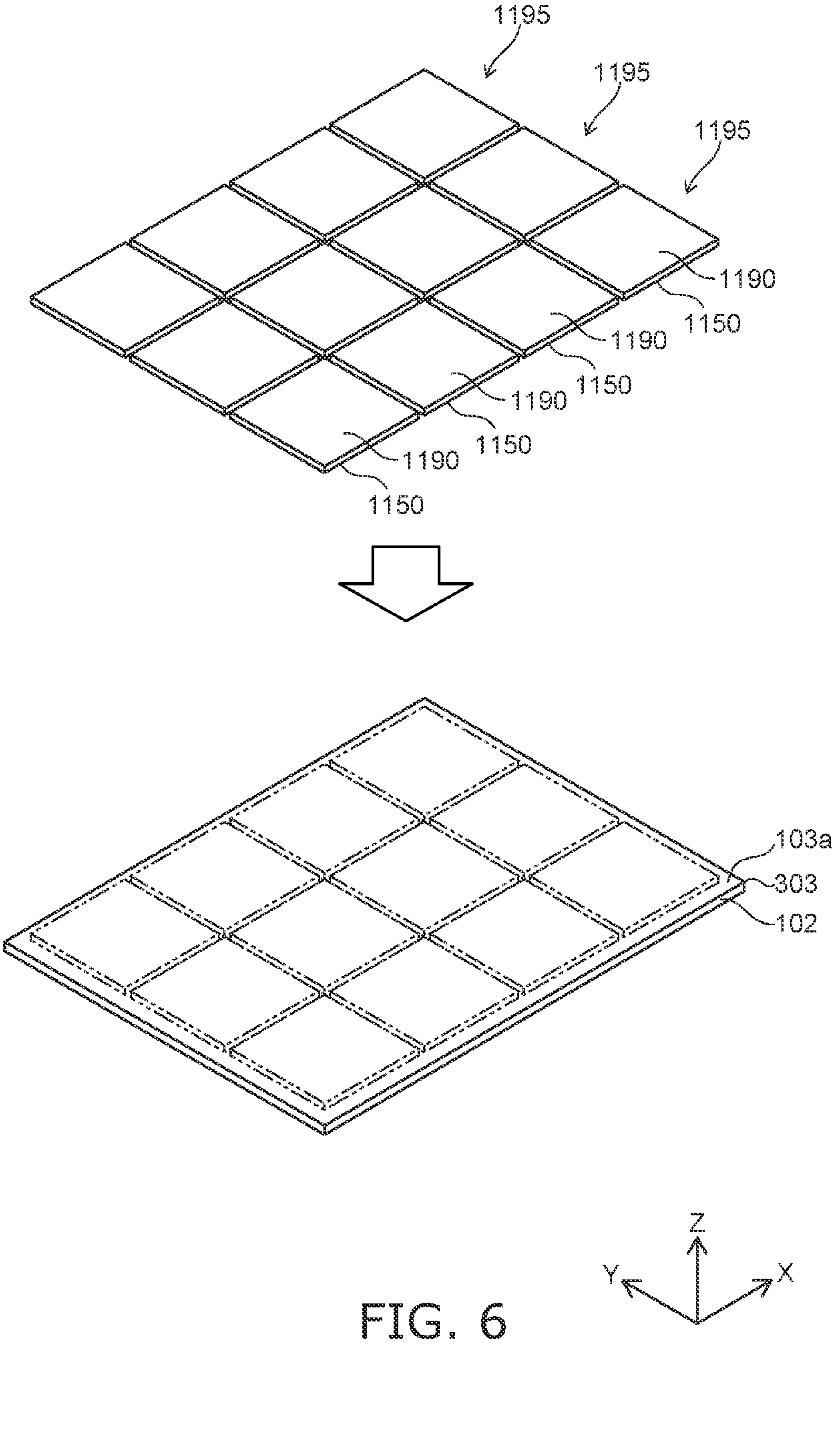
FIG. 6 is a schematic perspective view exemplifying a portion of the manufacturing method of the image display device according to the first embodiment.

FIG. 6 is a schematic perspective view exemplifying a portion of the manufacturing method of the image display device according to the present embodiment.

FIG. 6 schematically illustrates an example when a plurality of the semiconductor layers 1150 are bonded to one substrate 102.

The view above the arrow in FIG. 6 illustrates that the plurality of substrates 1195 are disposed in a lattice pattern. The view below the arrow in FIG. 6 illustrates that the substrate 102 is disposed with the bonding layer 303 formed thereon. FIG. 6 illustrates by the arrow that the plurality of substrates 1195 disposed in lattice pattern are bonded at positions outlined by two-dot chain lines.

The quality of the semiconductor crystal at or near end portions of the semiconductor layer 1150 deteriorates, making it necessary to take care not to form the light-emitting element 150 at or near the end portions of the semiconductor layer 1150.

As illustrated in FIG. 6, the end portions of the semiconductor layer 1150 substantially match end portions of the support substrate 1190. Therefore, the plurality of substrates 1195 are disposed in a lattice pattern facing the substrate 102 without causing, to the extent possible, a gap to occur between the substrates 1195 adjacent to each other, as indicated by solid lines in FIG. 6, for example. The semiconductor layer 1150 is bonded onto the first surface 103*a* of the substrate 102 as indicated by the two-dot chain lines in FIG. 6.

In a case in which a plurality of the semiconductor layers 1150 are bonded to one substrate 102, the substrate 102 on which the plurality of semiconductor layers 1150 are bonded can be divided to create image display devices of a quantity and a size corresponding to the number of divisions. The end portions of the semiconductor layer 1150 having a deteriorated semiconductor crystal quality are preferably end portions of the display region, and thus the unit of division of the substrate 102 is preferably set to match the shape of the substrate 1195.

The process up to formation of the semiconductor growth substrate 1194 and the process of performing the processing after formation of the substrate 1195 may be executed at the same plant or at different plants. For example, the substrate 1195 may be manufactured by a first plant, and the substrate 1195 may be transported to a second plant different from the first plant to execute the bonding process.

The method of bonding the semiconductor layer 1150 to the substrate 102 is not limited to the above, and may be the following method. That is, the semiconductor layer 1150 is formed on the crystal growth substrate 1001, subsequently accommodated in a container, and then stored after, for example, mounting the support substrate 1190 in the container. After storage, the semiconductor layer 1150 is removed from the container and bonded to the substrate 102. Alternatively, the semiconductor layer 1150 is stored in the container without being mounted to the support substrate 1190. After storage, the semiconductor layer 1150 is removed from the container and then bonded to the substrate 102.

Figure 7A:
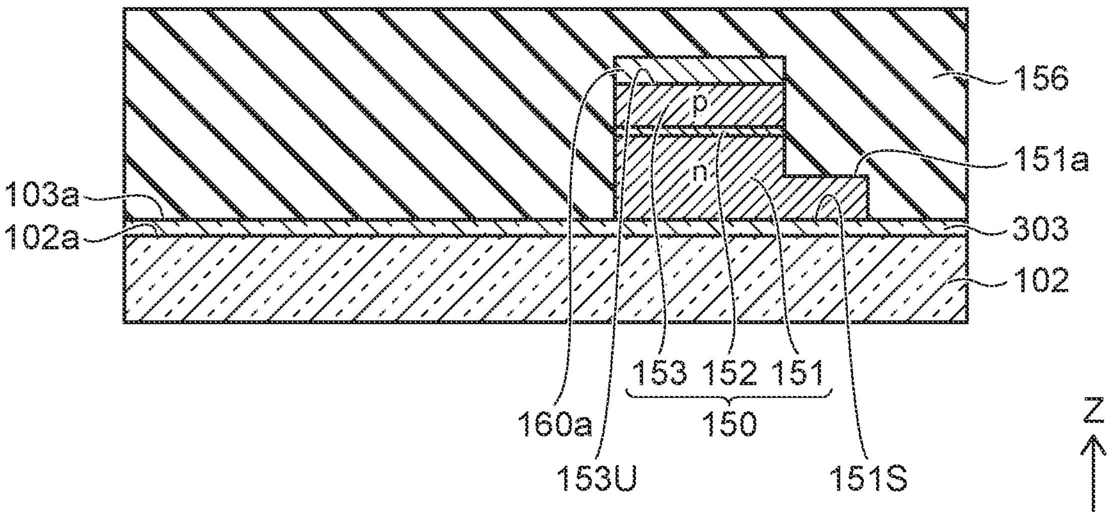
FIG. 7A is a schematic cross-sectional view exemplifying a portion of the manufacturing method of the image display device according to the first embodiment.

FIGS. 7A to 8B are schematic cross-sectional views exemplifying portions of the manufacturing method of the image display device according to the present embodiment. As illustrated in FIG. 7A, the metal layer 1163 illustrated in FIG. 5B is processed into a desired shape by etching, forming the light-blocking electrode 160*a*. To form the light-blocking electrode 160*a*, dry etching or wet etching is used.

The semiconductor layer 1150 illustrated in FIG. 5B is processed into a desired shape by etching, forming the light-emitting element 150. In the light-emitting element 150, the connecting portion 151*a* is formed, and subsequently other portions are formed by further etching. As a result, it makes it possible to form the light-emitting element 150 including the connecting portion 151*a* that protrudes over the first surface 103*a* from the n-type semiconductor layer 151 in the positive direction of the X axis. For the formation of the light-emitting element 150, a dry etching process, for example, is used, and anisotropic ion etching (reactive ion etching (RIE)) is suitably used.

The first interlayer insulating film (first insulating film) 156 covers the first surface 103*a*, the light-emitting element 150 and the light-blocking electrode 160*a*.

Figure 7B:
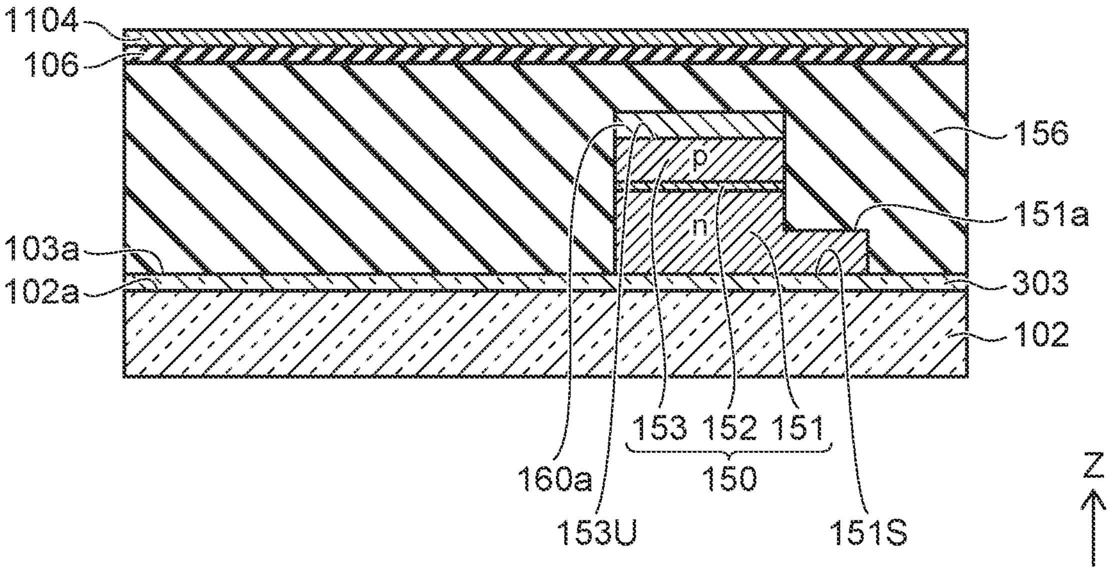
FIG. 7B is a schematic cross-sectional view exemplifying a portion of the manufacturing method of the image display device according to the first embodiment.

As illustrated in FIG. 7B, the TFT lower layer film 106 is formed on the first interlayer insulating film 156 by CVD, for example. A Si layer 1104 is formed on the TFT lower layer film 106 thus formed. The Si layer 1104 is a layer of amorphous Si at the time of film formation, and is subsequently scanned a plurality of times after film formation with an excimer laser pulse, for example, thereby forming the polycrystallized Si layer 1104.

Figure 8A:
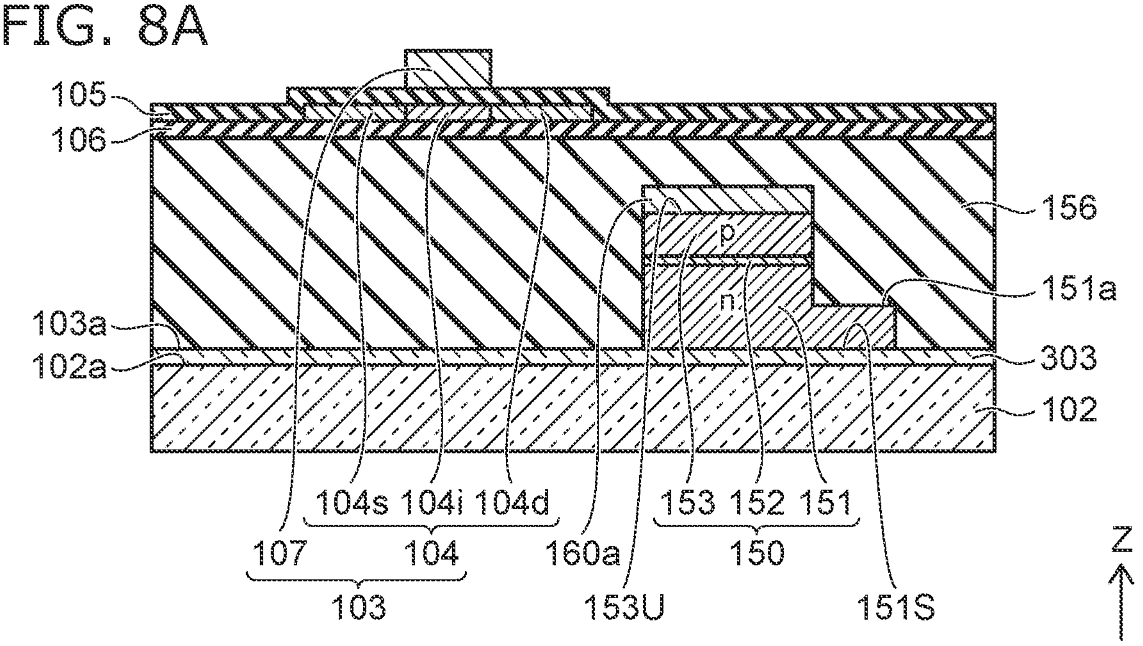
FIG. 8A is a schematic cross-sectional view exemplifying a portion of the manufacturing method of the image display device according to the first embodiment.

As illustrated in FIG. 8A, the polycrystallized Si layer 1104 illustrated in FIG. 7B is processed into an island shape, forming the TFT channel 104. The insulating layer 105 covers the TFT lower layer film 106 and the TFT channel 104. The insulating layer 105 functions as a gate insulating film. On the TFT channel 104, the gate 107 is formed with the insulating layer 105 interposed therebetween. The transistor (circuit element) 103 is formed by selectively doping the gate 107 with and thermally activating an impurity such as B. The regions 104*s*, 104*d* are p-type active regions, and respectively function as a source region and a drain region of the transistor 103. The region 104*i* is an n-type active region and functions as a channel.

In a case in which an LTPS process is used, the transistor 103 is thus formed at a desired position on the TFT lower layer film 106.

Figure 8B:
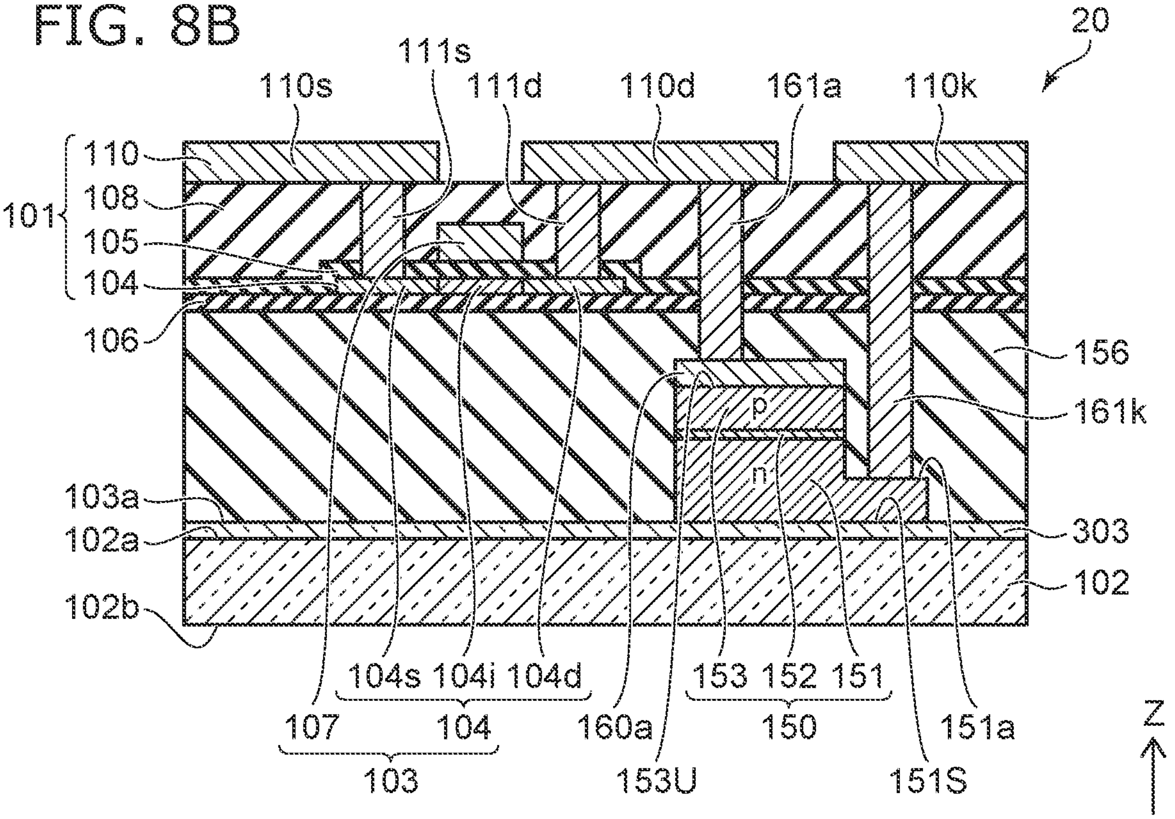
FIG. 8B is a schematic cross-sectional view exemplifying a portion of the manufacturing method of the image display device according to the first embodiment.

As illustrated in FIG. 8B, the second interlayer insulating film (second insulating film) 108 covers the insulating layer 105 and the gate 107. For formation of the second interlayer insulating film 108, an appropriate manufacturing method is applied in accordance with a material of the second interlayer insulating film 108. For example, in a case in which the second interlayer insulating film 108 is formed of $SiO_2$, a technique such as ALD or CVD is used.

A degree of flatness of the second interlayer insulating film 108 need only be to the extent that the first wiring layer 110 can be formed, and a flattening process need not necessarily be performed. In a case in which a flattening process is not applied to the second interlayer insulating film 108, the number of processes can be reduced. For example, in a case in which a location exists where a thickness of the second interlayer insulating film 108 is thin around the light-emitting element 150, a depth of via holes for the vias 161*a*, 161*k* can be made shallower, making it possible to ensure a sufficient opening diameter. As a result, it is easier to ensure electrical connections through the vias, making it possible to suppress a reduction in yield caused by poor electrical properties.

The vias 161*a*, 161*k* are formed through the second interlayer insulating film 108, the insulating layer 105, the TFT lower layer film 106, and the first interlayer insulating film 156. The via (first via) 161*a* reaches the light-blocking electrode 160*a*. The via (second via) 161*k* reaches the connecting portion 151*a*.

The vias 111*s*, 111*d* pass through the second interlayer insulating film 108 and the insulating layer 105. The via 111*s* reaches the region 104*s*. The via 111*d* reaches the region 104*d*. For via hole formation for forming the vias 161*a*, 161*k*, 111*s*, and 111*d*, RIE is used, for example.

The first wiring layer 110 is formed on the second interlayer insulating film 108. The wiring lines 110*k*, 110*d*, 110*s* are formed. The wiring line 110*k* is connected to one end of the via 161*k*. The wiring line 110*d* is connected to one end of the via 161*a* and one end of the via 111*d*. The wiring line 110*s* is connected to one end of the via 111*s*. The first wiring layer 110 may be formed simultaneously with formation of the vias 161*k*, 111*d*, 111*s*.

In this way, the sub-pixels 20 are formed and the image display device is formed.

FIG. 9 is a schematic perspective view exemplifying the image display device according to the present embodiment.

As illustrated in FIG. 9, the image display device of the present embodiment is provided with a light-emitting circuit portion 172 including a plurality of the light-emitting elements 150 on the substrate 102. The light-emitting circuit portion 172 is a structure including the light-emitting elements 150 as well as the light-blocking electrode 160*a* and the first interlayer insulating film 156 covering these illustrated in FIG. 1. A drive circuit portion 100 is provided on the light-emitting circuit portion 172. The drive circuit portion 100 is a structure including the circuit 101, the second interlayer insulating film 108, and the TFT lower layer film 106 illustrated in FIG. 1. As described above, the light-emitting circuit portion 172 and the drive circuit portion 100 are electrically connected by the vias 161*a*, 161*k*.

The configuration illustrated in FIG. 9 is an example of the image display device according to the first embodiment, and is an example of a case in which a color filter is not provided. The configuration is applied to cases in which a color filter is not provided in other embodiments described below.

Effects of the image display device 1 of the present embodiment will now be described. In the manufacturing method of the image display device 1 according to the present embodiment, the semiconductor layer 1150 is bonded to the substrate 102 and subsequently etched to form the light-emitting elements 150. Subsequently, the light-emitting element 150 is covered with the first interlayer insulating film 156, and the circuit 101 including circuit elements such as the transistor 103 that drives the light-emitting element 150 is created on the first interlayer insulating film 156. As a result, the manufacturing process is significantly shortened compared to individually transferring separated pieces of the light-emitting elements to the substrate 102.

For example, the number of sub-pixels exceeds 24 million in an image display device with 4K image quality, and exceeds 99 million in the case of an image display device with 8K image quality. To individually form and mount onto a circuit substrate such a large number of light-emitting elements requires an enormous amount of time. This makes it difficult to realize an image display device that uses micro LEDs at a realistic cost. Further, individually mounting a large number of light-emitting elements reduces yield due to connection failure and the like during mounting, and thus further increases in cost cannot be avoided. However, the manufacturing method of the image display device of the present embodiment has effects such as the following.

As described above, in the manufacturing method of the image display device 1 according to the present embodiment, the entire semiconductor layer 1150 is bonded to the substrate 102 and the light-emitting elements are subsequently formed by etching, and thus the transfer process is completed in one undertaking. Therefore, the manufacturing method of the image display device 1 in the present embodiment can shorten the time of the transfer process and reduce the number of processes compared to the manufacturing methods in the related art.

Furthermore, the semiconductor layer 1150 is bonded to the substrate 102 at the wafer level without being separated into pieces in advance or forming electrodes at positions corresponding to the circuit elements. Therefore, alignment at the bonding stage is unnecessary. Accordingly, the bonding process can be easily performed in a short period of time. Without the need for position alignment at the time of bonding, the size of the light-emitting element 150 is readily reduced, which is suitable for a high-definition display.

In the present embodiment, for example, a glass substrate formed as described above is covered with the first interlayer insulating film 156, making it possible to form a drive circuit or a scanning circuit including a TFT or the like on a flattened surface using an LTPS process or the like. As a result, there is an advantage that a manufacturing process and a plant of an existing flat panel display can be utilized.

In the present embodiment, the light-emitting element 150 formed in a lower layer underlying the transistor 103 and the like can be electrically connected to a power source line, a ground line, a drive transistor, and the like formed in an upper layer by forming the vias 161*a*, 161*k* passing through the first interlayer insulating film 156, the TFT lower layer film 106, the insulating layer 105, and the second interlayer insulating film 108. By using this technically established multilayer wiring technique, a uniform connection structure can easily be achieved and thus yield can be improved.

Accordingly, a reduction in yield due to connection failure of a light-emitting element or the like is suppressed.

In the image display device 1 according to the present embodiment, the transistor 103 is formed above the light-emitting element 150, but the light-blocking electrode 160*a* is formed across the upper surface 153U of the light-emitting element 150. Therefore, the upwardly scattered light and the like emitted from the light-emitting element 150 is suppressed from reaching the transistor 103 by the light-blocking electrode 160*a*. As a result, malfunction of the transistor 103 is prevented.

The light-blocking electrode 160*a* can be imparted with light reflectivity by appropriately selecting a conductive material. With the light-blocking electrode 160*a* having light reflectivity, upwardly scattered light scattered and the like can be reflected to the light-emitting surface 151S side, and thus the substantial light emission efficiency can be improved.

Second Embodiment

Figure 10:
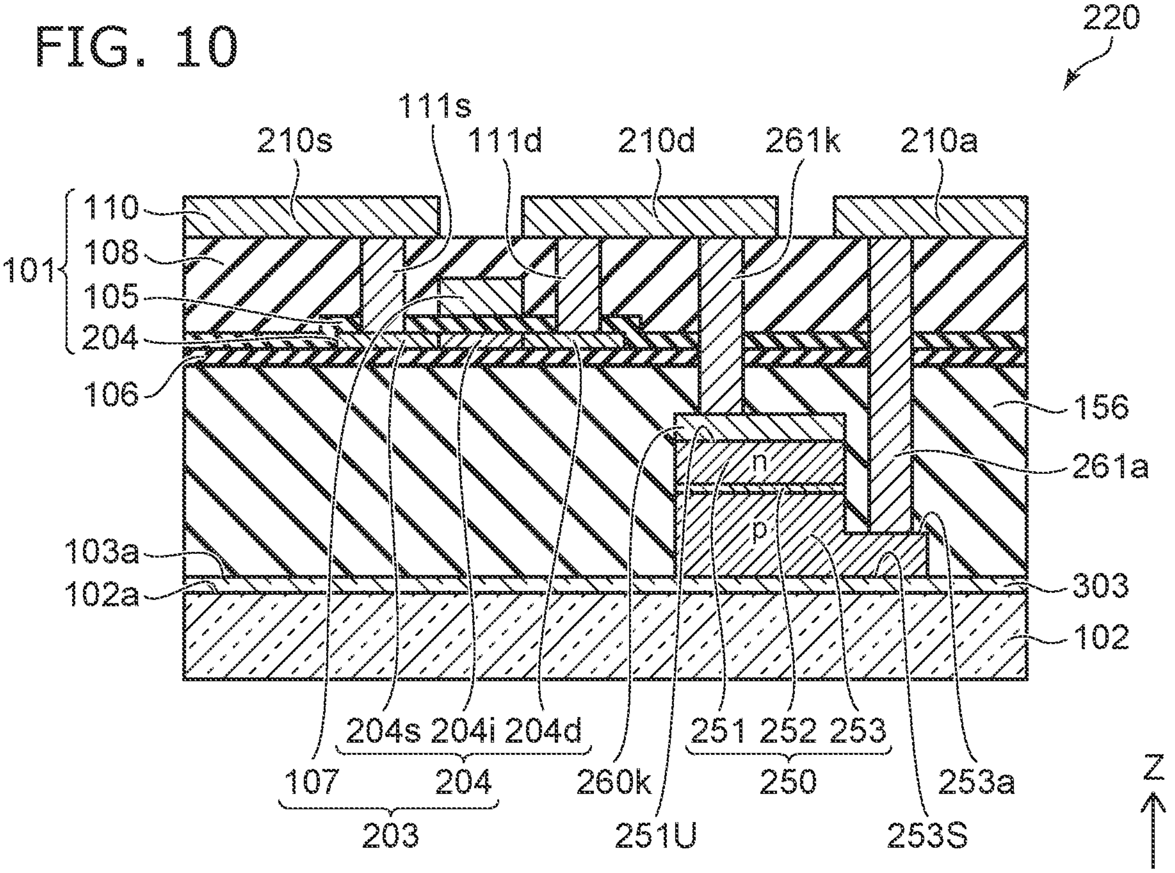
FIG. 10 is a schematic cross-sectional view exemplifying a portion of an image display device according to a second embodiment.

FIG. 10 is a schematic cross-sectional view exemplifying a portion of an image display device according to the present embodiment.

As illustrated in FIG. 10, the image display device of the present embodiment includes a sub-pixel 220, and the sub-pixel 220 differs from that of the other embodiment described above in that a p-type semiconductor layer 253 provides a light-emitting surface 253S. In the present embodiment, the configuration of a light-emitting element 250 differs from that of the other embodiment described above, and thus the configuration of a transistor 203 that drives the light-emitting element 250 also differs. Components that are the same as those of the other embodiment are denoted by the same reference signs, and detailed descriptions thereof will be omitted as appropriate.

The sub-pixel 220 of the image display device of the present embodiment includes the substrate 102, the light-emitting element 250, a light-blocking electrode 260*k*, the first interlayer insulating film 156, the transistor 203, the second interlayer insulating film 108, a via 261*k*, and the first wiring layer 110.

The light-emitting element 250 is provided on the first surface 103*a*. The light-emitting element 250 includes the light-emitting surface 253S provided on the first surface 103*a*. The light-emitting surface 253S is in contact with the first surface 103*a*. The light-emitting element 250 includes an upper surface 251U provided on a side opposite to the light-emitting surface 253S. The light-emitting element 250 is an element having a prism shape or a column shape, as in the other embodiment described above.

The light-emitting element 250 includes the p-type semiconductor layer 253, a light-emitting layer 252, and an n-type semiconductor layer 251. The p-type semiconductor layer 253, the light-emitting layer 252, and the n-type semiconductor layer 251 are layered in this order from the light-emitting surface 253S toward the upper surface 251U. In the present embodiment, the light-emitting surface 253S is provided by the p-type semiconductor layer 253.

The light-emitting element 250 includes a connecting portion 253*a*. The connecting portion 253*a* protrudes over the first surface 103*a* in one direction from the p-type semiconductor layer 253. A height of the connecting portion 253*a* from the first surface 103*a* is the same as or lower than a height of the p-type semiconductor layer 253 from the first surface 103*a*. The connecting portion 253*a* is a p type, and electrically connected to the p-type semiconductor layer 253. The connecting portion 253*a* is connected to one end of a via 261*a* and electrically connects the p-type semiconductor layer 253 to the via 261*a*.

The light-emitting element 250 has the same shape as that of the light-emitting element 150 of the other embodiment described above in XY plan view. An appropriate shape is selected according to the layout of the circuit elements and the like.

The light-emitting element 250 is a light-emitting diode similar to that of the light-emitting element 150 of the other embodiment described above. That is, light emitted by the light-emitting element 250 has a wavelength of, for example, about 467 nm±30 nm corresponding to blue light emission or about 410 nm±30 nm corresponding to blue violet light emission. The wavelength of the light emitted by the light-emitting element 250 is not limited to the values described above and may be an appropriate value.

The transistor 203 is formed on the TFT lower layer film 106. The transistor 203 is an n-channel TFT. The transistor 203 includes a TFT channel 204 and the gate 107. Preferably, the transistor 203 is formed by an LTPS process or the like as in the other embodiment described above. In the present embodiment, the circuit 101 includes the TFT channel 204, the insulating layer 105, the second interlayer insulating film 108, the vias 111*s*, 111*d*, and the first wiring layer 110.

The TFT channel 204 includes regions 204*s*, 204*i*, 204*d*. The regions 204*s*, 204*i*, 204*d* are provided on the TFT lower layer film 106. The regions 204*s*, 204*d* are doped with an n-type impurity such as phosphorus ions ($P^-$). The region 204*s* is ohmic connected to the via 111*s*. The region 204*d* is ohmic connected to the via 111*d*.

The gate 107 is provided on the TFT channel 204 with the insulating layer 105 interposed therebetween. The insulating layer 105 insulates the TFT channel 204 and the gate 107.

In the transistor 203, when a voltage greater than that of the region 204*s* is applied to the gate 107, a channel is formed in the region 204*i*. A current flowing between the regions 204*s*, 204*d* is controlled by the voltage across the region 204*s* of the gate 107. The TFT channel 204 and the gate 107 are formed of a material and by a manufacturing method that are the same as those of the TFT channels 104 and the gate 107 in the other embodiment described above.

The first wiring layer 110 includes wiring lines 210*s*, 210*d*, 210*a*. A portion of the wiring line 210*a* (second wiring line) is provided above the connecting portion 253*a*. Another portion of the wiring line 201*a* is connected to the power source line 3 illustrated in FIG. 11 described below, for example.

The vias 111*s*, 111*d* are provided through the second interlayer insulating film 108. The via 111*s* is provided between the wiring line 110*s* and the region 204*s*. The via 111*s* allows electrical connection between the wiring line 110*s* and the region 204*s*. The via 111*d* is provided between the wiring line 110*d* and the region 204*d*. The via 111*d* allows electrical connection between the wiring line 110*d* and the region 204*d*. The vias 111*s*, 111*d* are formed of a material and by a manufacturing method that are the same as those in the other embodiment described above.

The via 261*k* passes through the second interlayer insulating film 108, the insulating layer 105, the TFT lower layer film 106, and the first interlayer insulating film 156. The via 261*k* is provided between the wiring line 210*d* and the light-blocking electrode 260*k*, and allows electrical connection between the wiring line 210*d* and the light-blocking electrode 260*k*. Accordingly, the n-type semiconductor layer 251 is electrically connected to a drain region of the transistor 203 through the light-blocking electrode 260*k*, the via 261*k*, the wiring line 210*d*, and the via 111*d*.

The via 261*a* passes through the second interlayer insulating film 108, the insulating layer 105, the TFT lower layer film 106, and the first interlayer insulating film 156. The via 261*a* is provided between the wiring line 210*a* and the connecting portion 253*a*, and allows electrical connection between the wiring line 210*a* and the connecting portion 253*a*. Accordingly, the p-type semiconductor layer 253 is electrically connected to the power source line 3 of the circuit in FIG. 11, for example, through the connecting portion 253*a*, the via 261*a*, and the wiring line 210*a*.

Figure 11:
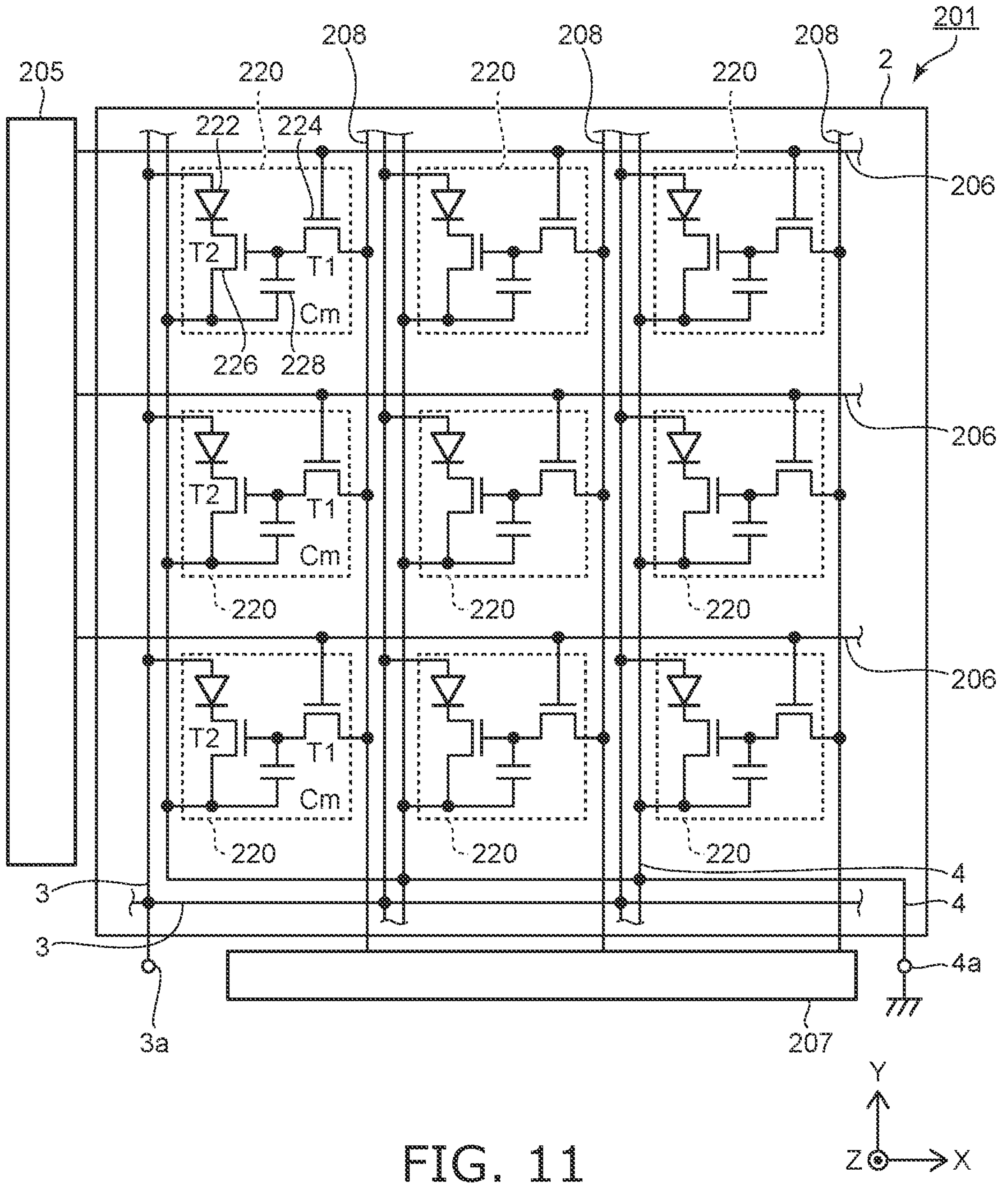
FIG. 11 is a schematic block diagram exemplifying the image display device according to the second embodiment.

FIG. 11 is a schematic block diagram exemplifying the image display device according to the present embodiment.

As illustrated in FIG. 11, an image display device 201 of the present embodiment includes the display region 2, a row selection circuit 205, and a signal voltage output circuit 207. In the display region 2, the sub-pixels 220 are arrayed in a lattice pattern on the XY plane, for example, as in the other embodiment described above.

The sub-pixel 220 includes a light-emitting element 222, a selection transistor 224, a drive transistor 226, and a capacitor 228. In FIG. 11, the selection transistor 224 may be denoted as T1, the drive transistor 226 may be denoted as T2, and the capacitor 228 may be denoted as Cm.

In the present embodiment, the light-emitting element 222 is provided on the power source line 3 side, and the drive transistor 226 connected in series with the light-emitting element 222 is provided on the ground line 4 side. That is, the drive transistor 226 is connected to a potential side lower than that of the light-emitting element 222. The drive transistor 226 is an n-channel transistor.

The selection transistor 224 is connected between a gate electrode of the drive transistor 226 and a signal line 208. The capacitor 228 is connected between the gate electrode of the drive transistor 226 and the ground line 4.

The row selection circuit 205 and the signal voltage output circuit 207 supply a signal voltage of a polarity different from that of the other embodiment described above to the signal line 208 in order to drive the drive transistor 226 that is an n-channel transistor.

In the present embodiment, the polarity of the drive transistor 226 is the n-channel, and thus the polarity of the signal voltage and the like differ from those of the other embodiment described above. That is, the row selection circuit 205 supplies a selection signal to a scanning line 206, sequentially selecting one row from the array of m rows of the sub-pixels 220. The signal voltage output circuit 207 supplies a signal voltage having the required analog voltage value for each sub-pixel 220 in the selected row. The drive transistor 226 of the sub-pixels 220 of the selected row introduces a current corresponding to the signal voltage to the light-emitting element 222. The light-emitting element 222 emits light at a brightness corresponding to the current flowing in the light-emitting element 222.

A manufacturing method of the image display device according to the present embodiment will now be described.

Figure 12A:
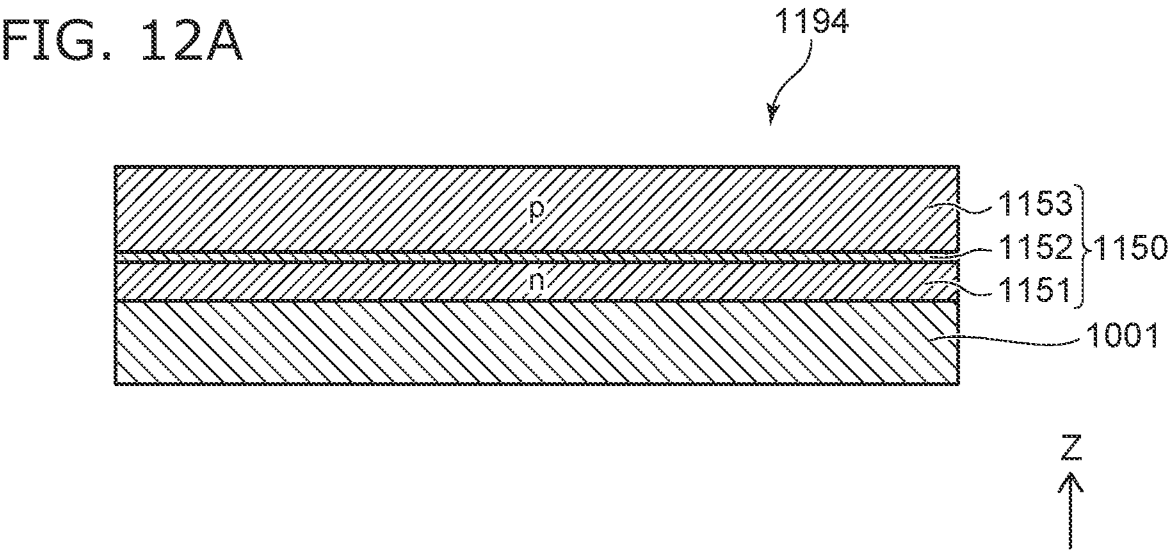
FIG. 12A is a schematic cross-sectional view exemplifying a portion of a manufacturing method of the image display device according to the second embodiment.
Figure 12B:
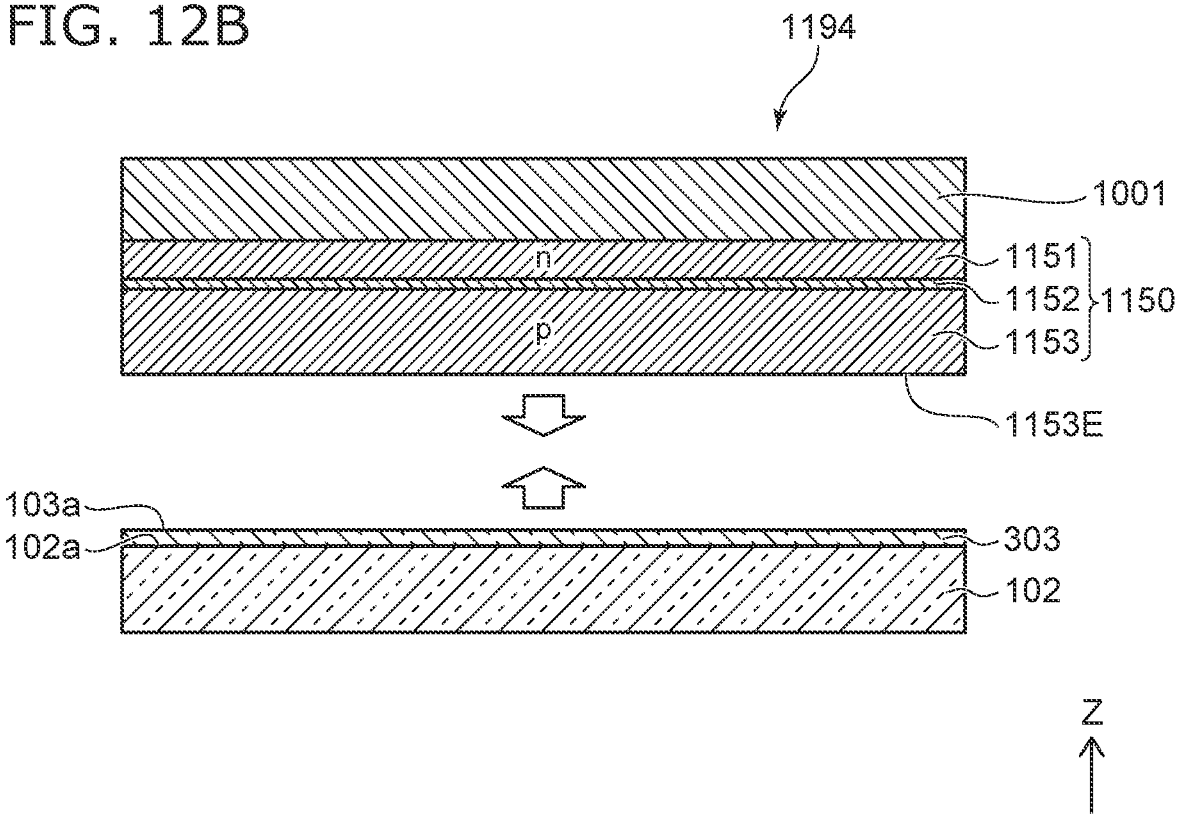
FIG. 12B is a schematic cross-sectional view exemplifying a portion of the manufacturing method of the image display device according to the second embodiment.
Figure 13:
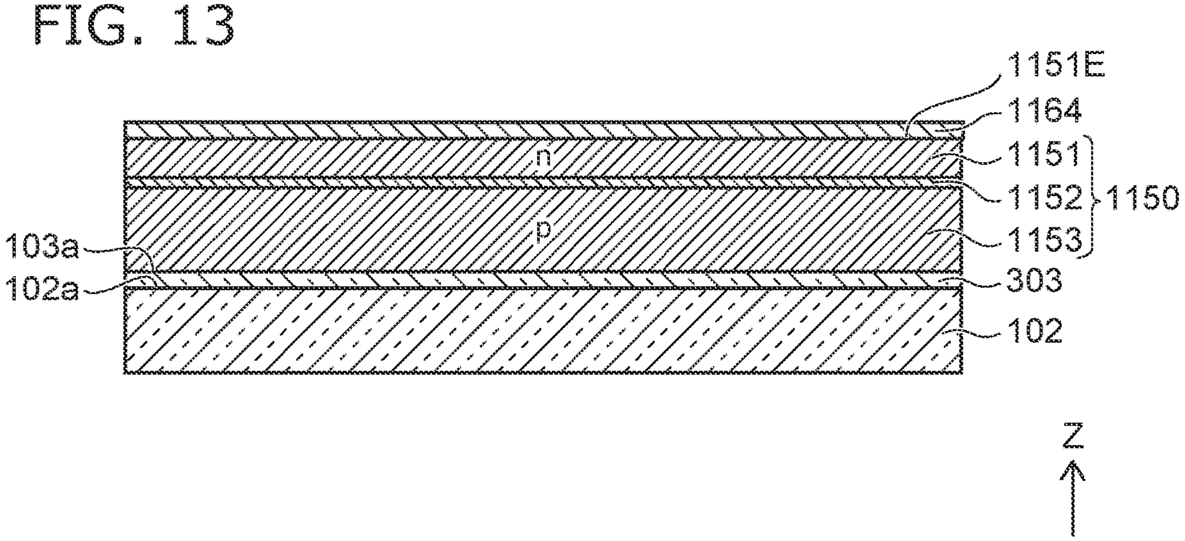
FIG. 13 is a schematic cross-sectional view exemplifying a portion of the manufacturing method of the image display device according to the second embodiment.

FIGS. 12A to 13 are schematic cross-sectional views exemplifying portions of the manufacturing method of the image display device of the present embodiment.

As illustrated in FIG. 12A, in the manufacturing method of the image display device of the present embodiment, the semiconductor growth substrate 1194 is prepared. The semiconductor growth substrate 1194 has already been described in connection with FIG. 4A, but in the present embodiment, a metal layer is not formed on the semiconductor layer 1150.

Subsequently, as illustrated in FIG. 12B, the semiconductor layer 1150 of the semiconductor growth substrate 1194 is bonded to the substrate 102. In this bonding process, the exposed surface 1153E of the p-type semiconductor layer 1153 is bonded to the first surface 103*a*.

Subsequently, the crystal growth substrate 1001 is removed from the semiconductor growth substrate 1194 and, as illustrated in FIG. 13, a metal layer (second metal layer) 1164 is formed on the semiconductor layer 1150 bonded to the first surface 103*a*. The metal layer 1164 is formed on an exposed surface 1151E of the n-type semiconductor layer 1151. As the metal layer 1164, the same material as that of the metal layers 1161, 1162 in the other embodiments described above can be used.

FIG. 14A to FIG. 15B are schematic cross-sectional views exemplifying portions of the manufacturing method of the image display device according to the present embodiment.

In the processes illustrated in FIGS. 14A to 15B, unlike the processes illustrated in FIGS. 12A to 13, the semiconductor layer 1150 is transferred to the support substrate 1190 and subsequently bonded to the substrate 102. The metal layers 1161, 1162 are formed before bonding the semiconductor layer 1150 to the substrate 102.

Figure 14A:
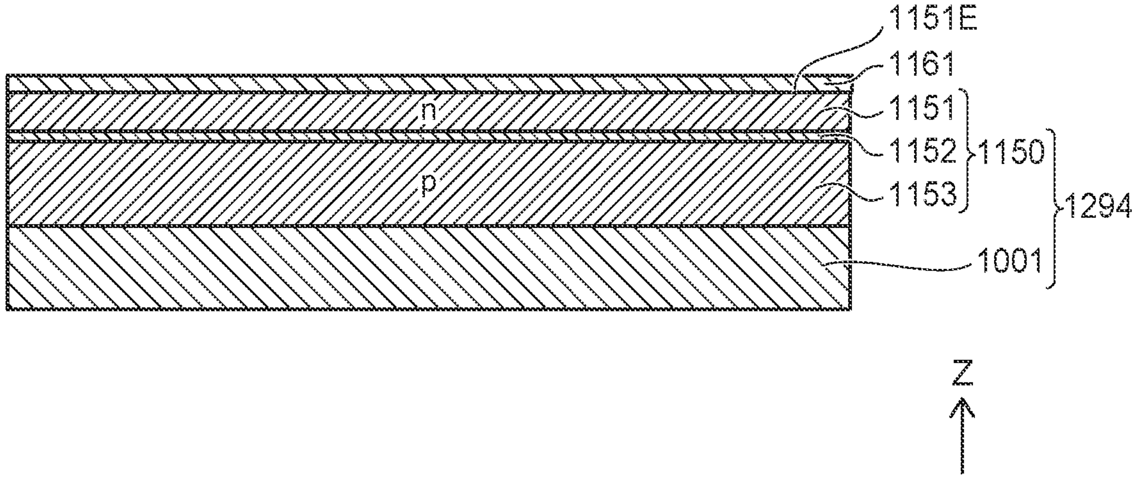
FIG. 14A is a schematic cross-sectional view exemplifying a portion of the manufacturing method of the image display device according to the second embodiment.

As illustrated in FIG. 14A, a semiconductor growth substrate 1294 is prepared. The semiconductor growth substrate 1294 has a configuration different than that of the semiconductor growth substrate 1194 illustrated in FIGS. 4A and 12A. In the semiconductor growth substrate 1294, the semiconductor layer 1150 is layered in the order of the p-type semiconductor layer 1153, the light-emitting layer 1152, and the n-type semiconductor layer 1151 from the crystal growth substrate 1001 side. The metal layer 1161 is formed on the exposed surface 1151E of the n-type semiconductor layer 1151.

Figure 14B:
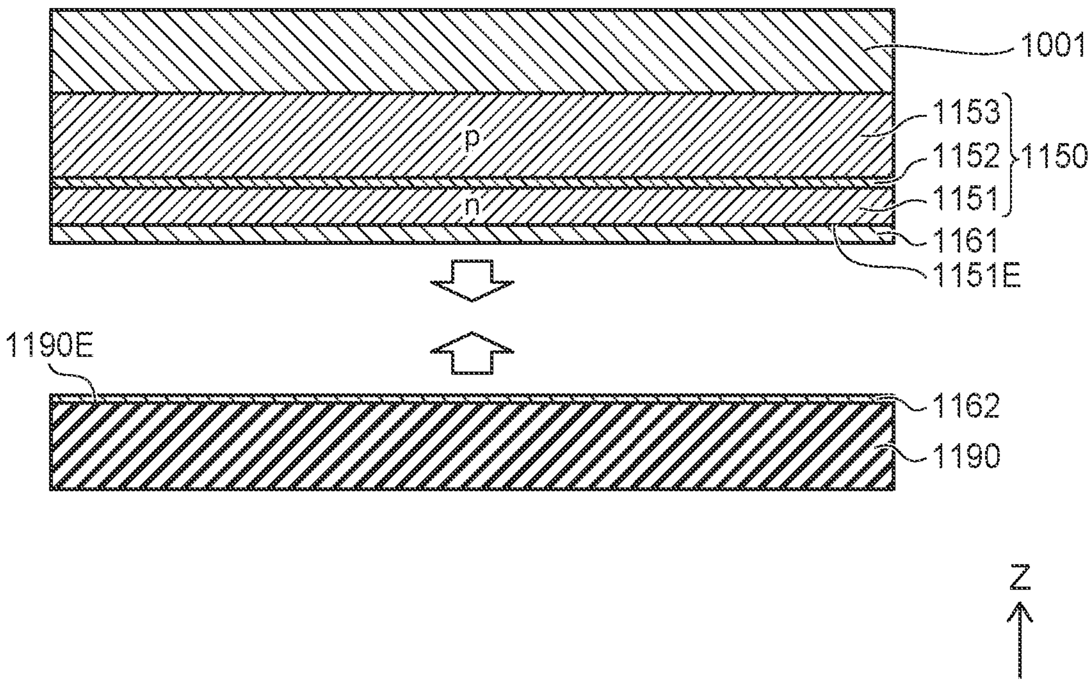
FIG. 14B is a schematic cross-sectional view exemplifying a portion of the manufacturing method of the image display device according to the second embodiment.

Subsequently, as illustrated in FIG. 14B, the support substrate 1190 is prepared. The metal layer 1162 is formed on one surface 1190E of the support substrate 1190. The semiconductor layer 1150 is joined to the support substrate 1190 with the metal layers 1161, 1162 interposed therebetween.

Figure 15A:
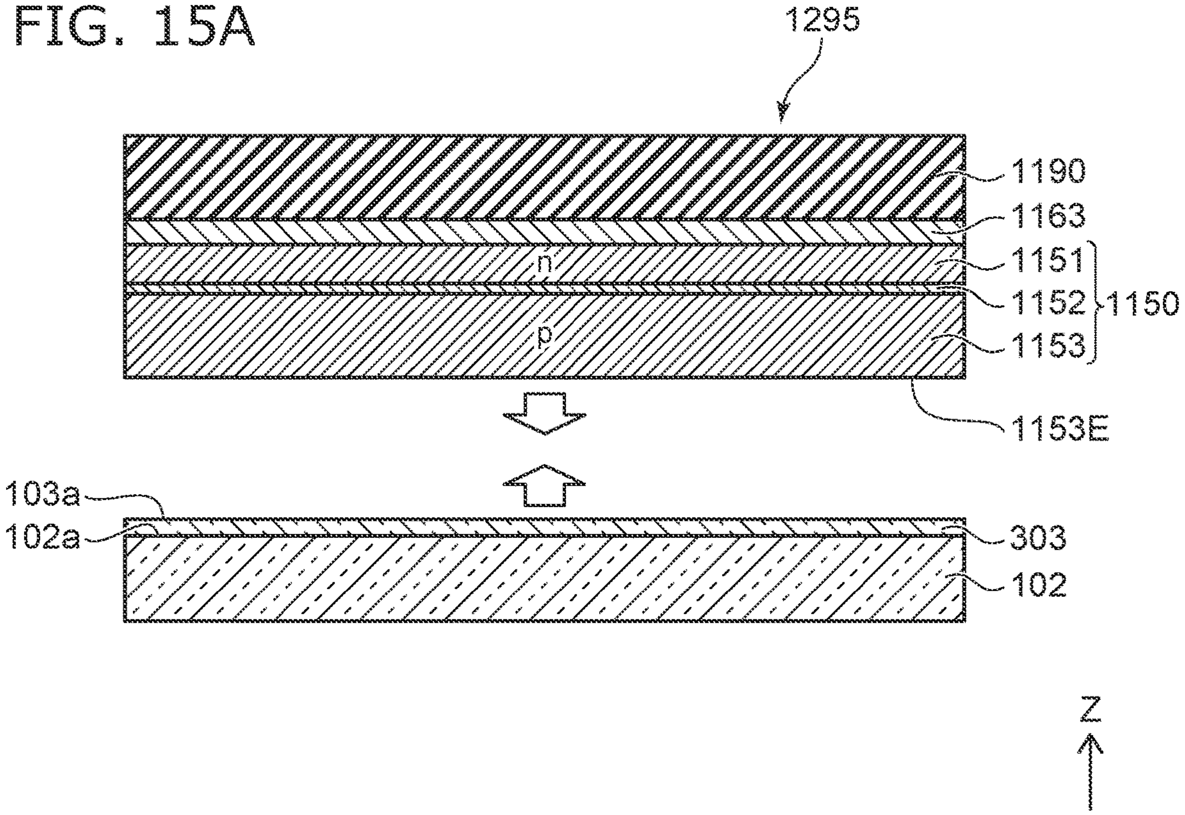
FIG. 15A is a schematic cross-sectional view exemplifying a portion of the manufacturing method of the image display device according to the second embodiment.

Subsequently, the crystal growth substrate 1001 is removed and, as illustrated in FIG. 15A, a substrate 1295 is bonded to the substrate 102. In the substrate 1295, the semiconductor layer 1150 is joined on the support substrate 1190 with the metal layer 1163 interposed therebetween. The surface bonded to the first surface 103*a* is the exposed surface 1153E of the p-type semiconductor layer 1153.

Figure 15B:
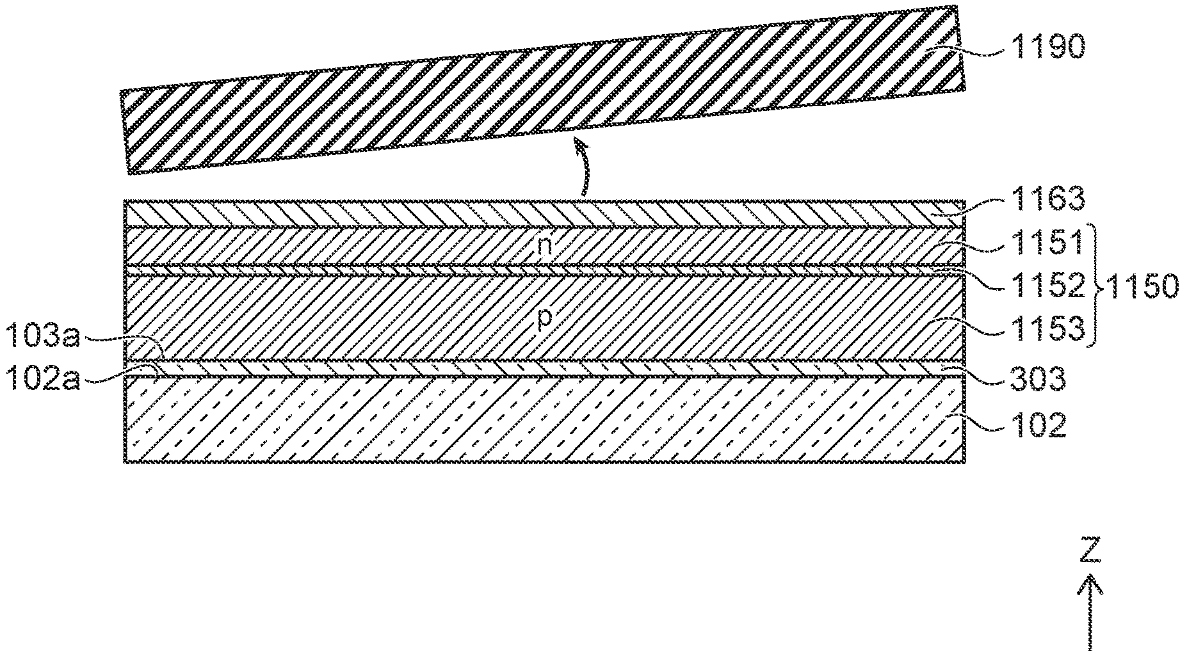
FIG. 15B is a schematic cross-sectional view exemplifying a portion of the manufacturing method of the image display device according to the second embodiment.

As illustrated in FIG. 15B, the support substrate 1190 is removed. To remove the support substrate 1190, wet etching or laser lift-off is used, as in the other embodiment described above. In this way, the p-type semiconductor layer 1153 can be bonded to the substrate 102.

FIGS. 16A to 17B are schematic cross-sectional views exemplifying portions of the manufacturing method of the image display device according to the present embodiment.

Figure 16A:
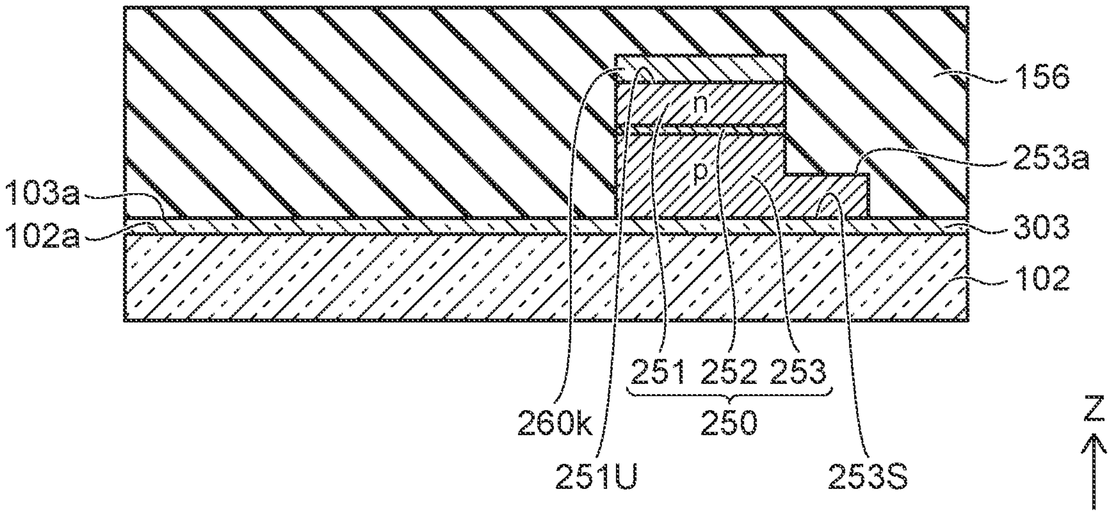
FIG. 16A is a schematic cross-sectional view exemplifying a portion of the manufacturing method of the image display device according to the second embodiment.

As illustrated in FIG. 16A, the metal layers 1163, 1164 illustrated in FIGS. 13 and 15B are processed into desired shapes by etching, forming the light-blocking electrode 260*k*.

The semiconductor layer 1150 illustrated in FIGS. 13 and 15B is processed into a desired shape, forming the light-emitting element 250. In forming the light-emitting element 250, similarly to the other embodiments described above, the connecting portion 253*a* is formed, and other portions are formed.

To form the light-blocking electrode 260*k* and the light-emitting element 250, an etching process similar to that of the other embodiment described above is used.

The first interlayer insulating film 156 covers the first surface 103*a*, the light-emitting element 250, and the light-blocking electrode 260*k*.

Figure 16B:
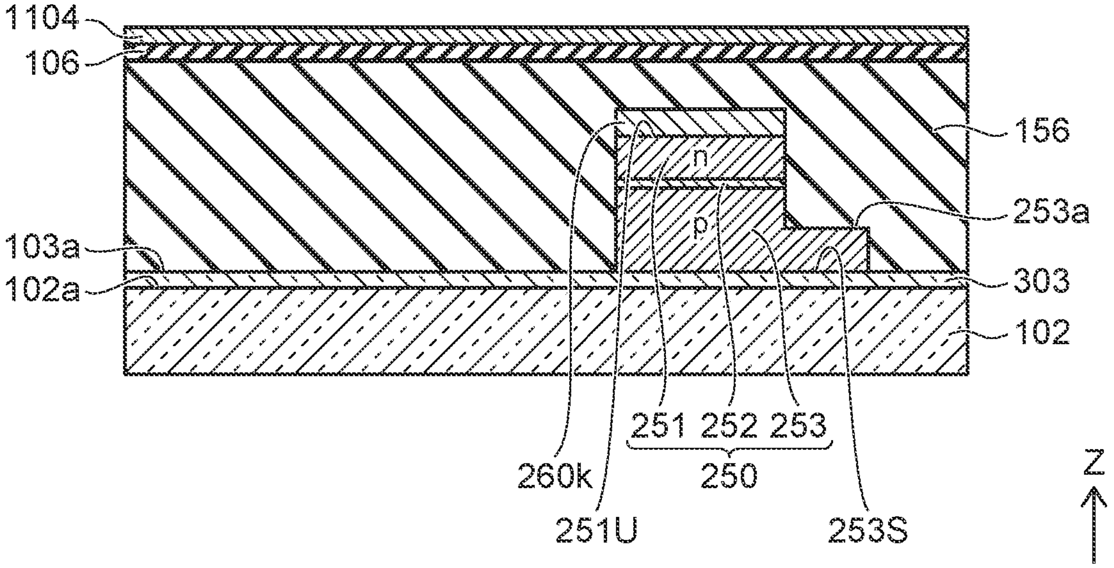
FIG. 16B is a schematic cross-sectional view exemplifying a portion of the manufacturing method of the image display device according to the second embodiment.

As illustrated in FIG. 16B, the TFT lower layer film 106 is formed across the first interlayer insulating film 156. On the TFT lower layer film 106, a layer of amorphous Si is formed, and then the Si layer 1104 polycrystallized by laser annealing using an excimer laser or the like is formed.

Figure 17A:
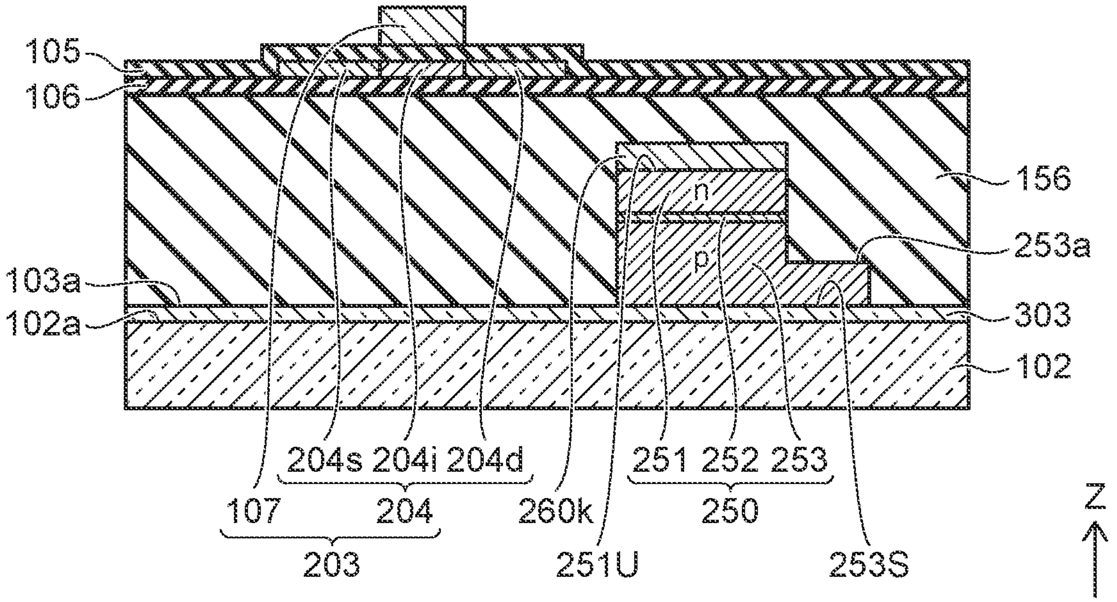
FIG. 17A is a schematic cross-sectional view exemplifying a portion of the manufacturing method of the image display device according to the second embodiment.

As illustrated in FIG. 17A, the polycrystallized Si layer 1104 illustrated in FIG. 16B is processed into an island shape as with the transistor 103 illustrated in FIG. 3, forming the TFT channel 204. The insulating layer 105 covers the TFT lower layer film 106 and the TFT channel 204. On the TFT channel 204, the gate 107 is formed with the insulating layer 105 interposed therebetween. The transistor 203 is formed by selectively doping the gate 107 with and thermally activating an impurity such as $P^-$. The regions 204*s*, 204*d* are n-type active regions, and respectively function as a source region and the drain region of the transistor 203. The region 204*i* is a p-type active region and functions as a channel.

Figure 17B:
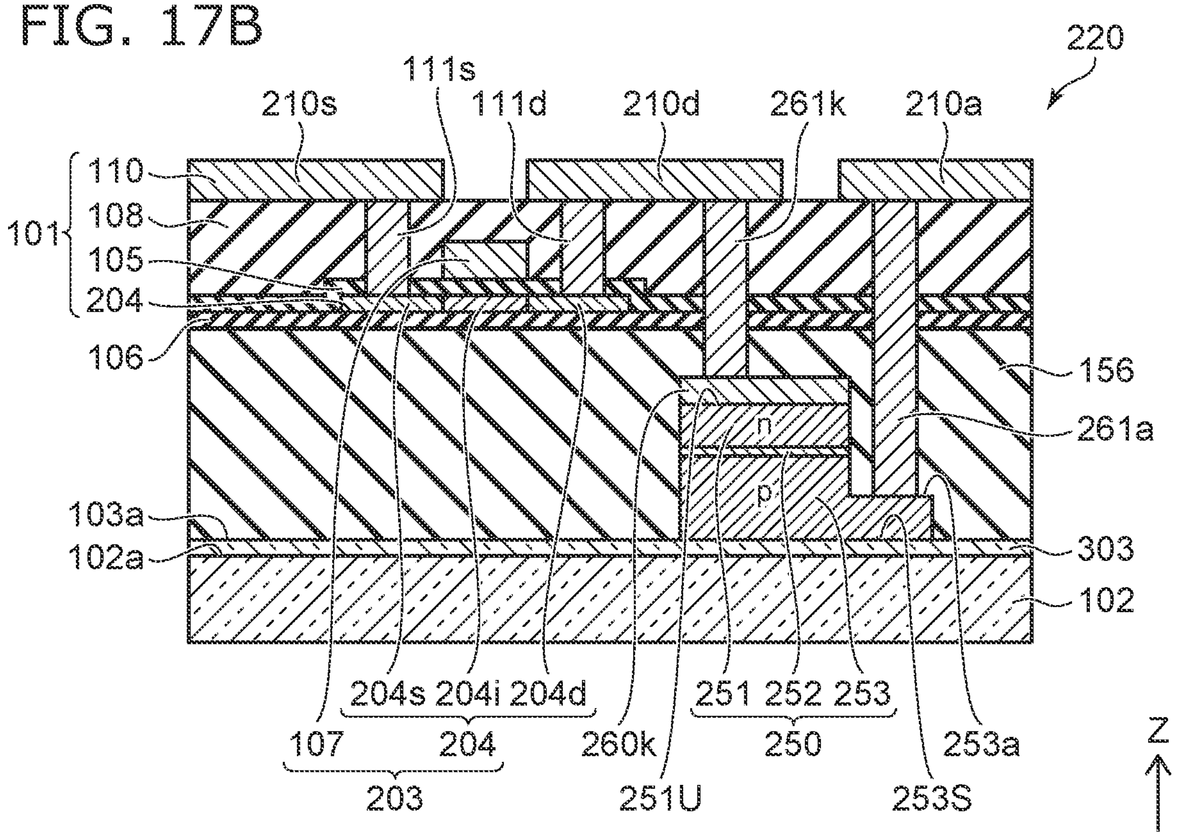
FIG. 17B is a schematic cross-sectional view exemplifying a portion of the manufacturing method of the image display device according to the second embodiment.

As illustrated in FIG. 17B, the second interlayer insulating film 108 covers the insulating layer 105 and the gate 107. The vias 261*k*, 261*a* passes through the second interlayer insulating film 108, the insulating layer 105, the TFT lower layer film 106, and the first interlayer insulating film 156. The via 261*k* reaches the light-blocking electrode 260*k*. The via 261*a* reaches the connecting portion 253*a*.

The vias 111*s*, 111*d* pass through the second interlayer insulating film 108 and the insulating layer 105. The via 111*s* reaches the region 204*s*. The via 111*d* reaches the region 204*d*.

The first wiring layer 110 is formed on the second interlayer insulating film 108. The wiring lines 210*a*, 210*d*, 210*s* are formed. The wiring line 210*a* is connected to one end of the via 261*a*. The wiring line 210*d* is connected to one end of the via 261*k* and one end of the via 111*d*. The wiring line 210*s* is connected to one end of the via 111*s*. The first wiring layer 110 may be formed simultaneously with formation of the vias 261*a*, 261*k*, 111*d*, 111*s*.

In this way, the sub-pixels 220 are formed and the image display device 201 is formed.

Effects of the image display device of the present embodiment will now be described.

In the image display device of the present embodiment, similarly to the other embodiment described above, the time of the transfer process for forming the light-emitting element 250 can be shortened and the number of processes can be reduced. In addition, in the crystal growth process of the semiconductor layer 1150, the transfer to the support substrate 1190 can be made unnecessary in a case in which crystal growth is performed from the n-type semiconductor layer 1151, and thus the number of processes can be reduced.

In the image display device 201 according to the present embodiment, the p-type semiconductor layer 253 can be the light-emitting surface 253S, increasing a degree of freedom in the circuit configuration and improving a design efficiency of the product.

Third Embodiment

Figure 18:
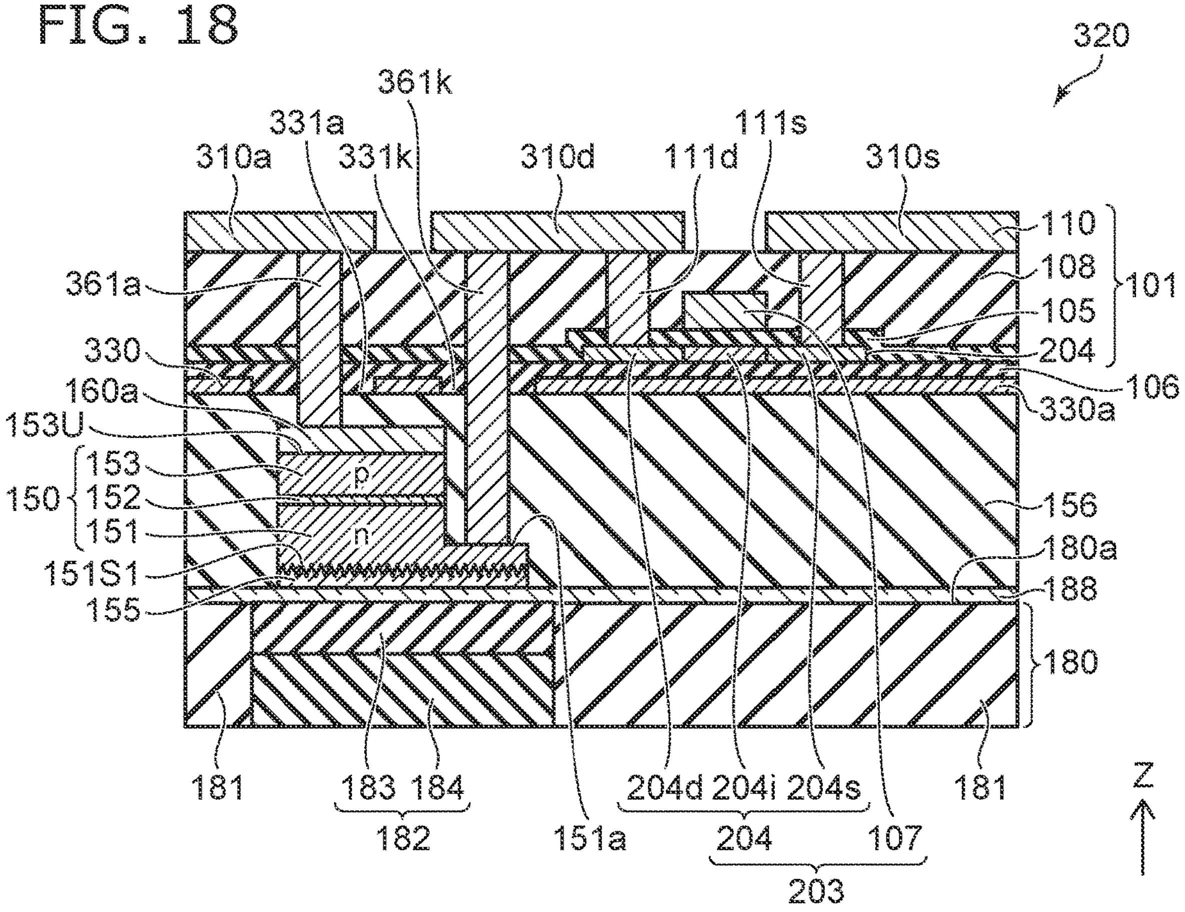
FIG. 18 is a schematic cross-sectional view exemplifying a portion of an image display device according to a third embodiment.

FIG. 18 is a schematic cross-sectional view exemplifying a portion of an image display device according to the present embodiment.

The present embodiment differs from the other embodiments described above in that the light-emitting element 150 with the n-type semiconductor layer 151 as a light-emitting surface 151S1 is driven by the transistor 203 that is an n type. In the present embodiment, a light-blocking layer 330 is included. In the present embodiment, a color filter 180 is mounted on the light-emitting surface 151S1 side. Components that are the same as those of the other embodiments described above are denoted by the same reference signs, and detailed descriptions thereof will be omitted as appropriate.

As illustrated in FIG. 18, a sub-pixel 320 of the image display device of the present embodiment includes the color filter 180, the light-emitting element 150, the light-blocking electrode 160*a*, the first interlayer insulating film 156, the transistor 203, the second interlayer insulating film 108, the light-blocking layer 330, a via 361*a*, and the first wiring layer 110. The transistor 203 is an n-channel TFT. The light-emitting element 150 provides the light-emitting surface 151S1 by the n-type semiconductor layer 151. In the present embodiment, the light-emitting surface 151S1 is roughened.

The color filter 180 includes a light-blocking portion 181 and the color conversion unit 182. In this manner, the color filter (light-transmitting member) 180 includes the color conversion unit 182 having light transmittance, and thus is a member having light transmittance. The color conversion unit 182 is provided directly below the light-emitting surface 151S1 of the light-emitting element 150 in accordance with the shape of the light-emitting surface 151S1. In the color filter 180, a portion other than the color conversion unit 182 is the light-blocking portion 181. The light-blocking portion 181 is a so-called black matrix, and can reduce bleeding caused by the color mixing of light emitted from the adjacent color conversion unit 182 and the like, and thus display a sharp image.

The color conversion unit 182 is one layer or two or more layers. In FIG. 18, a case in which the color conversion unit 182 is two layers is illustrated. Whether the color conversion unit 182 is one layer or two layers is determined by the color, that is, wavelength, of the light emitted by the sub-pixel 320. In a case in which the light emission color of the sub-pixel 320 is red, preferably the color conversion unit 182 is the two layers of a color conversion layer 183 and a filter layer 184 through which red light passes. In a case in which the light emission color of the sub-pixel 320 is green, preferably the color conversion unit 182 is the two layers of the color conversion layer 183 and the filter layer 184 through which green light passes. In a case in which the light emission color of the sub-pixel 320 is blue, one layer is preferred.

In a case in which the color conversion unit 182 is two layers, a first layer is the color conversion layer 183, and a second layer is the filter layer 184. The color conversion layer 183 of the first layer is closer to the light-emitting element 150. The filter layer 184 is layered on the color conversion layer 183.

The color conversion layer 183 converts the wavelength of the light emitted by the light-emitting element 150 to a desired wavelength. In a case in which the sub-pixel 320 emits red light, the color conversion layer 183 converts light having a wavelength of 467 nm±30 nm, which is the wavelength of the light-emitting element 150, to light having a wavelength of about 630 nm±20 nm, for example. In a case in which the sub-pixel 320 emits green light, the color conversion layer 183 converts light having a wavelength of 467 nm±30 nm, which is the wavelength of the light-emitting element 150, to light having a wavelength of about 532 nm±20 nm, for example.

The filter layer 184 blocks the wavelength component of the remaining blue light emission without color conversion by the color conversion layer 183.

In a case in which the color of the light emitted by the sub-pixel 320 is blue, the sub-pixel 320 may output the light via the color conversion layer 183 or may output the light as is and not via the color conversion layer 183. In a case in which the light emitted by the light-emitting element 150 has a wavelength of about 467 nm±30 nm, the sub-pixel 320 may output the light not via the color conversion layer 183. In a case in which the light emitted by the light-emitting element 150 is set to have the wavelength of 410 nm±30 nm, it is preferable to provide the one layer of the color conversion layer 183 in order to convert the wavelength of the light to be output to about 467 nm±30 nm.

Even in the case of the sub-pixel 320 having a blue color, the sub-pixel 320 may include the filter layer 184. With the filter layer 184 through which blue light is transmitted provided to the blue sub-pixel 320, minute reflection of external light other than the blue light generated at a front surface of the light-emitting element 150 is suppressed.

The color filter 180 includes a first surface 180*a*. On the first surface 180*a*, a transparent thin film adhesive layer 188 is provided. The light-emitting element 150 and the first interlayer insulating film 156 are provided on the first surface 180*a* with the transparent thin film adhesive layer 188 interposed therebetween.

In the light-emitting element 150, the light-emitting surface 151S1 is roughened. A transparent flattening film 155 is provided between the light-emitting surface 151S1 and the transparent thin film adhesive layer 188. The transparent flattening film 155 flattens the roughened light-emitting surface 151 S1.

The light-emitting element 150 has a prism shape or a column shape including the light-emitting surface 151S1 and the upper surface 153U. The light-emitting surface 151S1 is in contact with the transparent thin film adhesive layer 188 with the transparent flattening film 155 interposed therebetween. The upper surface 153U is a surface provided on a side opposite to the light-emitting surface 151S1.

The light-emitting element 150 includes the n-type semiconductor layer 151, the light-emitting layer 152, and the p-type semiconductor layer 153. The n-type semiconductor layer 151, the light-emitting layer 152, and the p-type semiconductor layer 153 are layered in this order from the light-emitting surface 151S1 toward the upper surface 153U.

The light-emitting element 150 includes the connecting portion 151*a*. The connecting portion 151*a* protrudes over the first surface 180*a* in one direction from the n-type semiconductor layer 151, with the transparent thin film adhesive layer 188 interposed therebetween. The transparent flattening film 155 is also provided between the connecting portion 151*a* and the transparent thin film adhesive layer 188. The connecting portion 151*a* is an n-type semiconductor layer and is connected to the n-type semiconductor layer 151. The connecting portion 151*a* is the same as that in the other embodiments described above in being connected to one end of a via 361*k* and having the function of connecting, through the via 361*k*, the n-type semiconductor layer 151 to the first wiring layer 110 in an upper layer overlying the light-emitting element 150. The configuration of the light-emitting element 150 is the same as that of the first embodiment described above, except that the light-emitting surface 151S1 is roughened, and thus further detailed description thereof will be omitted.

The light-blocking electrode 160*a* is provided across the upper surface 153U. The light-blocking electrode 160*a* is provided between the upper surface 153U and one end of the via 361*a*. The light-blocking electrode 160*a* is the same as that in the first embodiment in having a function of blocking the scattered light and the like traveling toward the upper surface 153U of the light-emitting element 150, and further detailed description will be omitted.

In the present embodiment, the n-channel transistor 203 is formed on the TFT lower layer film 106. The transistor 203 is a TFT. The configuration and the like are the same as in the second embodiment described above, and thus detailed description thereof will be omitted.

In the present embodiment, the light-blocking layer 330 is provided between the first interlayer insulating film 156 and the second interlayer insulating film 108. In this example, the light-blocking layer 330 is provided on the entire surface of the first interlayer insulating film 156, except for a portion. The light-blocking layer 330 can be formed of any light-blocking material, conductive or not, but is formed, for example, of a metal material with having light reflectivity. The light-blocking layer 330 may be formed of a black resin. When the light-blocking layer 330 is formed of a black resin, the vias can be formed together with the first interlayer insulating film 156 and the like without forming through holes larger than the diameter of the vias in advance.

The vias 361*a*, 361*k* pass through the first interlayer insulating film 156 and the second interlayer insulating film 108, and thus the light-blocking layer 330 is provided with through holes 331*a* and 331*k* having a diameter larger than the diameter of the vias 361*a* and 361*k*. The via 361*a* passes through the through hole 331*a* and the via 361*k* passes through the through hole 331*k*.

The light-blocking layer 330 includes a first portion 330*a*, and the TFT channel 204 is provided on the first portion 330*a*. The first portion 330*a* includes a region including an outer periphery of the TFT channel 204 when the TFT channel 204 is projected onto the first portion 330*a* in XY plan view. Even in a case in which scattered light and the like is emitted upward from the light-emitting element 150 provided below the TFT channel 204, the scattered light and the like is blocked by the first portion 330*a* and cannot substantially reach the TFT channel, and thus malfunction of the transistor 203 can be suppressed by the first portion 330*a*.

The light-blocking layer 330 is desirably provided across the entire surface of the first interlayer insulating film 156 as in this example, from the perspective of light-blocking properties, but the light-blocking layer 330 is not limited to physically being a single member. For example, the light-blocking layer 330 may be separated into a portion directly below the TFT channel 204 and a portion directly above the light-emitting element 150. In this example, the light-blocking layer 330 is not connected to any potential, but may be connected to a specific potential such as a ground potential or a power source potential. When the light-blocking layer 330 includes a plurality of separated portions, all portions may be connected to a common potential, or each portion may be connected to different potential.

The via 111*s* is provided between a wiring line 310*s* and the region 204*s* and allows electrical connection between the wiring line 310*s* and the region 204*s*. The via 111*d* is provided between a wiring line 310$d$ and the region 204$d$ and allows electrical connection between the wiring line 310$d$ and the region 204$d$.

The wiring line 310$s$ is connected to the region 204$s$ through the via 111$s$. The region 204$s$ corresponds to the source region of the transistor 203. Accordingly, the source region of the transistor 203 is electrically connected to the ground line 4 through the via 111$s$ and the wiring line 310$s$.

The wiring line 310$d$ is connected to the region 204$d$ through the via 111$d$. The region 204$d$ is the drain region of the transistor 203.

The via 361$k$ passes through the second interlayer insulating film 108, the insulating layer 105, the TFT lower layer film 106, and the first interlayer insulating film 156. The via 361$k$ is provided between the wiring line 310$d$ and the connecting portion 151$a$, and allows electrical connection between the wiring line 310$d$ and the connecting portion 151$a$. Accordingly, the drain region of the transistor 203 is electrically connected to the n-type semiconductor layer 151 through the via 111$d$, the wiring line 310$d$, the via 361$k$, and the connecting portion 151$a$.

The via 361$a$ passes through the second interlayer insulating film 108, the insulating layer 105, the TFT lower layer film 106, and the first interlayer insulating film 156. The via 361$a$ is provided between the wiring line 310$a$ and the light-blocking electrode 160$a$, and allows electrical connection between the wiring line 310$a$ and the light-blocking electrode 160$a$. Accordingly, the p-type semiconductor layer 153 is electrically connected to the power source line 3 through the light-blocking electrode 160$a$, the via 361$a$, and the wiring line 310$a$.

Figure 19:
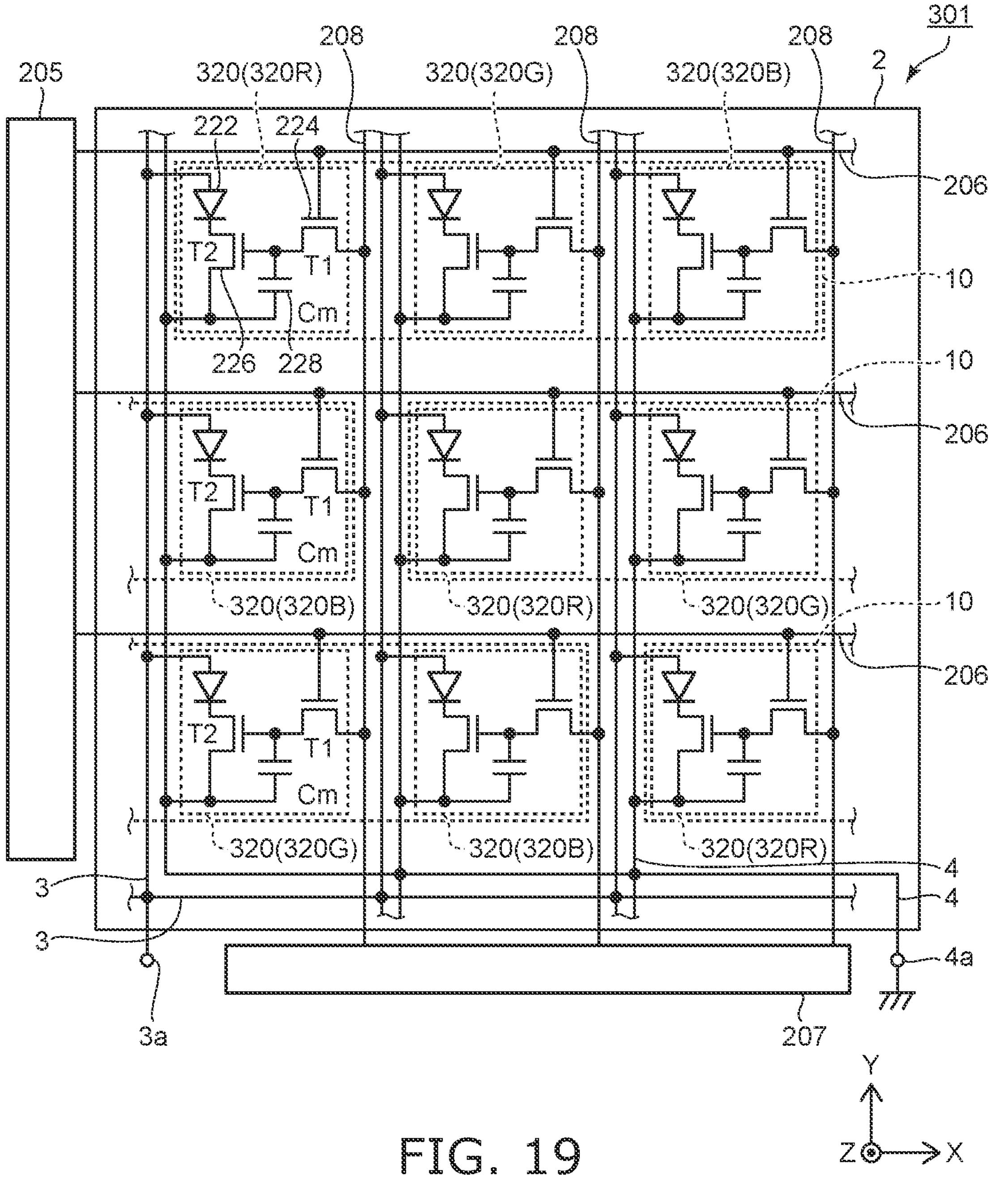
FIG. 19 is a schematic block diagram exemplifying the image display device according to the third embodiment.

FIG. 19 is a schematic block diagram exemplifying the image display device according to the present embodiment.

As illustrated in FIG. 19, in an image display device 301 of the present embodiment, the sub-pixels 320 are arrayed in the display region 2. The sub-pixels 320 are arrayed, for example, in a lattice pattern. For example, n sub-pixels 320 are arrayed along the X axis, and m sub-pixels 320 are arrayed along the Y axis.

The pixel 10 includes a plurality of the sub-pixels 320 that emit different colors of light. A sub-pixel 320R emits red light. A sub-pixel 320G emits green light. A sub-pixel 320B emits blue light. The three types of sub-pixels 320R, 320G, 320B emit light at a desired brightness, and thus the light emission color and brightness of one pixel 10 are determined.

One pixel 10 includes the three sub-pixels 320R, 320G, 320B, and the sub-pixels 320R, 320G, 320B are arrayed in a linear shape on the X axis, for example. In each pixel 10, sub-pixels of the same color may be arrayed in the same column or, as in this example, sub-pixels of different colors may be arrayed on a per column basis.

In the image display device 301 of the present embodiment, the configuration of the power source line 3, the ground line 4, the scanning line 206, and the signal line 208 is the same as that of the second embodiment described above. The image display device 301 differs from that of the second embodiment in that three types of sub-pixels emit light, each at a set brightness, thereby determining the light emission color and brightness of one pixel 10. The circuit configuration is the same as in the example illustrated in FIG. 11 for the second embodiment, except that the configuration of the signals and the like for the above may differ, and thus detailed description thereof will be omitted.

A manufacturing method of the image display device according to the present embodiment will now be described.

FIGS. 20A to 23B are schematic cross-sectional views exemplifying portions of the manufacturing method of the image display device of the present embodiment.

In the manufacturing method of the image display device according to the present embodiment, the processes up to transferring the semiconductor layer to the support substrate and preparing the substrate 1195 illustrated in FIG. 5A are the same as those of the first embodiment described above. Hereinafter, description will be made starting from the process following FIG. 4B in which the substrate 1195 is formed.

Figure 20A:
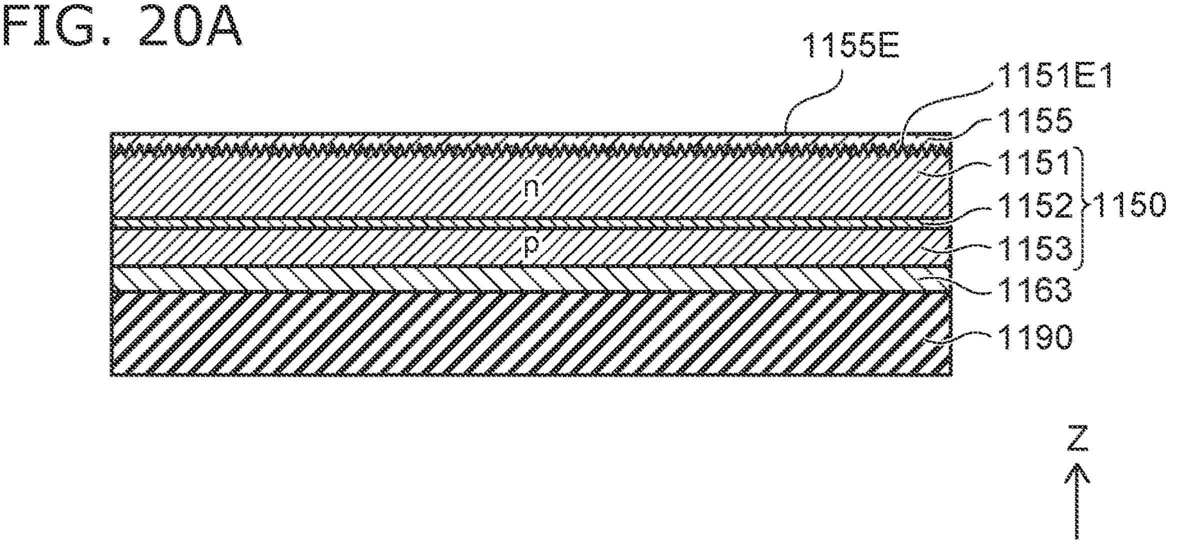
FIG. 20A is a schematic cross-sectional view exemplifying a portion of a manufacturing method of the image display device according to the third embodiment.

As illustrated in FIG. 20A, the crystal growth substrate 1001 illustrated in FIG. 4B is removed to roughen the n-type semiconductor layer 1151 and form the roughened exposed surface 1151E1. A transparent flattening film 1155 is formed across the roughened and exposed surface 1151E1, and an exposed surface 1155E of the transparent flattening film 1155 is flattened. For flattening of the exposed surface 1155E, CMP is used, for example.

Figure 20B:
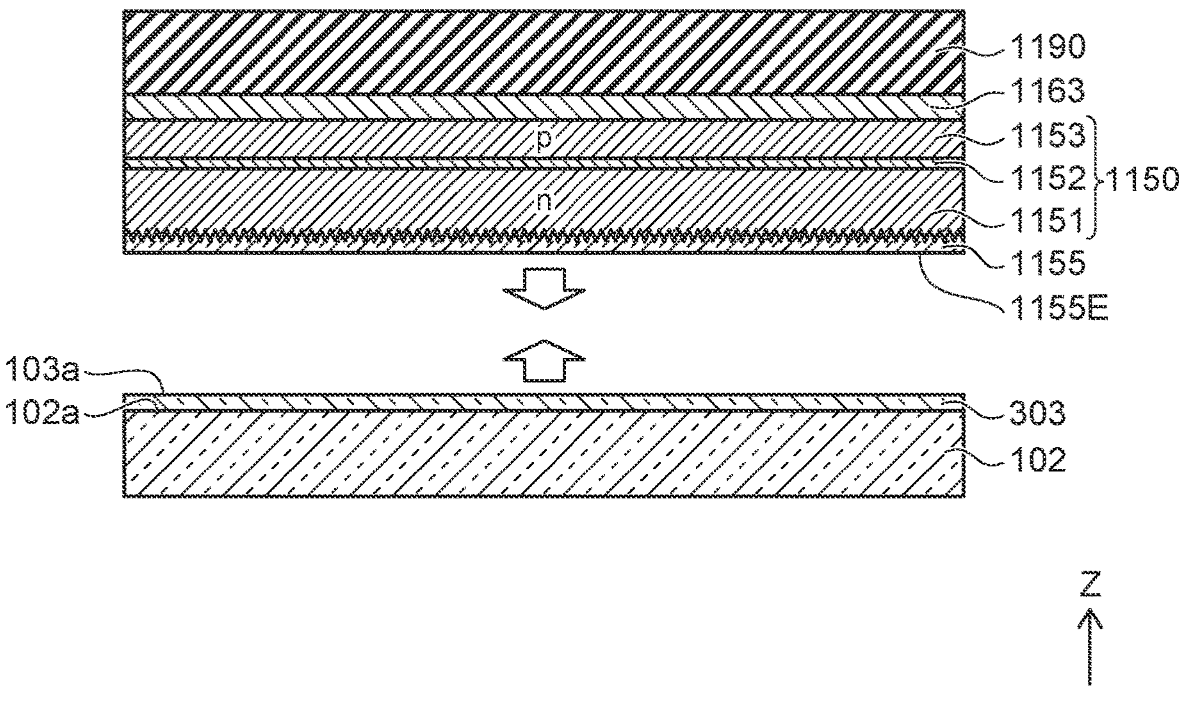
FIG. 20B is a schematic cross-sectional view exemplifying a portion of the manufacturing method of the image display device according to the third embodiment.

As illustrated in FIG. 20B, the semiconductor layer 1150 is bonded to the substrate 102. The bonded surfaces are the exposed surface 1155E of the transparent flattening film 1155 for the semiconductor layer 1150, and the first surface 103$a$ of the bonding layer 303 for the substrate 102.

The above is a description of a process of forming a metal layer on at least one of the semiconductor layer 1150 and the support substrate 1190, transferring the semiconductor layer 1150 to the support substrate 1190 with the metal layer interposed therebetween, and subsequently bonding the semiconductor layer 1150 to the substrate 102. In the second embodiment, as described with reference to FIGS. 12A to 13, the semiconductor layer 1150 may be bonded to the substrate 102 without being transferred to the support substrate 1190, and subsequently the metal layer may be formed on the semiconductor layer 1150.

Figure 21A:
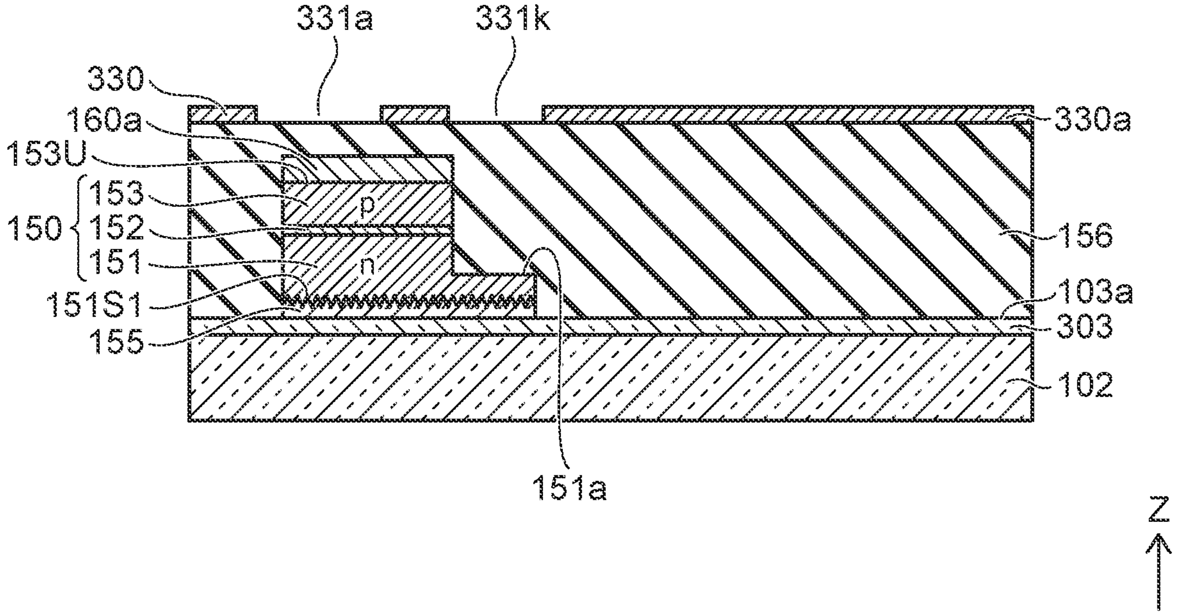
FIG. 21A is a schematic cross-sectional view exemplifying a portion of the manufacturing method of the image display device according to the third embodiment.

As illustrated in FIG. 21A, the metal layer 1163 and the semiconductor layer 1150 illustrated in FIG. 20B are etched into a desired shape, forming the light-blocking electrode 160$a$ and the light-emitting element 150. The process of forming the light-blocking electrode 160$a$ and the light-emitting element 150 is the same as that of the other embodiments described above. For the transparent flattening film 155, the transparent flattening film 1155 before processing, which is illustrated in FIG. 20B, is processed and formed simultaneously with the formation of the light-emitting element 150.

The first interlayer insulating film 156 covers the first surface 103$a$, the light-emitting element 150, and the light-blocking electrode 160$a$. In a case in which the transparent flattening film 155 is exposed on the lateral surface of the light-emitting element 150, the first interlayer insulating film 156 covers the transparent flattening film 155 as well.

The light-blocking layer 330 is formed on the first interlayer insulating film 156. In the process of forming the light-blocking layer 330, the through holes 331$a$, 331$k$ are formed by etching or the like. Portions of the light-blocking layer 330 other than the through holes 331$a$, 331$k$ remain on the first interlayer insulating film 156, and the first portion 330$a$ is provided at a location where the transistor is formed in a subsequent process. In a case in which the light-blocking layer 330 is made of an insulating material such as a black resin, insulation between the light-blocking layer 330 and the vias is not required, and thus the through holes 331$a$, 331$k$ do not need to be formed.

Figure 21B:
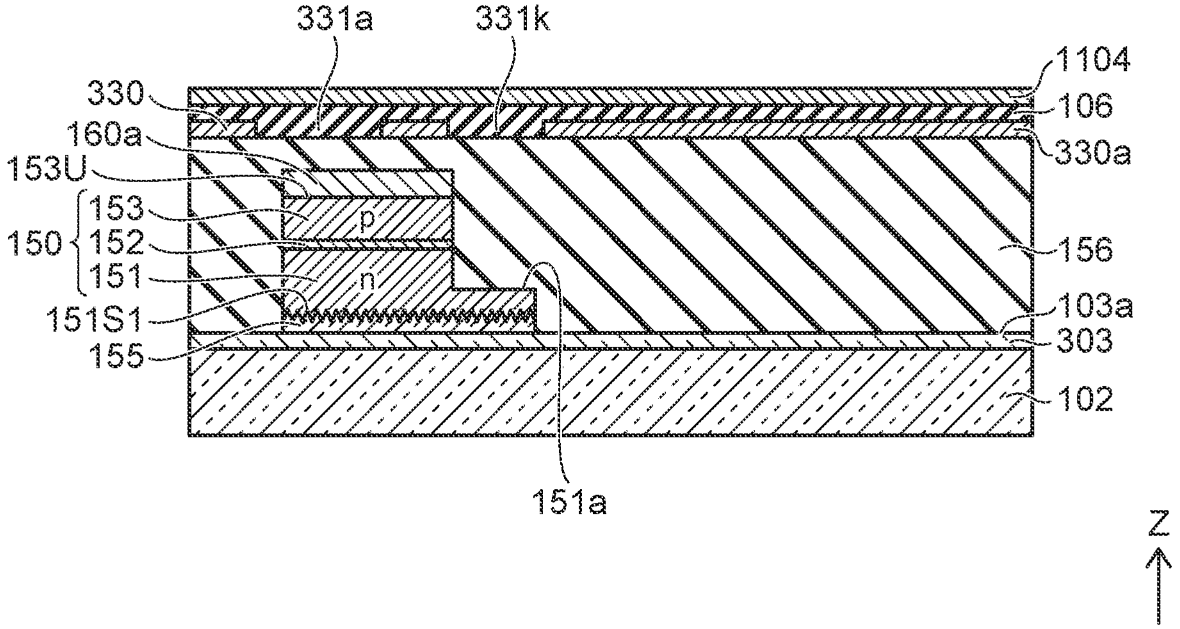
FIG. 21B is a schematic cross-sectional view exemplifying a portion of the manufacturing method of the image display device according to the third embodiment.

As illustrated in FIG. 21B, the TFT lower layer film 106 is formed on the light-blocking layer 330 by CVD or the like. The locations where the through holes 331$a$, 331$k$ are formed are embedded in the TFT lower layer film 106, and a front surface of the TFT lower layer film 106 is flattened. On the flattened TFT lower layer film 106, the polycrystallized Si layer 1104 is formed.

Figure 22A:
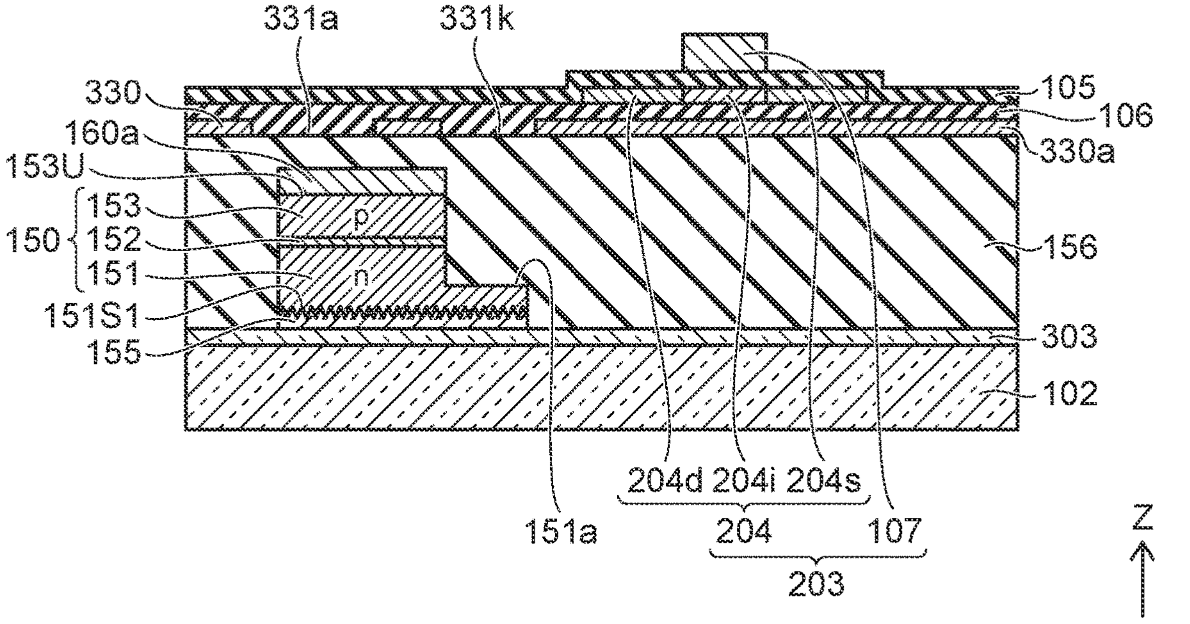
FIG. 22A is a schematic cross-sectional view exemplifying a portion of the manufacturing method of the image display device according to the third embodiment.

As illustrated in FIG. 22A, the Si layer 1104 illustrated in FIG. 21B is processed, and the TFT channel 204 is formed, the insulating layer 105 is formed, the gate 107 is formed, and each region 204*s*, 204*d*, 204*i* of the TFT channel 204 is formed. These manufacturing processes are the same as those of the second embodiment described above. Preferably, an LTPS process is used.

Figure 22B:
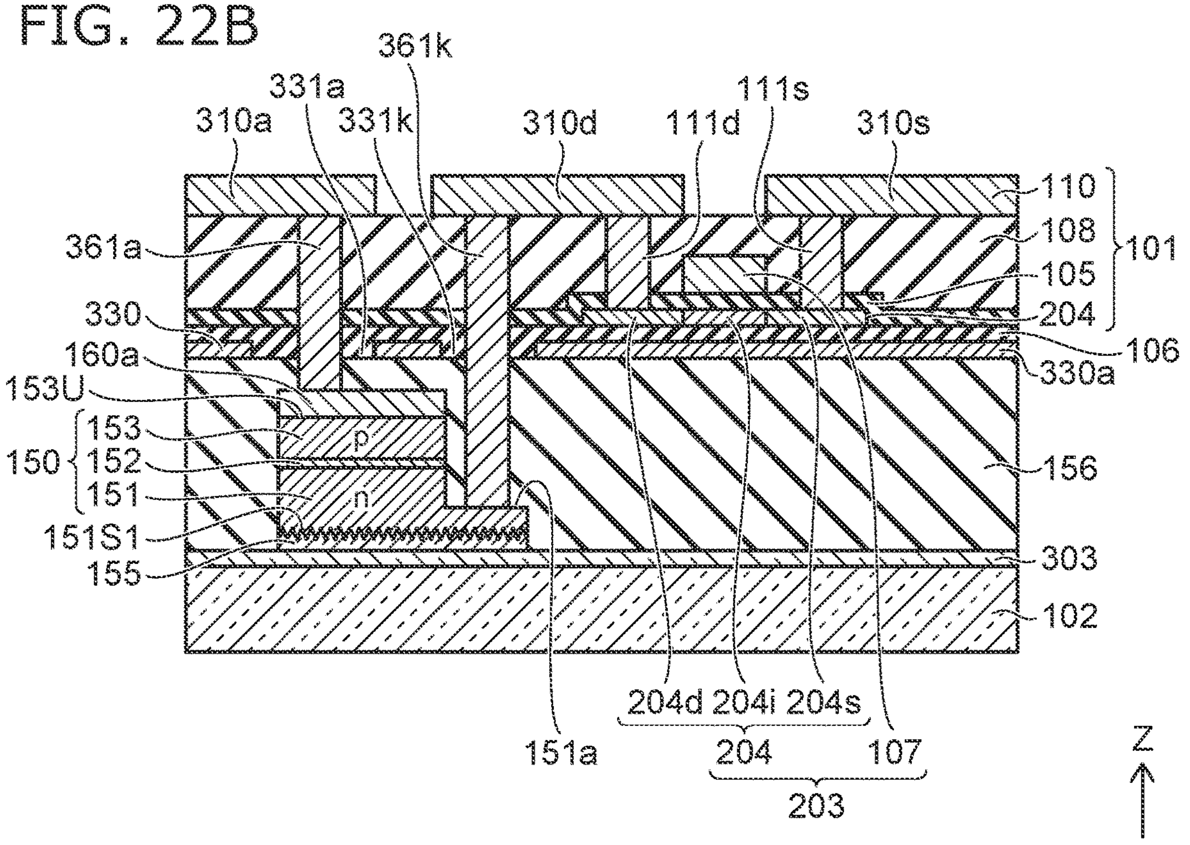
FIG. 22B is a schematic cross-sectional view exemplifying a portion of the manufacturing method of the image display device according to the third embodiment.

As illustrated in FIG. 22B, the vias 111*s*, 111*d*, 361*k*, 361*a* are formed, and the first wiring layer 110 is formed. These manufacturing processes are the same as those of the second embodiment described above.

Figure 23A:
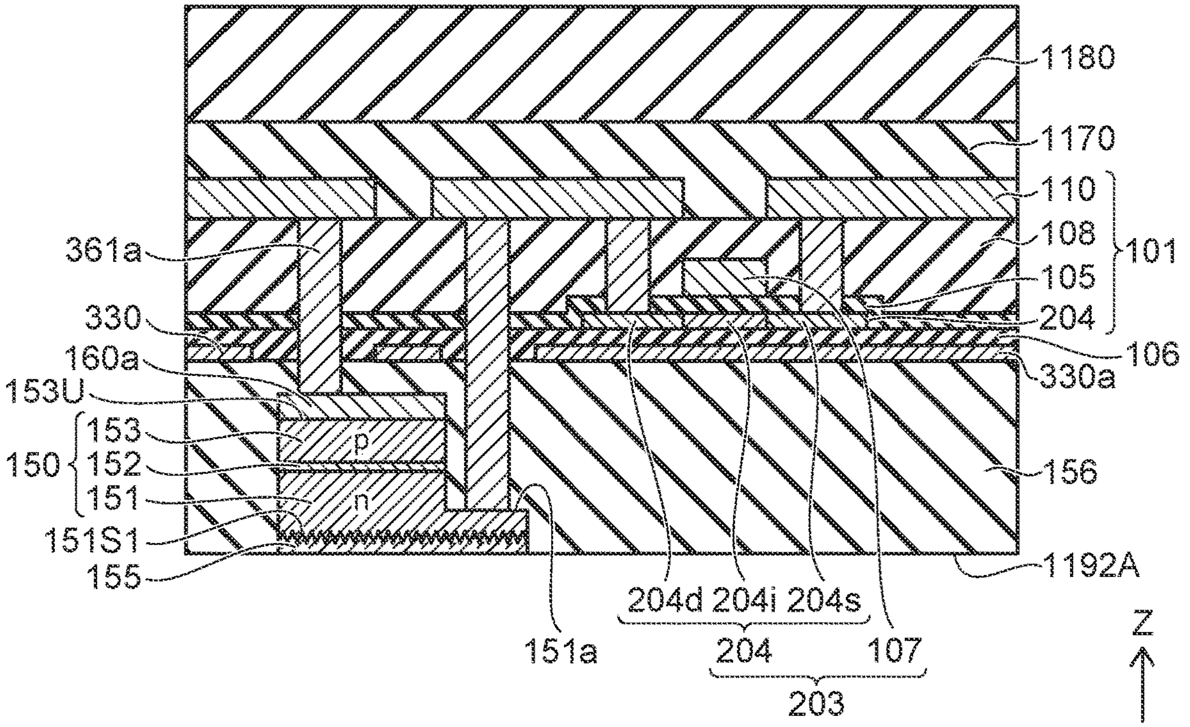
FIG. 23A is a schematic cross-sectional view exemplifying a portion of the manufacturing method of the image display device according to the third embodiment.

As illustrated in FIG. 23A, an adhesive layer 1170 is formed on the second interlayer insulating film 108 and the first wiring layer 110, and then a reinforcing substrate 1180 is adhered to the adhesive layer 1170. Subsequently, the substrate 102 illustrated in FIG. 22B is removed along with the bonding layer 303, exposing a formation surface 1192A of the color filter 180. To remove the substrate 102 and the bonding layer 303, wet etching or laser lift-off is used.

Figure 23B:
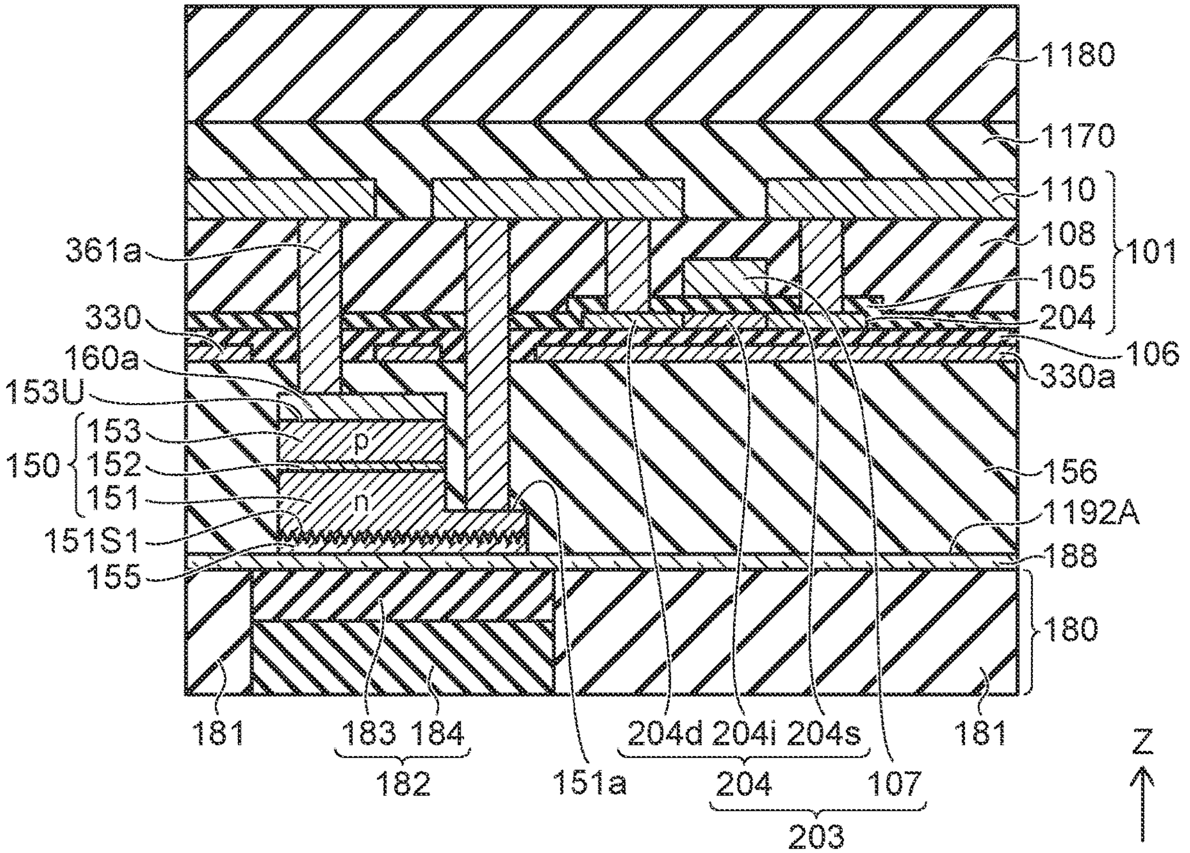
FIG. 23B is a schematic cross-sectional view exemplifying a portion of the manufacturing method of the image display device according to the third embodiment.

As illustrated in FIG. 23B, the color filter (wavelength conversion member) 180 is adhered to the formation surface 1192A with the transparent thin film adhesive layer 188 interposed therebetween.

The purpose of removal of the substrate 102 and the bonding layer 303 is to reduce the transmission loss of light emitted from the light-emitting surface 151S1. Therefore, during removal of the substrate 102 and the bonding layer 303, removal is not limited to removal of these in their entirety, and a portion of the substrate 102 may be removed to form the color filter 180, for example. Removal of a portion of the substrate 102 refers to thinning the substrate 102 by etching or the like.

FIGS. 24A to 24D are schematic cross-sectional views exemplifying portions of the manufacturing method of the image display device of the present embodiment.

FIGS. 24A to 24D illustrate a method of forming the color filter by an inkjet method. This manufacturing process is applied in place of the process illustrated in FIG. 23B described above.

Figure 24A:
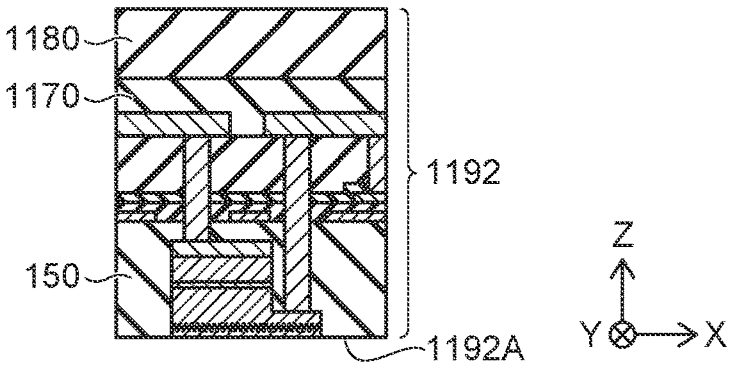
FIG. 24A is a schematic cross-sectional view exemplifying a portion of the manufacturing method of the image display device according to the third embodiment.

As illustrated in FIG. 24A, the substrate 102 and the bonding layer 303 are removed, and a structure 1192 in which the formation surface 1192A is exposed is prepared. As explained in FIG. 23A, the structure 1192 includes the light-emitting element 150, the first interlayer insulating film 156, the light-blocking layer 330, the TFT lower layer film 106, the TFT channel 204, the insulating layer 105, the gate 107, the vias 111*s*, 111*d*, 361*k*, 361*a*, and the first wiring layer 110.

Figure 24B:
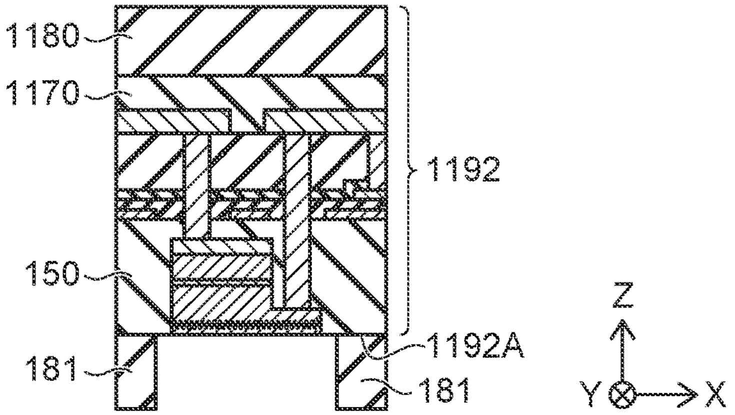
FIG. 24B is a schematic cross-sectional view exemplifying a portion of the manufacturing method of the image display device according to the third embodiment.

As illustrated in FIG. 24B, the light-blocking portion 181 is formed on the formation surface 1192A of the color filter, in a region not including the light-emitting surface 151S1. The light-blocking portion 181 is formed using, for example, screen printing or a photolithography technique.

Figure 24C:
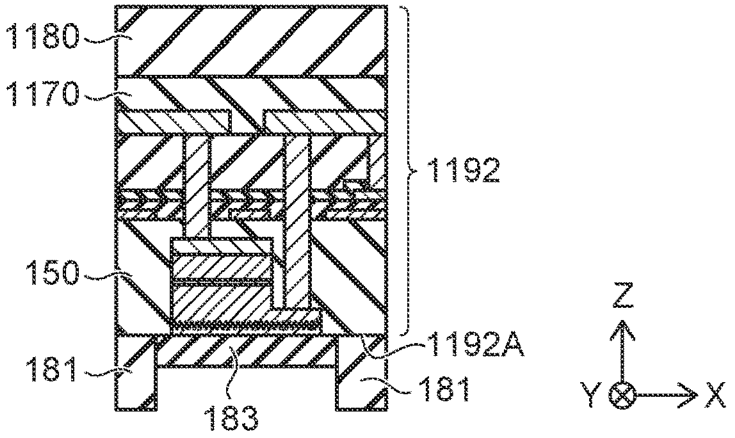
FIG. 24C is a schematic cross-sectional view exemplifying a portion of the manufacturing method of the image display device according to the third embodiment.

As illustrated in FIG. 24C, a phosphor corresponding to the light emission color is ejected from an inkjet nozzle to form the color conversion layer 183. The phosphor colors the region on the formation surface 1192A of the color filter where the light-blocking portion 181 is not formed. As the phosphor, for example, a fluorescent coating that uses a typical phosphor material, a perovskite phosphor material, or a quantum dot phosphor material is used. Use of a perovskite phosphor material or a quantum dot phosphor material makes it possible to realize each light emission color, high chromaticity, and high color reproducibility, and is thus preferred. After the drawing by the inkjet nozzle, drying is performed at an appropriate temperature and for an appropriate time. A thickness of the coating film at the time of coloring is set thinner than a thickness of the light-blocking portion 181.

As already described, in a case in which the color conversion unit is not to be formed for a blue light-emitting sub-pixel, the color conversion layer 183 is not formed. Further, for a blue light-emitting sub-pixel, in a case in which the color conversion unit need only be a single layer when the blue color conversion layer is formed, a thickness of the coating film of the blue phosphor is a layered thickness of the filter layer 184 on the color conversion layer 183 and is preferably about the same as the thickness of the light-blocking portion 181.

Figure 24D:
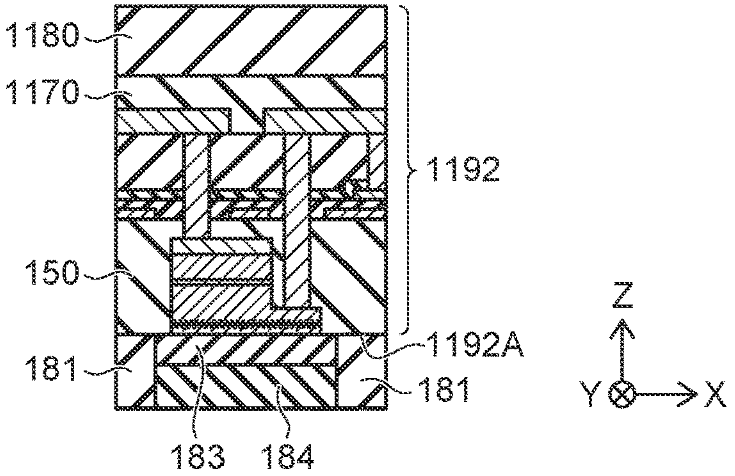
FIG. 24D is a schematic cross-sectional view exemplifying a portion of the manufacturing method of the image display device according to the third embodiment.

As illustrated in FIG. 24D, the coating for the filter layer 184 is ejected from an inkjet nozzle. The coating is applied so as to overlap the coating film of the phosphor. The total thickness of the coating film of the phosphor and the coating is about the same as the thickness of the light-blocking portion 181.

Whether the color filter is a film type or an inkjet type, desirably the color conversion layer 183 is thick to the extent possible in order to improve color conversion efficiency. On the other hand, when the color conversion layer 183 is too thick, the emitted light of the color-converted light is approximated to Lambertian, whereas blue light that is not color converted is limited in emission angle by the light-blocking portion 181. Therefore, a problem arises in that a viewing angle dependency occurs in the display color of the displayed image. To combine the distribution of light of the sub-pixels provided with the color conversion layer 183 with the light distribution of blue light not color converted, a thickness of the color conversion layer 183 is desirably about one-half of an opening size of the light-blocking portion 181.

For example, in the case of a high-definition image display device of about 250 ppi, a pitch of the sub-pixel 20 is about 30 μm, and thus the thickness of the color conversion layer 183 is desirably about 15 μm. Here, in a case in which the color conversion material is formed of phosphor particles having a spherical shape, preferably the material is layered in a closely packed structural shape in order to suppress light leakage from the light-emitting element 150. To that end, at least the layer of particles needs to have three layers. Accordingly, a particle size of the phosphor material constituting the color conversion layer 183 is, for example, preferably about 5 μm or less, and even more preferably about 3 μm or less.

Figure 25:
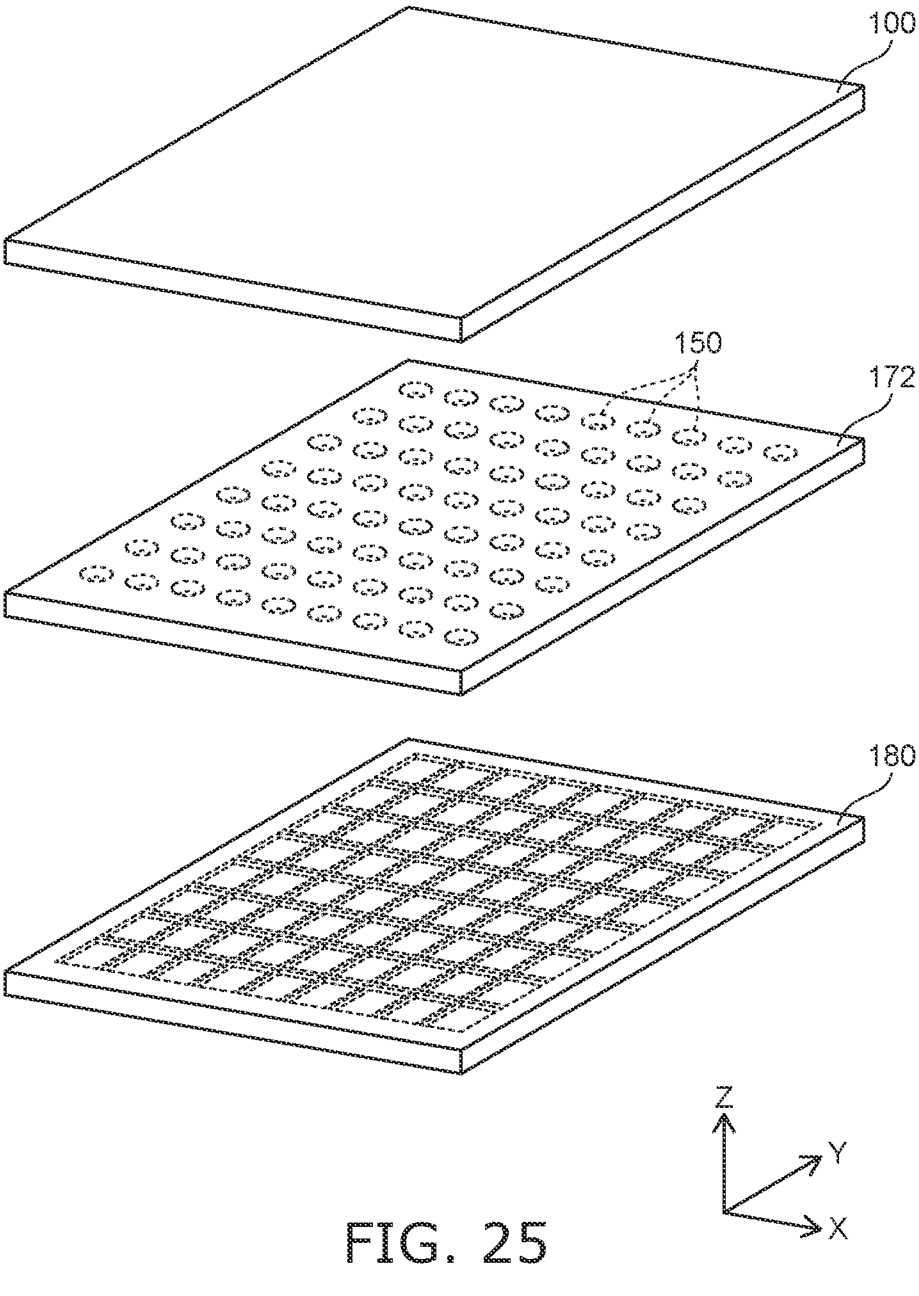
FIG. 25 is a schematic perspective view exemplifying the image display device according to the third embodiment.

FIG. 25 is a schematic perspective view exemplifying the image display device according to the present embodiment.

As illustrated in FIG. 25, the image display device of the present embodiment is provided with the light-emitting circuit portion 172, including a plurality of light-emitting elements 150, on the color filter 180. The drive circuit portion 100 is provided on the light-emitting circuit portion 172. The drive circuit portion 100 is a structure including the circuit 101 illustrated in FIG. 18. As described above, the light-emitting circuit portion 172 and the drive circuit portion 100 are electrically connected by the vias 361*a*, 361*k*.

Although, in the present embodiment, the color filter 180 can make configuration of a full-color image display device 301, as in the other embodiments described above, and the image display device may be configured without a color filter. In this case, for example, the substrate 102 and the bonding layer 303 may not be removed, and the substrate 102 and the bonding layer 303 may remain as they are.

Effects of the image display device 301 of the present embodiment will now be described. According to the manufacturing method of the image display device 301 of the present embodiment, in addition to the effects of making it possible to shorten the time required for the transfer process for forming the light-emitting element 150 and reduce the number of processes as in the other embodiments described above, the light-emitting surface 151S1 is formed of the n-type semiconductor layer 151 having a resistance lower than that of the p-type, making it possible to thickly form the n-type semiconductor layer 151 and sufficiently roughen the light-emitting surface 151S1.

In the image display device 301 of the present embodiment, the emitted light is diffused by roughening the light-emitting surface 151S1, making it possible to use even a small-sized light-emitting element 150 as a light source having a sufficient light-emitting area.

In the image display device 301 of the present embodiment, the light-emitting element 150 including the light-emitting surface 151S1 as the n-type semiconductor layer 151 can be driven by the n-channel transistor 203. This makes it possible to increase the degree of freedom of the circuit configuration and improve the design efficiency.

In the image display device 301 of the present embodiment, the light-blocking layer 330 is provided between the first interlayer insulating film 156 and the second interlayer insulating film 108. That is, the light-blocking layer 330 is provided between the light-emitting element 150 and the transistor 203. Therefore, even when scattered light or the like is emitted upward from the light-emitting element 150, the emitted light is unlikely to reach the TFT channel 204, making it possible to prevent malfunction of the transistor 203.

The light-blocking layer 330 can be formed of a conductive material such as a metal, and can be connected to either potential. For example, a portion of the light-blocking layer 330 can be placed directly below a switching element such as the transistor 203 and connected to a ground potential, a power source potential, or the like, thereby assisting with noise suppression.

The light-blocking layer 330 is not limited in application to that of the present embodiment, and can be applied in common to the sub-pixels of the other embodiments described above and other embodiments described below. When applied to the other embodiments, the same effects as described above can be achieved.

In the example described above, the configuration and the manufacturing method of the light-emitting element including a roughened light-emitting surface has been described. In a light-emitting element including a connecting portion, the roughened light-emitting surface can be applied as in the present embodiment. Specific applications include the light-emitting element 150 in the case of the first embodiment, the light-emitting element 250 in the case of the second embodiment, and a light-emitting element 550 in the case of the fifth embodiment and a semiconductor layer 650 in the case of a sixth embodiment described below. By applying the roughening of the light-emitting surface to the components of these light-emitting elements, a device having the effects described above can be achieved.

Fourth Embodiment

Figure 26:
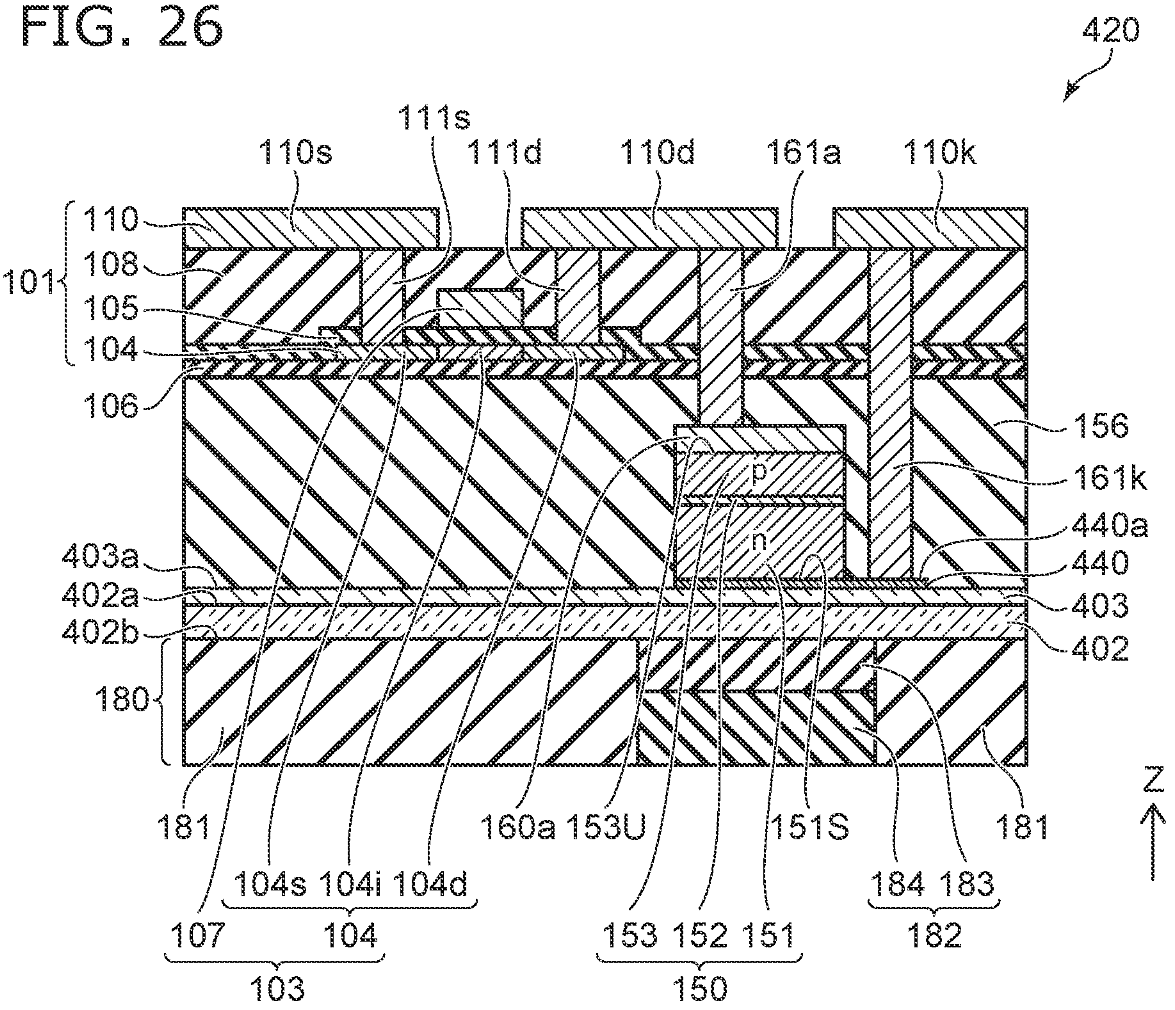
FIG. 26 is a schematic cross-sectional view exemplifying a portion of an image display device according to a fourth embodiment.

FIG. 26 is a schematic cross-sectional view exemplifying a portion of an image display device of the present embodiment.

In the present embodiment, a second wiring layer 440 is included between the light-emitting element 150 and a first surface 403*a*. The second wiring layer 440 is formed of a conductive film having light transmittance, and is electrically connected to the light-emitting element 150. The light-emitting element 150 is connected to the second wiring layer 440 at the light-emitting surface 151S. The present embodiment differs from the other embodiments described above in that a structure including the light-emitting element 150 is formed on a substrate 402 of an organic transparent resin, and the color filter 180 is provided via the substrate 402. In other respects, components that are the same as those of the other embodiments described above are denoted by the same reference signs, and detailed descriptions thereof will be omitted as appropriate.

As illustrated in FIG. 26, a sub-pixel 420 of the image display device of the present embodiment includes the substrate 402, the second wiring layer 440, the light-emitting element 150, the light-blocking electrode 160*a*, the first interlayer insulating film 156, the transistor 103, the second interlayer insulating film 108, the via 161*k*, the first wiring layer 110, and the color filter 180.

The substrate 402 is a light-transmitting member and is a substrate made of a transparent resin. Preferably, as in this example, a layer 403 of a Si compound is formed on one surface 402*a* of the substrate 402. The color filter 180 is provided on the other surface 402*b* (second surface) of the substrate 402. The layer 403 functions as a bonding layer for bonding the semiconductor layer. Of the two surfaces of the layer 403, the surface facing the surface on which the substrate 402 is provided is referred to as a first surface 403*a*.

The second wiring layer 440 is provided on the first surface 403*a*. The second wiring layer 440 includes a wiring line 440*a*. The wiring line 440*a* is provided between the light-emitting element 150 and the first surface 403*a*. The second wiring layer 440 includes a plurality of the wiring lines 440*a* in accordance with the plurality of light-emitting elements 150 and, in this example, the wiring lines 440*a* are separated.

The second wiring layer 440 is formed of a conductive film having light transmittance. The conductive film is, for example, a transparent conductive film, such as ITO or ZnO. The wiring line 440*a* is also formed of the same material.

The second wiring layer 440 and the wiring line 440*a* are in contact with the first surface 403*a*. The light-emitting element 150 is in contact with the wiring line 440*a* at the light-emitting surface 151S, and is electrically connected to the wiring 440*a*. An outer periphery of the wiring line 440*a* includes, in XY plan view, an outer periphery of the light-emitting element 150 when the light-emitting element 150 is projected onto the wiring line 440*a*. The wiring line 440*a* protrudes over the first surface 403*a* in one direction from directly below the light-emitting surface 151S. The region in which the wiring line 440*a* protrudes is connected to one end of the via 161*k*. Accordingly, the n-type semiconductor layer 151 is electrically connected to the ground line 4 of a circuit in FIG. 27 described below, for example, through the wiring line 440*a*, the via 161*k*, and the wiring line 110*k*.

The color filter 180 is provided on the other surface 402*b* of the substrate 402. The color filter 180 is the same as that described in the third embodiment. The color filter 180 may be an adhered film type, or may be formed by an ink-jet method.

Other components are the same as those in the first embodiment, and thus detailed description thereof will be omitted.

Figure 27:
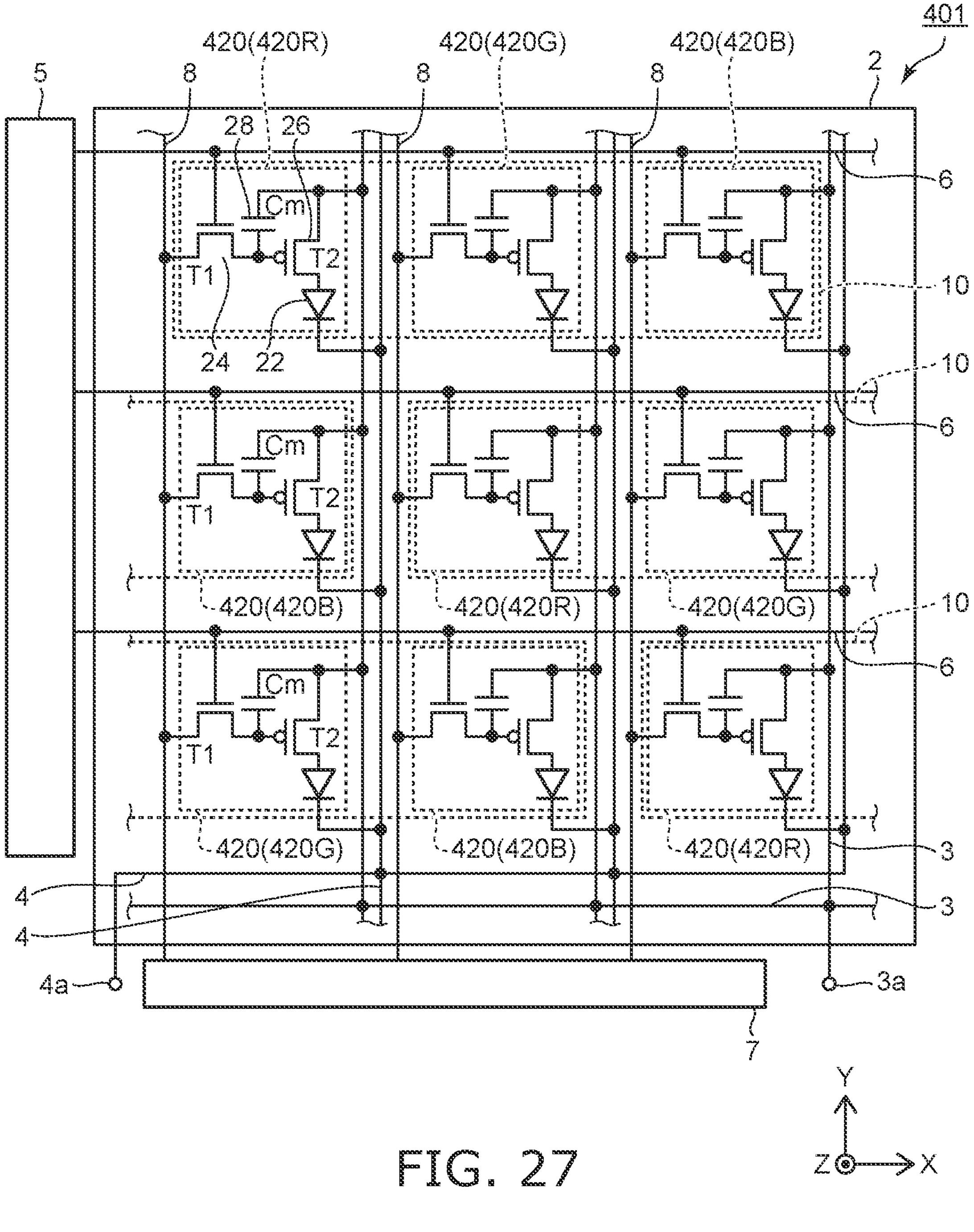
FIG. 27 is a schematic block diagram exemplifying the image display device according to the fourth embodiment.

FIG. 27 is a schematic block diagram exemplifying the image display device according to the present embodiment.

As illustrated in FIG. 27, in an image display device 401 of the present embodiment, the sub-pixels 420 are arrayed in the display region 2. The sub-pixels 420 are arrayed, for example, in a lattice pattern. For example, n sub-pixels 420 are arrayed along the X axis, and m sub-pixels 420 are arrayed along the Y axis.

A pixel 10 includes a plurality of the sub-pixels 420 that emit different colors of light. A sub-pixel 420R emits red light. A sub-pixel 420G emits green light. A sub-pixel 420B emits blue light. The three types of sub-pixels 420R, 420G, 420B emit light at a desired brightness, and thus the light emission color and brightness of one pixel 10 are determined. The arrangement and the like of each color are the same as those in the third embodiment.

In the image display device 401 of the present embodiment, the configuration of the power source line 3, the ground line 4, the scanning line 6, and the signal line 8 is the same as that of the first embodiment described above. The image display device 401 differs from the first embodiment in that three types of sub-pixels emit light, each at a set brightness, thereby determining the light emission color and brightness of one pixel 10. The circuit configuration is the same as in the example illustrated in FIG. 2 for the first embodiment, except that the configuration of the signals and the like for the above may differ, and thus detailed description thereof will be omitted.

A manufacturing method of the image display device according to the present embodiment will now be described.

FIGS. 28A to 31 are schematic cross-sectional views exemplifying portions of the manufacturing method of the image display device of the present embodiment.

In the manufacturing method of the image display device of the present embodiment, the processes described using FIGS. 4A and 4B in the first embodiment are applied, and the following description applies to the processes following those in FIG. 4B.

Figure 28A:
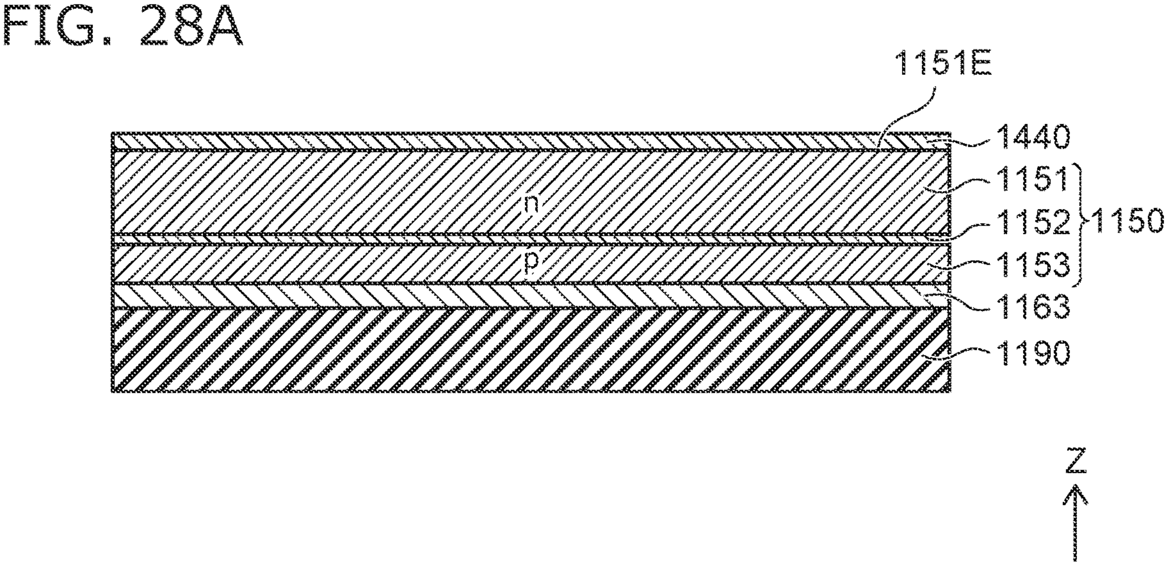
FIG. 28A is a schematic cross-sectional view exemplifying a portion of the manufacturing method of the image display device according to the fourth embodiment.

As illustrated in FIG. 28A, a conductive layer 1440 having light transmittance is formed on the semiconductor layer 1150. The conductive layer 1440 is formed on the exposed surface 1151E of the n-type semiconductor layer 1151.

Figure 28B:
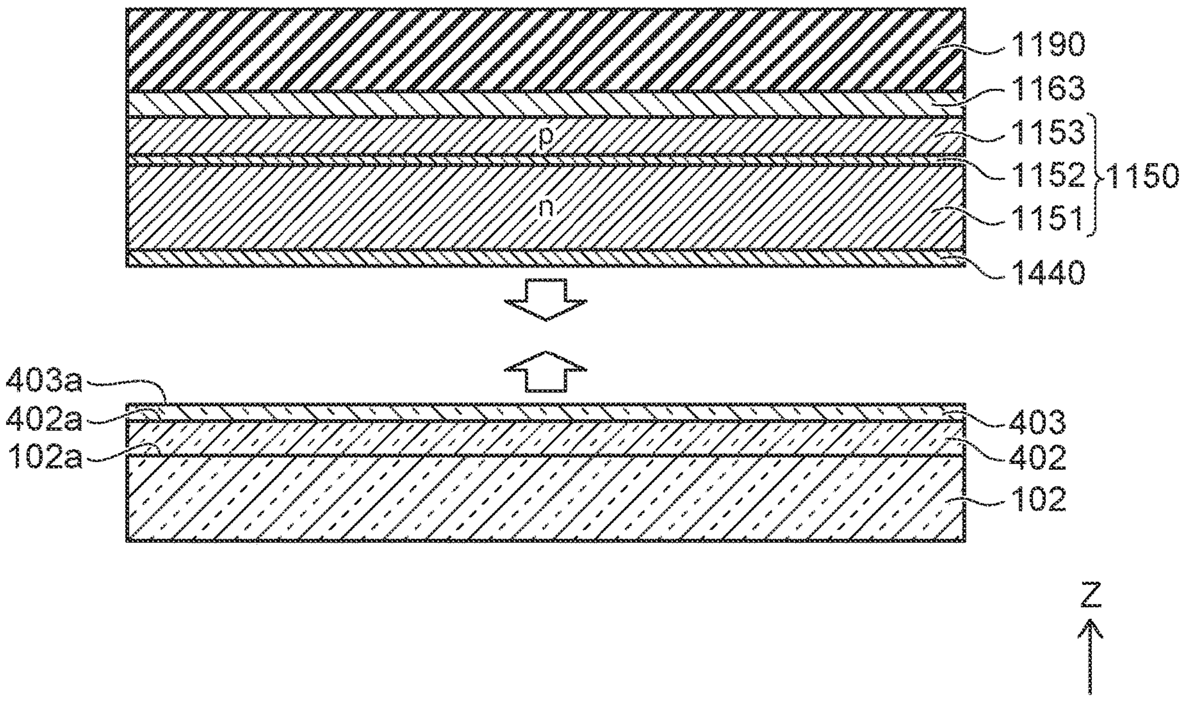
FIG. 28B is a schematic cross-sectional view exemplifying a portion of the manufacturing method of the image display device according to the fourth embodiment.

As illustrated in FIG. 28B, the semiconductor layer 1150 is bonded to the first surface 403*a* with the conductive layer 1440 interposed therebetween.

Figure 29A:
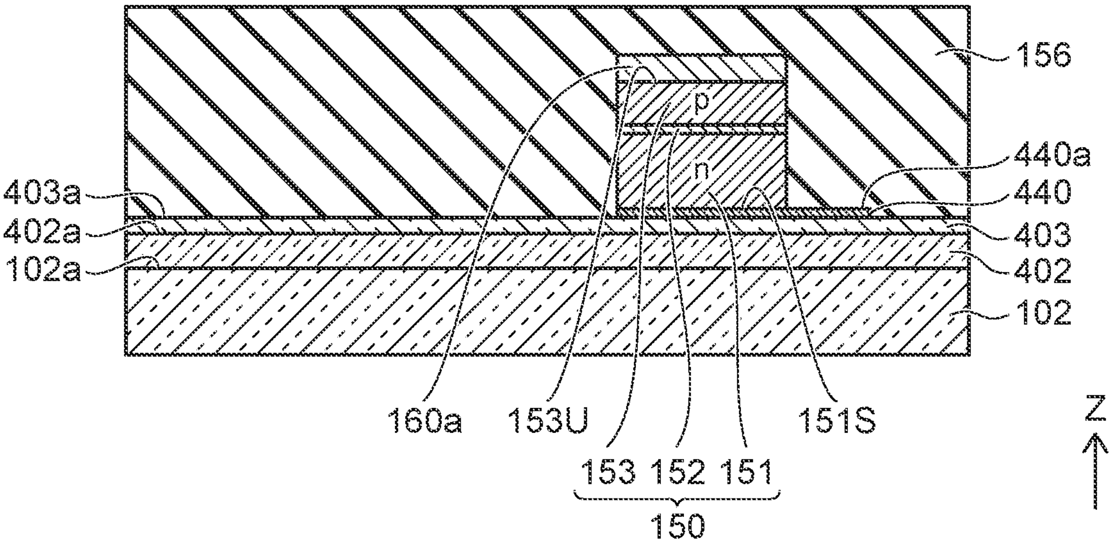
FIG. 29A is a schematic cross-sectional view exemplifying a portion of the manufacturing method of the image display device according to the fourth embodiment.

As illustrated in FIG. 29A, the metal layer 1163 and the semiconductor layer 1150 illustrated in FIG. 28B are respectively processed into a desired shape by etching, respectively forming the light-blocking electrode 160*a* and the light-emitting element 150.

The conductive layer 1440 illustrated in FIG. 28B is processed into a shape including the wiring lines 440*a*, forming the second wiring layer 440. The process of forming the second wiring layer 440 and the wiring line 440*a* may be before or may be after the process of forming the light-blocking electrode 160*a* and the light-emitting element 150.

Subsequently, as in other embodiments, the first interlayer insulating film 156 is formed. The first interlayer insulating film 156 covers the first surface 403*a*, the second wiring layer 440, the light-emitting element 150, and the light-blocking electrode 160*a*.

Figure 29B:
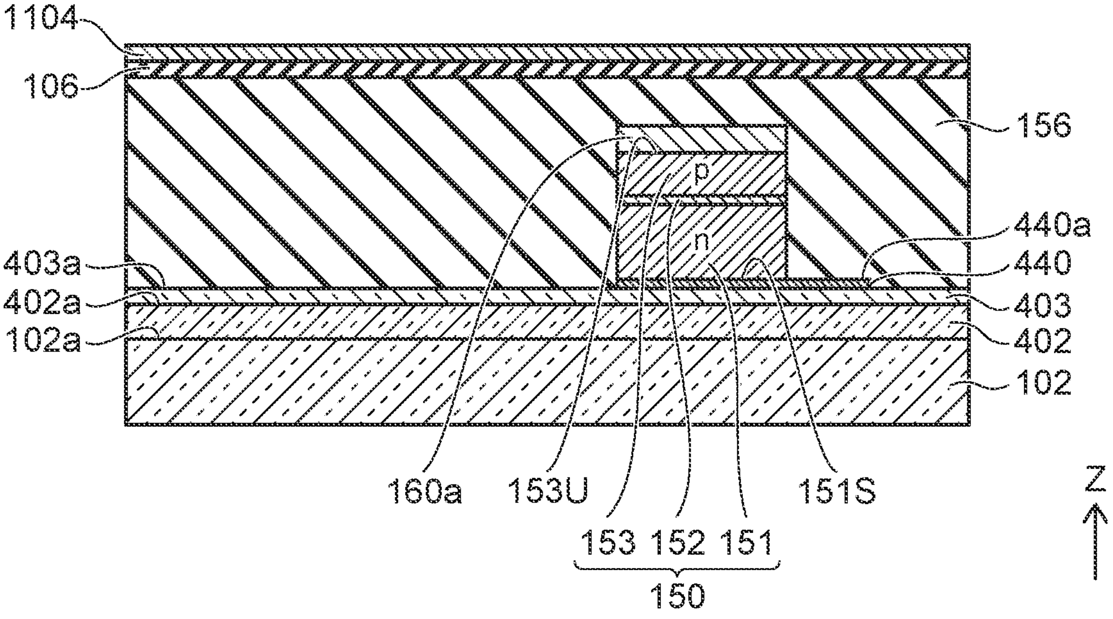
FIG. 29B is a schematic cross-sectional view exemplifying a portion of the manufacturing method of the image display device according to the fourth embodiment.

As illustrated in FIG. 29B, the TFT lower layer film 106 is formed on the first interlayer insulating film 156, and the polycrystallized Si layer 1104 is formed on the TFT lower layer film 106.

Figure 30A:
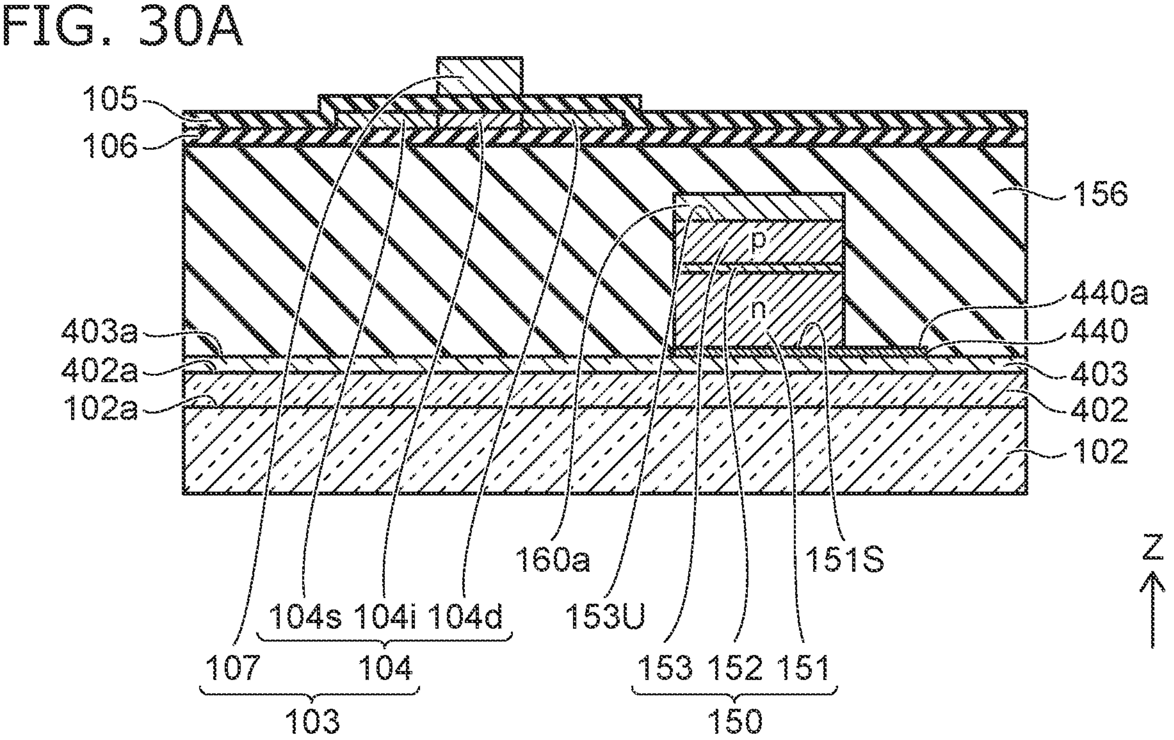
FIG. 30A is a schematic cross-sectional view exemplifying a portion of the manufacturing method of the image display device according to the fourth embodiment.

Subsequently, using an LTPS process or the like, the Si layer 1104 is processed into an island shape and, as illustrated in FIG. 30A, the TFT channel 104, the insulating layer 105, the gate 107, and the regions 104*s*, 104*d*, 104*i* are formed.

Figure 30B:
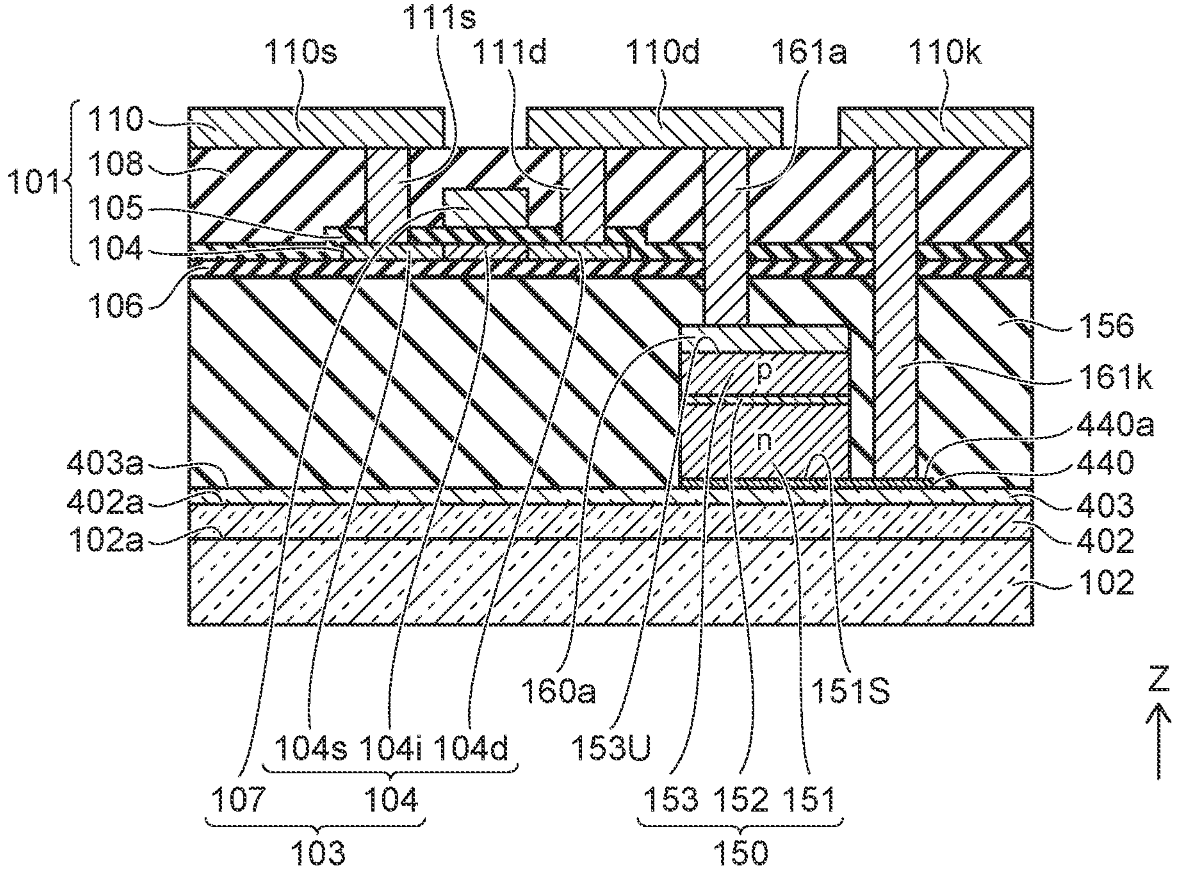
FIG. 30B is a schematic cross-sectional view exemplifying a portion of the manufacturing method of the image display device according to the fourth embodiment.

As illustrated in FIG. 30B, the via 111*s*, 111*d*, 161*a*, 161*k* are formed, and the first wiring layer 110 is formed on the second interlayer insulating film 108. The via (second via) 161*k* is formed by filling a via hole that reaches the wiring line 440*a* with a conductive material. The via 161*k* allows electrical connection between the wiring line 110*k* and the wiring line 440*a*.

As for the details of each manufacturing process in FIGS. 29A to 30B, the techniques already described in the manufacturing methods of the image display devices of the other embodiments can be applied.

Figure 31:
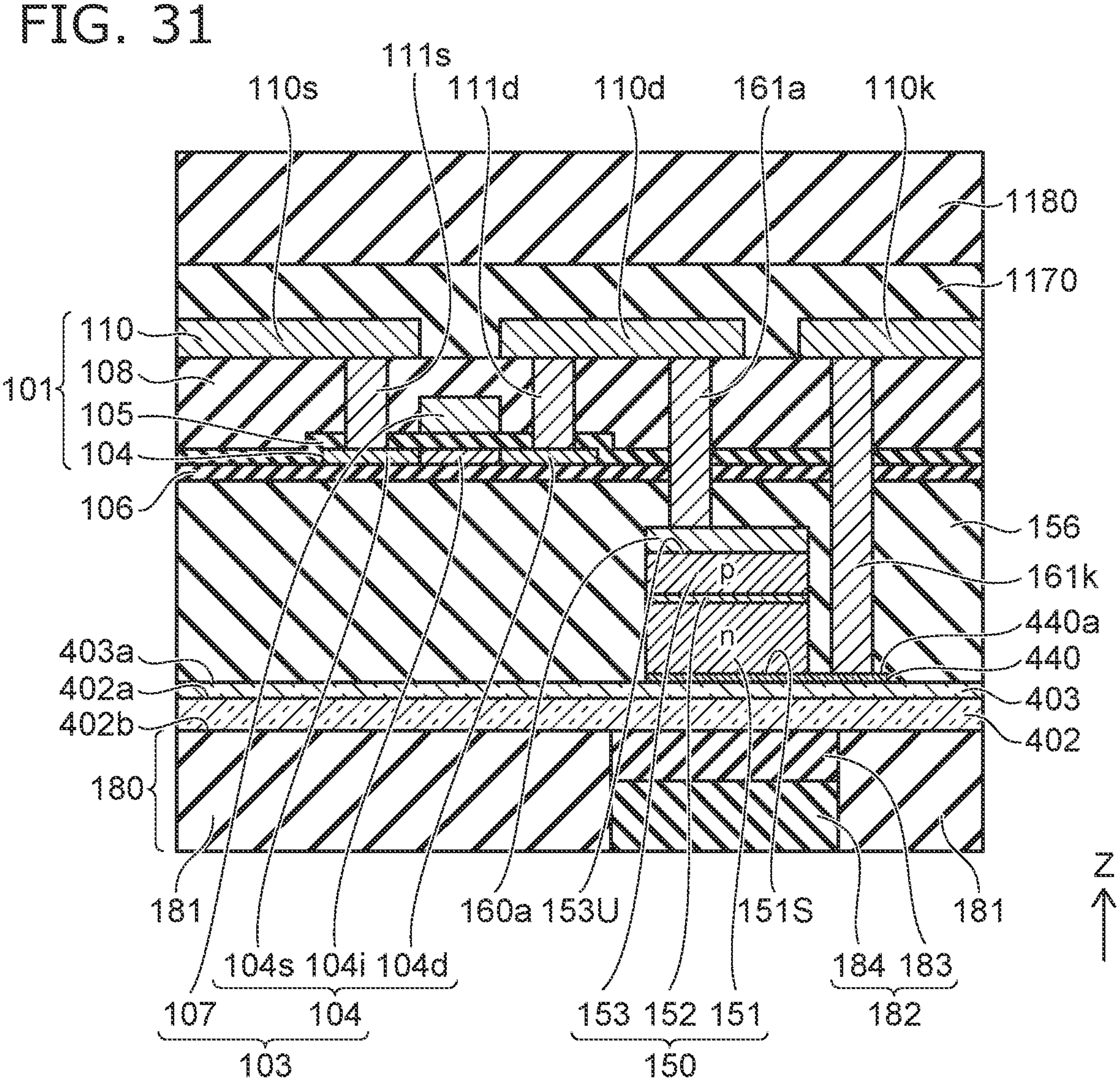
FIG. 31 is a schematic cross-sectional view exemplifying a portion of the manufacturing method of the image display device according to the fourth embodiment.

As illustrated in FIG. 31, the adhesive layer 1170 is provided and, by the adhesive layer 1170, the reinforcing substrate 1180 is adhered on the second interlayer insulating film and the first wiring layer 110. The substrate 102 illustrated in FIG. 30B is removed by using wet etching or laser lift-off. The color filter (wavelength conversion member) 180 is formed on the other surface (second surface) 402*b* of the substrate 402.

In the present embodiment, instead of the substrate 402 of an organic transparent resin, a glass substrate may be thinned or a glass substrate may be fully removed and the color filter 180 may be provided on the surface where the glass substrate was removed, as in the third embodiment.

Effects of the image display device 401 of the present embodiment will now be described. The image display device 401 of the present embodiment, similarly to the other embodiments described above, has the effect of making it possible to shorten the time of the transfer process for forming the light-emitting element 150 and reduce the number of processes.

The second wiring layer 440 and the wiring line 440*a* are formed by a conductive film having light transmittance, such as ITO, facilitating processing and making it possible to shorten the series of manufacturing processes of the light-emitting element 150, the light-blocking electrode 160*a*, and the second wiring layer 440 in some cases.

In the present embodiment, the second wiring layer 440 and the wiring line 440*a* are used to draw electrodes on the light-emitting surface 151S side, making it possible to form a vertical-type light-emitting element 150. The vertical-type light-emitting element 150 has the advantage of making it possible to reduce, in the current flowing through the semiconductor layer, components in a direction along the XY plane, and thus set the current in a direction substantially along the Z axis, thereby reducing losses in the semiconductor layer.

In the present embodiment, the substrate 402 is formed of an organic transparent resin, and thus has flexibility. Therefore, the image display device 401 is bendable and can be attached to a curved surface and utilized in a wearable terminal or the like without discomfort.

In the present embodiment, the image display device includes the color filter 180, but may be configured not to include a color filter as in the other embodiments described above.

Fifth Embodiment

Figure 32:
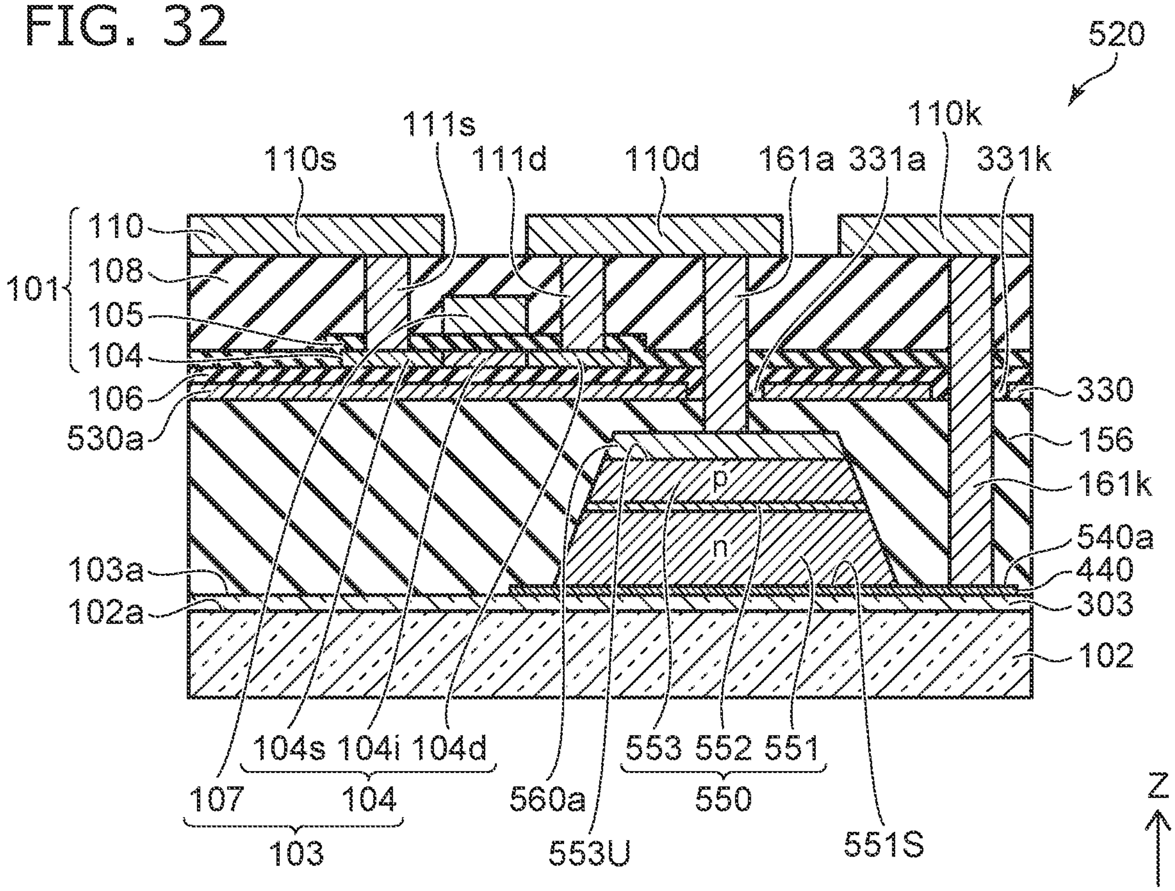
FIG. 32 is a schematic cross-sectional view exemplifying a portion of an image display device according to a fifth embodiment.

FIG. 32 is a schematic cross-sectional view exemplifying a portion of an image display device according to the present embodiment.

In the present embodiment, the configuration of a light-emitting element 550 differs from those of the other embodiments. The other components are the same as those of the other embodiments described above. The same components are denoted by the same reference signs, and detailed description thereof will be omitted as appropriate.

As illustrated in FIG. 32, the second wiring layer 440 includes a wiring line 540*a*. The second wiring layer 440 and the wiring line 540*a* are in contact with the first surface 103*a*. The light-emitting element 550 is in contact with the wiring line 540*a* at a light-emitting surface 551S, and is electrically connected to the wiring line 540*a*. An outer periphery of the wiring line 540*a* includes, in XY plan view, an outer periphery of the light-emitting element 550 when the light-emitting element 550 is projected onto the wiring line 540*a*. The wiring line 540*a* protrudes over the first surface 103*a* in one direction from directly below the light-emitting surface 551S. The region in which the wiring line 540*a* protrudes is connected to one end of the via 161*k*. Accordingly, an n-type semiconductor layer 551 is electrically connected to the ground line 4 of the circuit in FIG. 2 described above, for example, through the wiring line 540*a*, the via 161*k*, and the wiring line 110*k*.

In the present embodiment, the light-blocking layer 330 is provided between the TFT lower layer film 106 and the first interlayer insulating film 156. The light-blocking layer 330 is the same as that described with reference to FIG. 18 in the third embodiment. The light-blocking layer 330 includes a second portion 530*a*. The second portion 530*a* includes, in XY plan view, a region including an outer periphery of the TFT channel 104 when the TFT channel 104 is projected onto the second portion 530*a*.

The light-emitting element 550 is provided on the wiring line 540*a*. The light-emitting element 550 is an element having a truncated pyramid shape or a truncated cone shape, reducing the area in the XY plan view in the positive direction of the Z axis. The light-emitting element 550 includes the light-emitting surface 551S on the first surface 103*a* and an upper surface 553U provided on a side opposite to the light-emitting surface 551S. The light-emitting surface 551S is provided on the first surface 103*a*. The light-emitting element 550 includes the n-type semiconductor layer 551, a light-emitting layer 552, and a p-type semiconductor layer 553. The n-type semiconductor layer 551, the light-emitting layer 552, and the p-type semiconductor layer 553 are layered in this order from the first surface 103*a* side. A light-blocking electrode 560*a* is provided across the upper surface 553U.

Figure 33:
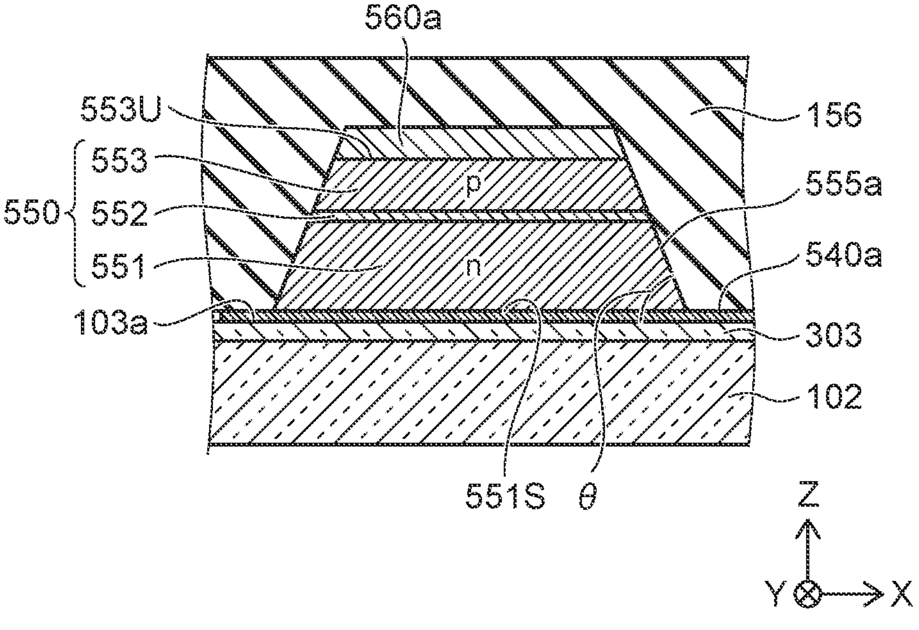
FIG. 33 is a schematic cross-sectional view exemplifying a portion of the image display device according to the fifth embodiment.

FIG. 33 is an enlarged view of a portion of the light-emitting element 550 in FIG. 32, and illustrates a detailed positional relationship between the first surface 103*a* and the light-emitting element 550.

As illustrated in FIG. 33, the first surface 103*a* is a flat surface substantially parallel to the XY plane. The light-emitting element 550 is provided on the first surface 103*a*, and the light-emitting surface 551S is a surface substantially parallel to the first surface 103*a*. The wiring line 540*a* is provided on the first surface 103*a*, and the light-emitting surface 551S is provided on the first surface 103*a* with the wiring line 540*a* interposed therebetween. A thickness of the wiring line 540*a* is sufficiently thin, and thus a reflection and an absorption of light are sufficiently minimal.

The light-emitting element 550 includes a lateral surface 555*a*. The lateral surface 555*a* is a surface between the upper surface 553U and the first surface 103*a*, and is a surface adjacent to the light-emitting surface 551S. An interior angle θ of the angle between the lateral surface 555*a* and the first surface 103*a* is less than 90°. Preferably, the interior angle θ is about 70°. More preferably, the interior angle θ is less than a critical angle at the lateral surface 555*a* determined on the basis of a refractive index of the light-emitting element 550 and a refractive index of the first interlayer insulating film 156. The light-emitting element 550 is covered with the first interlayer insulating film 156, and the lateral surface 555*a* is in contact with the first interlayer insulating film 156.

A critical angle θc of the interior angle θ formed by the lateral surface 555*a* of the light-emitting element 550 and the first surface 103*a* is determined as follows, for example.

Given n0 as the refractive index of the light-emitting element 550 and n1 as the refractive index of the first interlayer insulating film 156, the critical angle θc of the light emitted from the light-emitting element 550 to the first interlayer insulating film 156 is found by using the following equation (1).

$$\theta c = 90° - \sin^{-1}(n1/n0) \quad (1)$$

For example, it is known that the refractive index of a typical transparent organic insulating material, such as acrylic resin, is in a range from about 1.4 to about 1.5. Thus, in a case in which the light-emitting element 550 is formed of GaN and the first interlayer insulating film 156 is formed of a typical transparent organic insulating material, the refractive index n0 of the light-emitting element 550 and the refractive index n of the first interlayer insulating film 156 can be set to 2.5 and 1.4, respectively. These values are then substituted in equation (1), and thus the critical angle θc=56° is obtained.

This indicates that, in a case in which the interior angle θ formed between the first surface 103*a* and the lateral surface 555*a* is set to θc=56°, of the light emitted from the light-emitting layer 552, light parallel to the first surface 103*a* is totally reflected by the lateral surface 555*a*. Further, this indicates that, of the light emitted from the light-emitting layer 552, light having a component in the positive direction of the Z axis is also totally reflected by the lateral surface 555*a*. In the above, for the sake of simplicity, the first interlayer insulating film 156 is a transparent resin. However, even when the transparent resin is changed to a white resin, the effect of the scattering microparticles for the white resin on the refractive index is small, and thus ignored in the above calculation.

On the other hand, of the light emitted from the light-emitting layer 552, light having a component in the negative direction of the Z axis is emitted from the lateral surface 555*a* at an emission angle corresponding to the refractive index at the lateral surface 555*a*. The light incident on the first interlayer insulating film 156 is emitted from the first interlayer insulating film 156 at an angle determined by the refractive index of the first interlayer insulating film 156.

The light totally reflected by the lateral surface 555*a* is reflected again by the light-blocking electrode 560*a* and, of the light reflected again, light having a component in the negative direction of the Z axis is emitted from the light-emitting surface 551S and the lateral surface 555*a*. The light parallel to the first surface 103*a* and the light having a component in the positive direction of the Z axis is totally reflected by the lateral surface 555*a*.

In this way, of the light emitted from the light-emitting layer 552, the light parallel to the first surface 103*a* and the light having a component in the positive direction of the Z axis is converted to light having a component in the negative direction of the Z axis by the lateral surface 555*a* and the light-blocking electrode 560*a*. Accordingly, a proportion of the light emitted from the light-emitting element 550 that travels toward the light-emitting surface 551S is increased, improving the substantial light emission efficiency of the light-emitting element 550.

By setting θ<θc, most of the light having a component parallel to the first surface 103*a* can totally be reflected in the light-emitting element 550. When the refractive index of the first interlayer insulating film 156 is set to n=1.4, the critical angle θc is about 56°, and thus the set interior angle θ is more preferably set to 45° or 30° or the like. Further, the critical angle θc is less in materials having a greater refractive index n. However, even when the interior angle θ is set to about 70°, most of the light having a component in the negative direction of the Z axis can be converted to light having a component in the positive direction of the Z axis, and thus, for example, the interior angle θ may be set to 80° or less in consideration of manufacturing variations and the like.

A manufacturing method of the image display device according to the present embodiment will now be described.

In the present embodiment, the manufacturing processes for the light-emitting element 550 and the light-blocking electrode 560*a* differ from those of the other embodiments, and these other manufacturing processes can be applied to the other embodiments described above. The following is a description of the portion of manufacturing processes that differs from those of the other embodiments.

In the present embodiment, the following processes are executed to form the shape of the light-emitting element 550 illustrated in FIG. 32.

The semiconductor layer 1150 illustrated in FIG. 28B is bonded to the first surface 103*a* and subsequently processed by etching into the shape of the light-emitting element 550 illustrated in FIG. 32. In the formation of the light-emitting element 550, an etching rate is selected so that the lateral surface 555*a* illustrated in FIG. 33 forms the interior angle θ with respect to the surface of the first surface 103*a*. For example, a higher etching rate is selected as a distance to the upper surface 553U decreases. Preferably, the etching rate is configured to increase linearly from the side of the light-emitting surface 551S toward the side of the upper surface 553U.

Specifically, for example, a resist mask pattern at the time of dry etching is devised during exposure so that the pattern gradually thins toward an end portion thereof. This allows the amount of etching to gradually recede from the thin portion of the resist during dry etching, increasing the amount of etching from the light-emitting surface 551S toward the upper surface 553U side. In this way, the lateral surface 555*a* of the light-emitting element 550 forms a constant angle with respect to the first surface 103*a*. Therefore, in the light-emitting element 550, the area of each layer from the upper surface 553U in XY plan view is formed so that the areas of the p-type semiconductor layer 553, the light-emitting layer 552, and the n-type semiconductor layer 551 increase in that order.

Subsequently, a sub-pixel 520 is formed as in the other embodiments.

Effects of the image display device of the present embodiment will now be described.

The image display device of the present embodiment, in addition to the effect of making it possible to shorten the time of the transfer process for forming the light-emitting element 550 and reduce the number of processes as in the image display devices of the other embodiments described above, achieves the following effects.

In the image display device of the present embodiment, the light-emitting element 550 includes the lateral surface 555*a* that forms the interior angle θ with respect to the first surface 103*a* provided with the light-emitting element 550. The interior angle θ is less than 90° and is set on the basis of the critical angle θc determined by the refractive indices of the respective materials of the light-emitting element 550 and the first interlayer insulating film 156. The interior angle θ allows conversion of, of the light emitted from the light-emitting layer 552, light traveling laterally and upwardly of the light-emitting element 550 to light traveling toward the light-emitting surface 551S side to emit the light. With the interior angle θ set sufficiently small, the substantial light emission efficiency in the light-emitting element 550 is improved.

In the present embodiment, the light-emitting element 550 is a vertical element and connected to the via 161*k* by using the second wiring layer 440. The connection is not limited thereto, and the light-emitting element may be provided with a connecting portion formed on the first surface 103*a*, and connected to the via 161*k* through the connecting portion.

Sixth Embodiment

Figure 34:
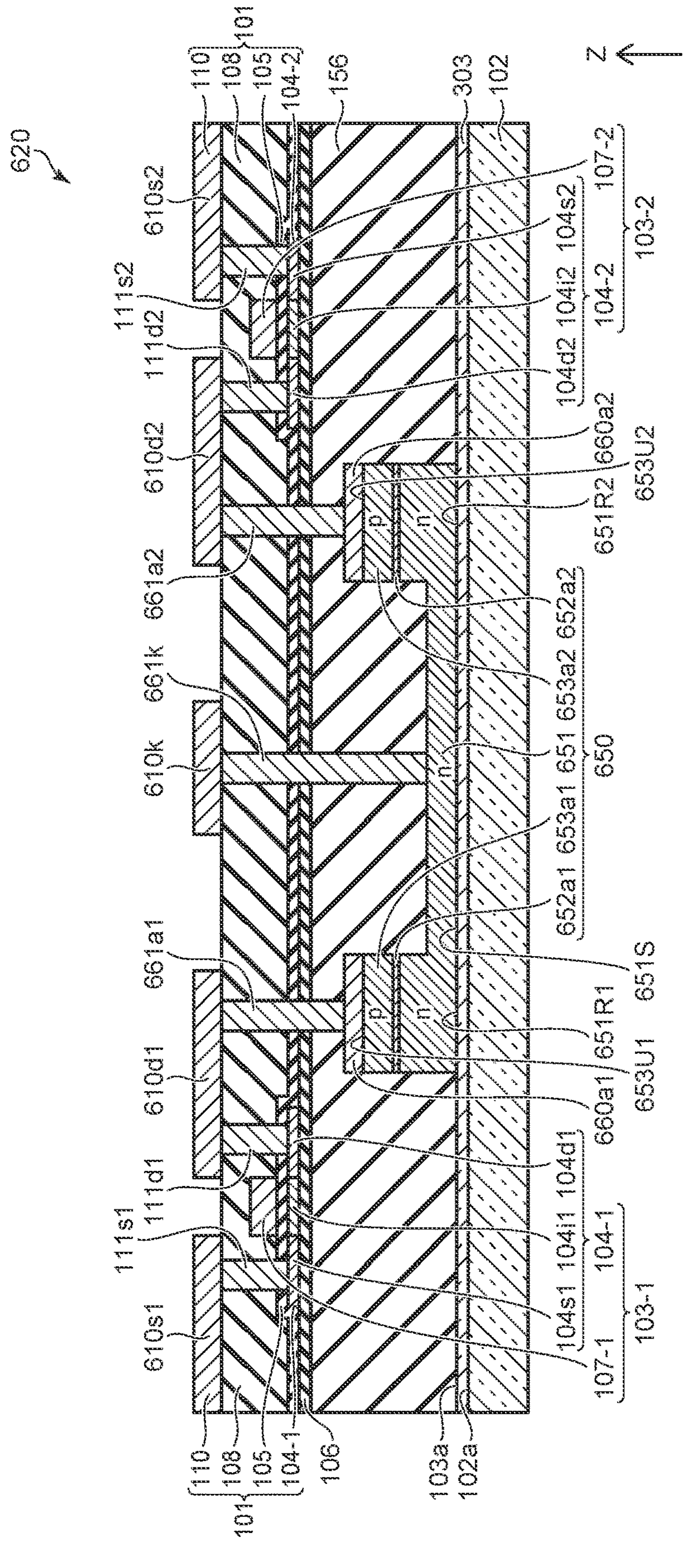
FIG. 34 is a schematic cross-sectional view exemplifying a portion of an image display device according to a sixth embodiment.

FIG. 34 is a schematic cross-sectional view exemplifying a portion of an image display device according to the present embodiment.

In the present embodiment, the image display device differs from those of other embodiments in including a sub-pixel group 620 including a plurality of light-emitting regions on one light-emitting surface. The same components are denoted by the same reference signs, and detailed description thereof will be omitted as appropriate.

As illustrated in FIG. 34, the image display device of the present embodiment includes the sub-pixel group 620. The sub-pixel group 620 includes the substrate 102, a semiconductor layer 650, a plurality of light-blocking electrodes 660*a*1, 660*a*2, the first interlayer insulating film 156, a plurality of transistors 103-1, 103-2, the second interlayer insulating film 108, a plurality of vias (first vias) 661*a*1, 661*a*2, and the first wiring layer 110. The semiconductor layer 650 is provided on the first surface 103*a*.

In the present embodiment, turning on the p-channel transistors 103-1, 103-2 injects positive holes from one side of the semiconductor layer 650 through the first wiring layer 110 and the vias 661*a*1, 661*a*2. Turning on the p-channel transistors 103-1, 103-2 injects electrons from the other side of the semiconductor layer 650 through the first wiring layer 110. In the semiconductor layer 650, positive holes and electrons are injected and, by the positive holes and electrons being combined, light-emitting layers 652*a*1, 652*a*2, separated from each other, emit light. The circuit configuration illustrated in FIG. 2, for example, is applied to the drive circuit for driving the light-emitting layers 652*a*1, 652*a*2. The n-type semiconductor layer and the p-type semiconductor layer of the semiconductor layers can also be switched by using the example of the second embodiment to make a configuration in which the semiconductor layer is driven by an n-channel transistor. In such a case, the circuit configuration of FIG. 11, for example, is applied to the drive circuit.

The configuration of the sub-pixel group 620 will now be described in detail.

The semiconductor layer 650 includes a light-emitting surface 651S that comes into contact with the first surface 103*a*. The light-emitting surface 651S is a surface of an n-type semiconductor layer 651. The light-emitting surface 651S includes a plurality of light-emitting regions 651R1, 651R2.

The semiconductor layer 650 includes an n-type semiconductor layer 651, the light-emitting layers 652*a*1, 652*a*2, and p-type semiconductor layers 653*a*1, 653*a*2. The light-emitting layer 652*a*1 is provided on the n-type semiconductor layer 651. The light-emitting layer 652*a*1 is separated and spaced apart from the light-emitting layer 652*a*2, and is provided on the n-type semiconductor layer 651. The p-type semiconductor layer 653*a*1 is provided on the light-emitting layer 652*a*1. The p-type semiconductor layer 653*a*2 is separated and spaced apart from the p-type semiconductor layer 653*a*1, and is provided on the light-emitting layer 652*a*2.

The p-type semiconductor layer 653*a*1 includes an upper surface 653U1 provided on a side opposite to the surface on which the light-emitting layer 652*a*1 is provided. The p-type semiconductor layer 653*a*2 includes an upper surface 653U2 provided on a side opposite to the surface on which the light-emitting layer 652*a*2 is provided.

The light-emitting region 651R1 substantially matches a region of the light-emitting surface 651S on a side opposite to the upper surface 653U1. The light-emitting region 651R2 substantially matches a region of the light-emitting surface 651S on a side opposite to the upper surface 653U2.

Figure 35:
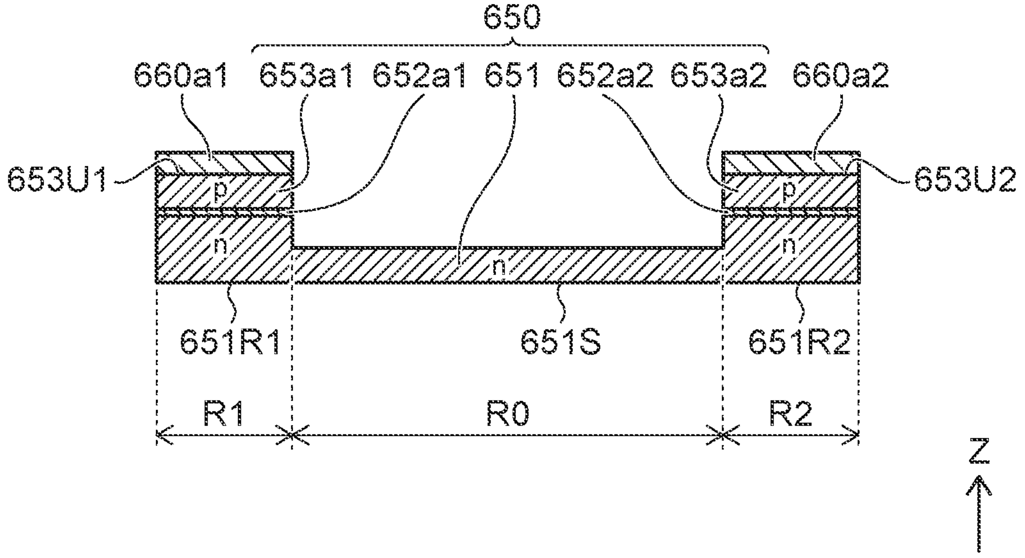
FIG. 35 is a schematic cross-sectional view exemplifying a portion of the image display device according to the sixth embodiment.

FIG. 35 is a schematic cross-sectional view exemplifying a portion of an image display device according to the present embodiment.

FIG. 35 is a schematic view for explaining the light-emitting regions 651R1, 651R2.

As illustrated in FIG. 35, the light-emitting regions 651R1, 651R2 are surfaces on the light-emitting surface 651S. In FIG. 35, portions of the semiconductor layer 650 that include the light-emitting regions 651R1, 651R2 are referred to as light-emitting portions R1, R2, respectively. The light-emitting portion R1 includes a portion of the n-type semiconductor layer 651, the light-emitting layer 652*a*1, and the p-type semiconductor layer 653*a*1. The light-emitting portion R2 includes a portion of the n-type semiconductor layer 651, the light-emitting layer 652*a*2, and the p-type semiconductor layer 653*a*2.

The semiconductor layer 650 includes a connecting portion R0. The connecting portion R0 is provided between the light-emitting portions R1, R2, and is a portion of the n-type semiconductor layer 651. One end of a via 661*k* is connected to the connecting portion R0, and thus the connecting portion R0 provides a path of the current from the via 661*k* to the light-emitting portions R1, R2.

In the light-emitting portion R1, electrons supplied via the connecting portion R0 are supplied to the light-emitting layer 652*a*1. In the light-emitting portion R1, positive holes supplied via the light-blocking electrode 660*a*1 are supplied to the light-emitting layer 652*a*1. The electrons and the positive holes supplied to the light-emitting layer 652*a*1 are combined to emit light. Light emitted by the light-emitting layer 652*a*1 passes through a portion of the n-type semiconductor layer 651 of the light-emitting portion R1 and reaches the light-emitting surface 651S. The light travels substantially straight in the Z axis direction in the light-emitting portion R1, and thus the region of the light-emitting surface 651S that emits light is the light-emitting region 651R1. Accordingly, in this example, the light-emitting region 651R1 substantially matches a region surrounded by an outer periphery of the light-emitting layer 652*a*1 projected onto the light-emitting surface 651S in XY plan view.

The light-emitting portion R2 is similar to the light-emitting portion R1. That is, in the light-emitting portion R2, electrons supplied via the connecting portion R0 are supplied to the light-emitting layer 652*a*2. In the light-emitting portion R2, positive holes supplied via the light-blocking electrode 660*a*2 are supplied to the light-emitting layer 652*a*2. The electrons and the positive holes supplied to the light-emitting layer 652*a*2 are combined to emit light. Light emitted by the light-emitting layer 652*a*2 passes through a portion of the n-type semiconductor layer 651 of the light-emitting portion R2 and reaches the light-emitting surface 651S. The light travels substantially straight in the Z axis direction in the light-emitting portion R2, and thus the region of the light-emitting surface 651S that emits light is the light-emitting region 651R2. Accordingly, in this example, the light-emitting region 651R2 substantially matches a region surrounded by an outer periphery of the light-emitting layer 652*a*2 projected onto the light-emitting surface 651S in XY plan view.

In this way, in the semiconductor layer 650, the n-type semiconductor layer 651 can be shared to form a plurality of the light-emitting regions 651R1, 651R2 on the light-emitting surface 651S.

In the present embodiment, the semiconductor layer 650 can be formed by using a portion of the n-type semiconductor layer 651 as the connecting portion R0 in the plurality of light-emitting layers 652*a*1, 652*a*2 and the plurality of p-type semiconductor layers 653*a*1, 653*a*2 of the semiconductor layer 650. Accordingly, the semiconductor layer 650 can be formed in the same manner as in the method of forming the light-emitting elements 150, 250 in the first embodiment, the second embodiment, and the like described above.

The description will now be continued, returning back to FIG. 34.

The first interlayer insulating film 156 (first insulating film) covers the first surface 103*a*, the semiconductor layer 650, and the light-blocking electrodes 660*a*1, 660*a*2.

The TFT lower layer film 106 is formed across the first interlayer insulating film 156. The TFT lower layer film 106 is flattened, and TFT channels 104-1, 104-2 and the like are formed on the TFT lower layer film 106.

The insulating layer 105 covers the TFT lower layer film 106 and the TFT channels 104-1, 104-2. A gate 107-1 is provided on the TFT channel 104-1 with the insulating layer 105 interposed therebetween. Agate 107-2 is provided on the TFT channel 104-2 with the insulating layer 105 interposed therebetween. The transistor 103-1 includes the TFT channel 104-1 and the gate 107-1. The transistor 103-2 includes the TFT channel 104-2 and the gate 107-2.

The second interlayer insulating film (second insulating film) 108 covers the insulating layer 105 and the gates 107-1, 107-2.

The TFT channel 104-1 includes regions 104*s*1, 104*d*1 doped with the p-type, and the regions 104*s*1, 104*d*1 are a source region and a drain region of the transistor 103-1. A region 104*i*1 is doped with the n-type, forming a channel of the transistor 103-1. The TFT channel 104-2 similarly includes regions 104*s*2, 104*d*2 doped with the p-type, and the regions 104*s*2, 104*d*2 are a source region and a drain region of the transistor 103-2. A region 104*i*2 is doped with the n-type, forming a channel of the transistor 103-2. In the present embodiment, the circuit 101 is a circuit that includes the TFT channels 104-1, 104-2, the insulating layer 105, the second interlayer insulating film 108, vias 111*s*1, 111*d*1, 111*s*2, 111*d*2, and the first wiring layer 110.

The first wiring layer 110 is formed on the second interlayer insulating film 108. The first wiring layer 110 includes wiring lines 610*s*1, 610*d*1, 610*k*, 610*d*2, 610*s*2.

The wiring line 610*k* is provided above the n-type semiconductor layer 651. The via 661*k* is provided between the wiring line 610*k* and the n-type semiconductor layer 651, and allows electrical connection between the wiring line 610*k* and the n-type semiconductor layer 651. The wiring line 610*k* is connected to the ground line 4 of the circuit illustrated in FIG. 2, for example.

The vias 111*d*1, 111*s*1, 111*d*2, 111*s*2 pass through the second interlayer insulating film 108 and the insulating layer 105. The via 111*d*1 is provided between the region 104*d*1 and the wiring line 610*d*1 and allows electrical connection between the region 104*d*1 and the wiring line 610*d*1. The via 111*s*1 is provided between the region 104*s*1 and the wiring line 610*s*1 and allows electrical connection between the region 104*s*1 and the wiring line 610*s*1. The via 111*d*2 is provided between the region 104*d*2 and the wiring line 610*d*2 and allows electrical connection between the region 104*d*2 and the wiring line 610*d*2. The via 111*s*2 is provided between the region 104*s*2 and the wiring line 610*s*2 and allows electrical connection between the region 104*s*2 and the wiring line 610*s*2. The wiring lines 610*s*1, 610*s*2 are connected to the power source line 3 of the circuit in FIG. 2, for example.

The wiring line 610*d*1 is provided above the light-blocking electrode 660*a*1. The via 661*a*1 is provided between the wiring line 610*d*1 and light-blocking electrode 660*a*1, and allows electrical connection between the wiring line 610*d*1 and light-blocking electrode 660*a*1. Accordingly, the p-type semiconductor layer 653*a*1 is electrically connected to the drain region of the transistor 103-1 through the light-blocking electrode 660*a*1, the via 661*a*1, the wiring line 610*d*1, and the via 111*d*1.

The wiring line 610*d*2 is provided above the light-blocking electrode 660*a*2. The via 661*a*2 is provided between the wiring line 610*d*2 and light-blocking electrode 660*a*2, and allows electrical connection between the wiring line 610*d*2 and light-blocking electrode 660*a*2. Accordingly, the p-type semiconductor layer 653*a*2 is electrically connected to the drain region of the transistor 103-2 through the light-blocking electrode 660*a*2, the via 661*a*2, the wiring line 610*d*2, and the via 111*d*2.

For example, the transistors 103-1, 103-2 are drive transistors of adjacent sub-pixels and are driven sequentially. When positive holes supplied from the transistors 103-1 are injected into the light-emitting layer 652*a*1 and electrons supplied from the wiring line 610*k* are injected into the light-emitting layer 652*a*1, the light-emitting layer 652*a*1 emits light and the light is emitted from the light-emitting region 651R1. When positive holes supplied from the transistor 103-2 are injected into the light-emitting layer 652*a*2 and electrons supplied from the wiring line 610*k* are injected into the light-emitting layer 652*a*2, the light-emitting layer 652*a*2 emits light and the light is emitted from the light-emitting region 651R2.

Effects of the image display device of the present embodiment will now be described.

The image display device of the present embodiment, similarly to the image display devices of the other embodiments described above, achieves the effect of making it possible to shorten the time of the transfer process for forming the semiconductor layer 650 and reduce the number of processes. In addition, the connecting portion R0 can be shared by the plurality of light-emitting portions R1, R2, and thus the number of vias 661*k* provided in the connecting portion R0 can be reduced. By reducing the number of vias, a pitch of the light-emitting portions R1, R2 constituting the sub-pixel group 620 can be reduced, and the image display device can be made small in size and high in definition. Although a case of two light-emitting regions has been described in this example, the number of light-emitting regions formed in the light-emitting surface is not limited to two, and can be a desired number of three or more.

Seventh Embodiment

The image display device described above can be, as an image display module including an appropriate number of pixels, a computer display, a television, a mobile terminal such as a smartphone, or a car navigation system, for example.

Figure 36:
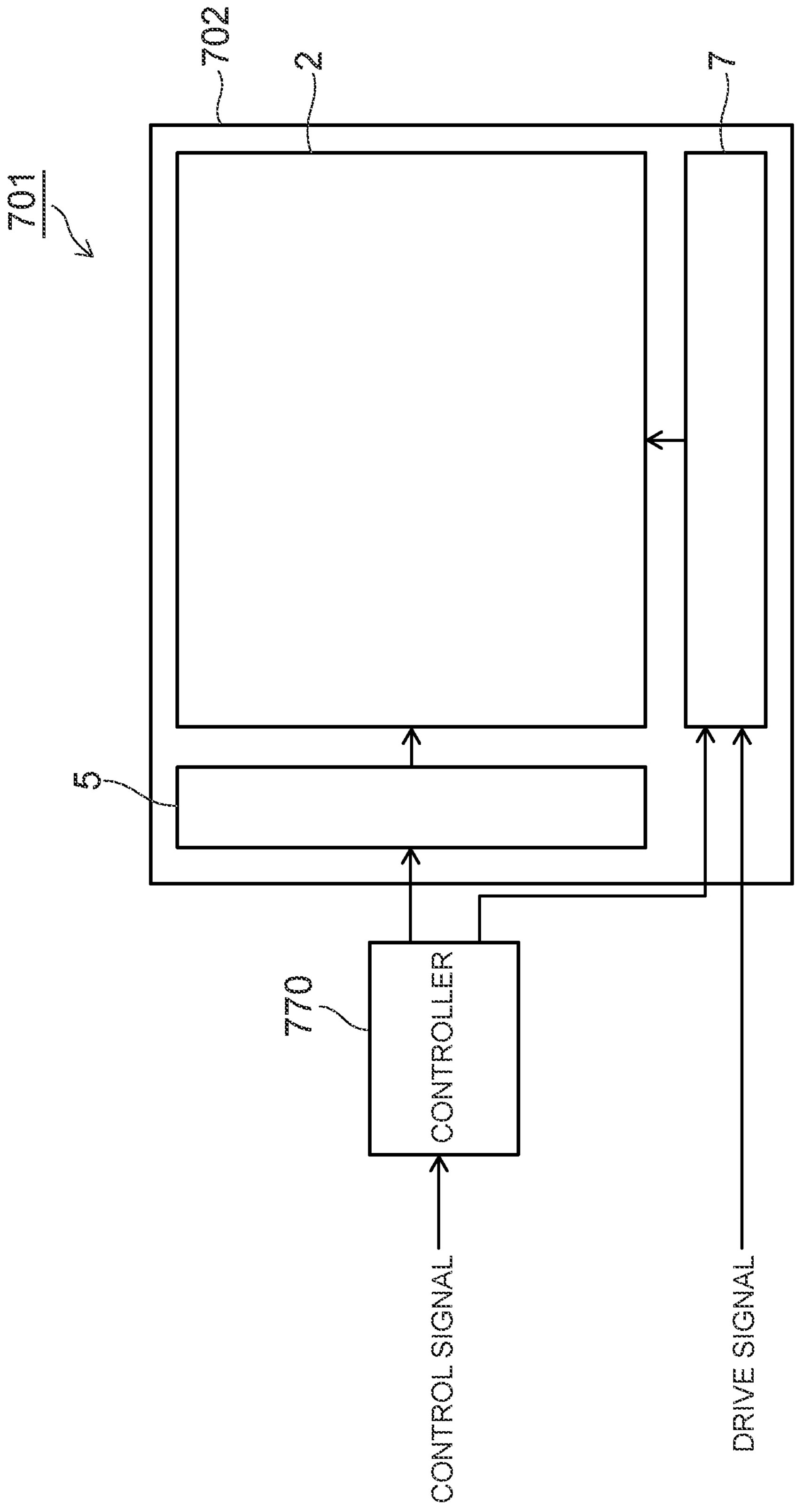
FIG. 36 is a block diagram exemplifying an image display device according to a seventh embodiment.

FIG. 36 is a block diagram exemplifying an image display device according to the present embodiment.

A main portion of a configuration of a computer display is illustrated in FIG. 36.

As illustrated in FIG. 36, an image display device 701 includes an image display module 702. The image display module 702 is, for example, an image display device provided with the configuration of the first embodiment described above. The image display module 702 includes the display region 2 in which the plurality of sub-pixels including the sub-pixel 20 are arrayed, the row selection circuit 5, and the signal voltage output circuit 7.

The image display device 701 further includes a controller 770. The controller 770 inputs control signals separated and generated by an interface circuit (not illustrated) to control the drive and drive sequence of each sub-pixel with respect to the row selection circuit 5 and the signal voltage output circuit 7.

Modified Example

The image display device described above can be, as an image display module including an appropriate number of pixels, a computer display, a television, a mobile terminal such as a smartphone, or a car navigation system, for example.

Figure 37:
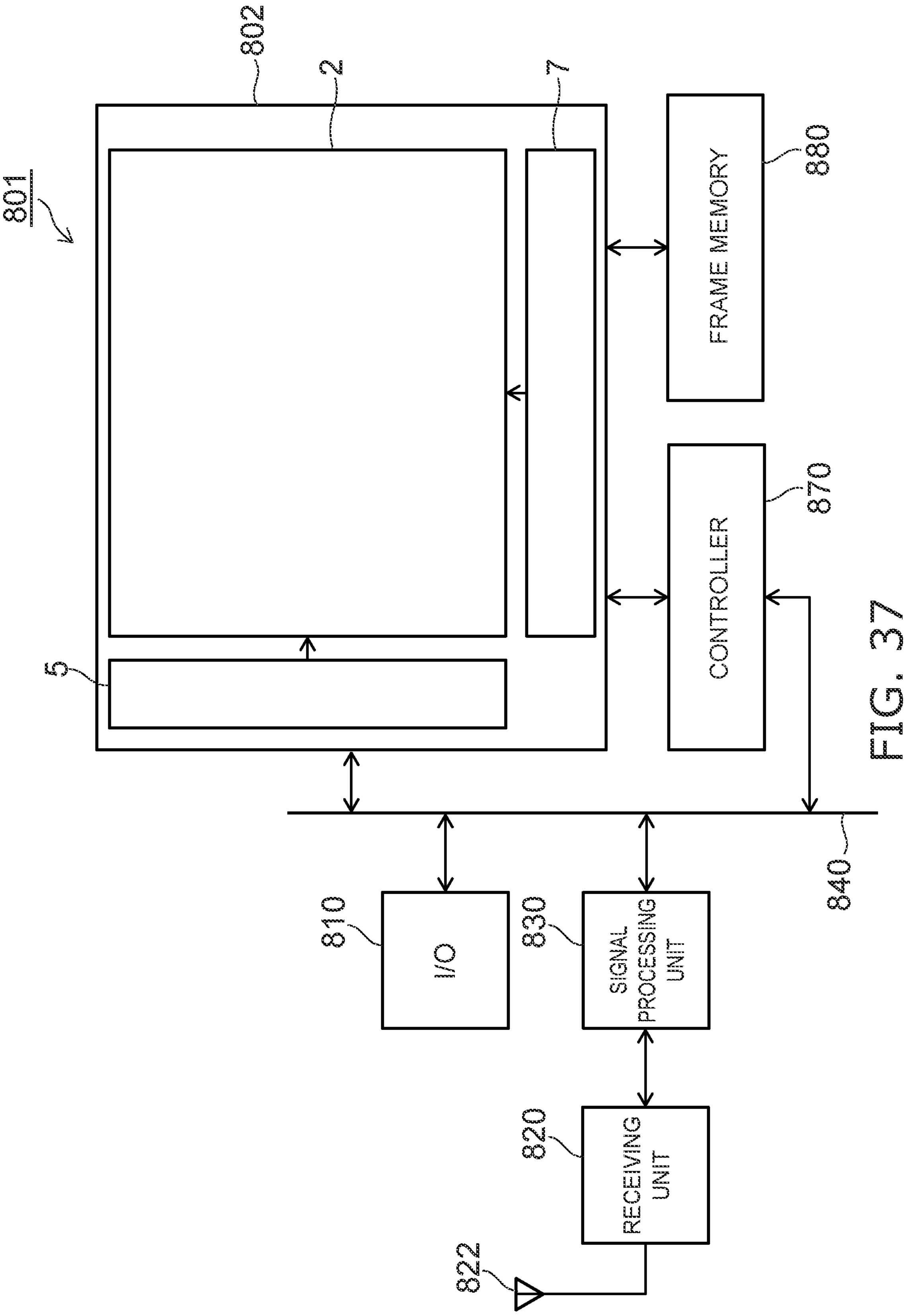
FIG. 37 is a block diagram exemplifying an image display device according to a modified example of the seventh embodiment.

FIG. 37 is a block diagram exemplifying an image display device according to a modified example of the present embodiment.

FIG. 37 illustrates a configuration of a high-definition, flat-screen television.

As illustrated in FIG. 37, an image display device 801 includes an image display module 802. The image display module 802 is, for example, the image display device 1 provided with the configuration of the first embodiment described above. The image display device 801 includes a controller 870 and a frame memory 880. The controller 870 controls the drive sequence of each sub-pixel in the display region 2 on the basis of the control signal supplied by a bus 840. The frame memory 880 stores the display data of one frame and is used for processing, such as smooth video playback.

The image display device 801 includes an I/O circuit 810. The I/O circuit 810 is simply denoted as "I/O" in FIG. 37. The I/O circuit 810 provides an interface circuit and the like for connection to an external terminal, device, or the like. The I/O circuit 810 includes, for example, a universal serial bus (USB) interface for connecting an external hard disk device or the like, and an audio interface.

The image display device 801 includes a receiving unit 820 and a signal processing unit 830. The receiving unit 820 is connected with an antenna 822 to separate and generate necessary signals from radio waves received by the antenna 822. The signal processing unit 830 includes a digital signal processor (DSP), a central processing unit (CPU), and the like, and signals separated and generated by the receiving unit 820 are separated and generated into image data, audio data, and the like by the signal processing unit 830.

Other image display devices can be made as well by using the receiving unit 820 and the signal processing unit 830 as high-frequency communication modules for transmission/reception of mobile phones, Wi-Fi, global positioning system (GPS) receivers, and the like. For example, an image display device provided with an image display module with an appropriate screen size and resolution may be made into a mobile information terminal such as a smartphone or a car navigation system.

The image display module in the case of the present embodiment is not limited to the configuration of the image display device in the first embodiment, and may be the configuration of a modified example or other embodiment. The image display modules in the case of the present embodiment and the modified example are configured to include a large number of sub-pixels as illustrated in FIGS. 9 and 25.

According to the embodiments described above, an image display device manufacturing method and an image display device that reduce a transfer process of a light-emitting element and improve yield are realized.

While several embodiments of the present invention have been described above, these embodiments have been presented by way of example, and are not intended to limit the scope of the invention. These novel embodiments may be implemented in various other forms and various omissions, substitutions, and changes may be made without departing from the spirit of the invention. These embodiments and variations thereof are included in the scope and spirit of the invention, and are within the scope of the invention described in the claims and equivalents thereof. Further, each of the aforementioned embodiments may be implemented in combination with each other.

What is claimed is:

1. An image display device manufacturing method comprising:

preparing a semiconductor layer comprising a light-emitting layer;

joining the semiconductor layer to a first substrate with a first metal layer interposed therebetween;

bonding the semiconductor layer to a first surface of a light-transmitting substrate;

removing the first substrate;

etching the semiconductor layer to form, on the first surface of the light-transmitting substrate, a light-emitting element comprising a light-emitting surface and an upper surface located on a side opposite to the light-emitting surface;

etching the first metal layer to form a light-blocking electrode covering and electrically connected to the upper surface of the light-emitting element;

forming a first insulating film covering the first surface of the light-transmitting substrate, the light-emitting element, and the light-blocking electrode;

forming a circuit element on the first insulating film;

forming a second insulating film covering the first insulating film and the circuit element;

forming a first via passing through the first insulating film and the second insulating film; and forming a first wiring layer on the second insulating film, wherein:

the first via is located between the first wiring layer and the light-blocking electrode, and electrically connects the first wiring layer and the light-blocking electrode.

2. The image display device manufacturing method according to claim 1, wherein:

the step of preparing the semiconductor layer comprises forming the first metal layer on the semiconductor layer.

3. The image display device manufacturing method according to claim 1, further comprising:

before the step of joining the semiconductor layer to the first substrate, forming the first metal layer on a joining surface of the first substrate.

4. The image display device manufacturing method according to claim 1, further comprising:

before the step of bonding the semiconductor layer, roughening an exposed surface of the semiconductor layer to form a roughened surface, and forming a film having light transmittance across the roughened surface.

5. The image display device manufacturing method according to claim 1, further comprising:

forming a second via passing through the first insulating film and the second insulating film, wherein the light-emitting element comprises a connecting portion, and the second via is located between and electrically connects the first wiring layer and the connecting portion.

6. The image display device manufacturing method according to claim 1, further comprising:

before the step of bonding the semiconductor layer, forming a conductive layer having light transmittance on the semiconductor layer; and after the step of removing the first substrate, etching the conductive layer to form a second wiring layer.

7. The image display device manufacturing method according to claim 6, further comprising:

forming a second via passing through the first insulating film and the second insulating film, wherein:

the second via is located between and electrically connects the first wiring layer and the second wiring layer.

8. The image display device manufacturing method according to claim 1, further comprising:

before the step of forming the circuit element, forming a light-blocking layer on the first insulating film.

9. The image display device manufacturing method according to claim 1, wherein:

the semiconductor layer comprises a gallium nitride compound semiconductor.

10. The image display device manufacturing method according to claim 1, further comprising:

forming a wavelength conversion member on a second surface of the light-transmitting substrate opposite to the first surface.

11. The image display device manufacturing method according to claim 1, further comprising:

removing the light-transmitting substrate and forming a wavelength conversion member in place of the light-transmitting substrate.

12. An image display device manufacturing method comprising:

preparing a semiconductor layer comprising a light-emitting layer;

bonding the semiconductor layer to a first surface of a light-transmitting substrate;

forming a second metal layer on the semiconductor layer;

etching the semiconductor layer to form, on the first surface of the light-transmitting substrate, a light-emitting element comprising a light-emitting surface and an upper surface located on a side opposite to the light-emitting surface;

etching the second metal layer to form a light-blocking electrode covering and electrically connected to the upper surface of the light-emitting element;

forming a first insulating film covering the first surface of the light-transmitting substrate, the light-emitting element, and the light-blocking electrode;

forming a circuit element on the first insulating film;

forming a second insulating film covering the circuit element and the first insulating film;

forming a first via passing through the first insulating film and the second insulating film; and forming a first wiring layer on the second insulating film, wherein:

the first via is located between the first wiring layer and the light-blocking electrode, and electrically connects the first wiring layer and the light-blocking electrode.

* * * * *